United States Patent [19]
Dolby

[11] Patent Number: 4,490,691
[45] Date of Patent: Dec. 25, 1984

[54] COMPRESSOR-EXPANDER CIRCUITS AND, CIRCUIT ARRANGEMENTS FOR MODIFYING DYNAMIC RANGE, FOR SUPPRESSING MID-FREQUENCY MODULATION EFFECTS AND FOR REDUCING MEDIA OVERLOAD

[76] Inventor: Ray M. Dolby, 50 Walnut St., San Francisco, Calif. 94118

[21] Appl. No.: 300,741

[22] Filed: Sep. 10, 1981

Related U.S. Application Data

[63] Continuation-in-part of Ser. No. 292,958, Aug. 14, 1981, abandoned, and a continuation-in-part of Ser. No. 275,382, Jun. 19, 1981, abandoned, and a continuation-in-part of Ser. No. 275,205, Jun. 19, 1981, abandoned, and a continuation-in-part of Ser. No. 275,204, Jun. 19, 1981, abandoned, and a continuation-in-part of Ser. No. 180,771, Aug. 22, 1980, abandoned, and a continuation-in-part of Ser. No. 163,950, Jun. 30, 1980, abandoned.

[51] Int. Cl.³ .............................................. H04B 1/64
[52] U.S. Cl. ...................................... 333/14; 381/106; 455/72
[58] Field of Search .......................... 333/14; 179/1 P; 455/72; 381/106

[56] References Cited

U.S. PATENT DOCUMENTS

| | | | |
|---|---|---|---|
| 2,173,472 | 9/1939 | Doba, Jr. ............................... | 333/14 |
| 2,287,077 | 6/1942 | Abraham ............................... | 333/14 |
| 2,395,758 | 2/1946 | Potter .................................... | 333/14 |
| 4,072,914 | 2/1978 | Haramoto et al. .................... | 333/14 |
| 4,363,007 | 12/1982 | Haramoto et al. .................... | 333/14 |

FOREIGN PATENT DOCUMENTS 20124 6/1976 Japan.
2068197 8/1981 United Kingdom.

*Primary Examiner*—Paul L. Gensler
*Attorney, Agent, or Firm*—Majestic, Gallagher, Parsons & Siebert

[57] ABSTRACT

In a first aspect of the invention, compressor and expander circuits are arranged in series, the dynamic actions of the circuits being substantially separated with respect to level. The changing gain portions of the characteristics are staggered among the series circuits such that the resulting overall characteristic has a maximum compression or expansion ratio substantially no greater than that of any single circuit while providing more compression or expansion than for any of the circuits individually. A second aspect, referred to as "spectral skewing", effects a reduction of the influence of signals in the high and/or low frequency extremes of a signal transmission system on the action of a compressor feeding the transmission channel. Consequently, a complementary expander fed by the channel is less likely to be controlled by signals at frequencies subject to transmission channel errors. A third aspect provides an antisaturation effect. This aspect of the invention takes advantage of the properties of dual path compressors and expanders, in which the output of the circuits at very low signal levels is provided mostly by the further path and at high levels, mostly by the main path. The disclosure also describes combinations of two or more aspects of the invention. In one particular combined embodiment, C-type noise reduction is provided. Additionally, arrangements for compressor/expander switching and B-type/C-type noise reduction switching are disclosed.

208 Claims, 69 Drawing Figures

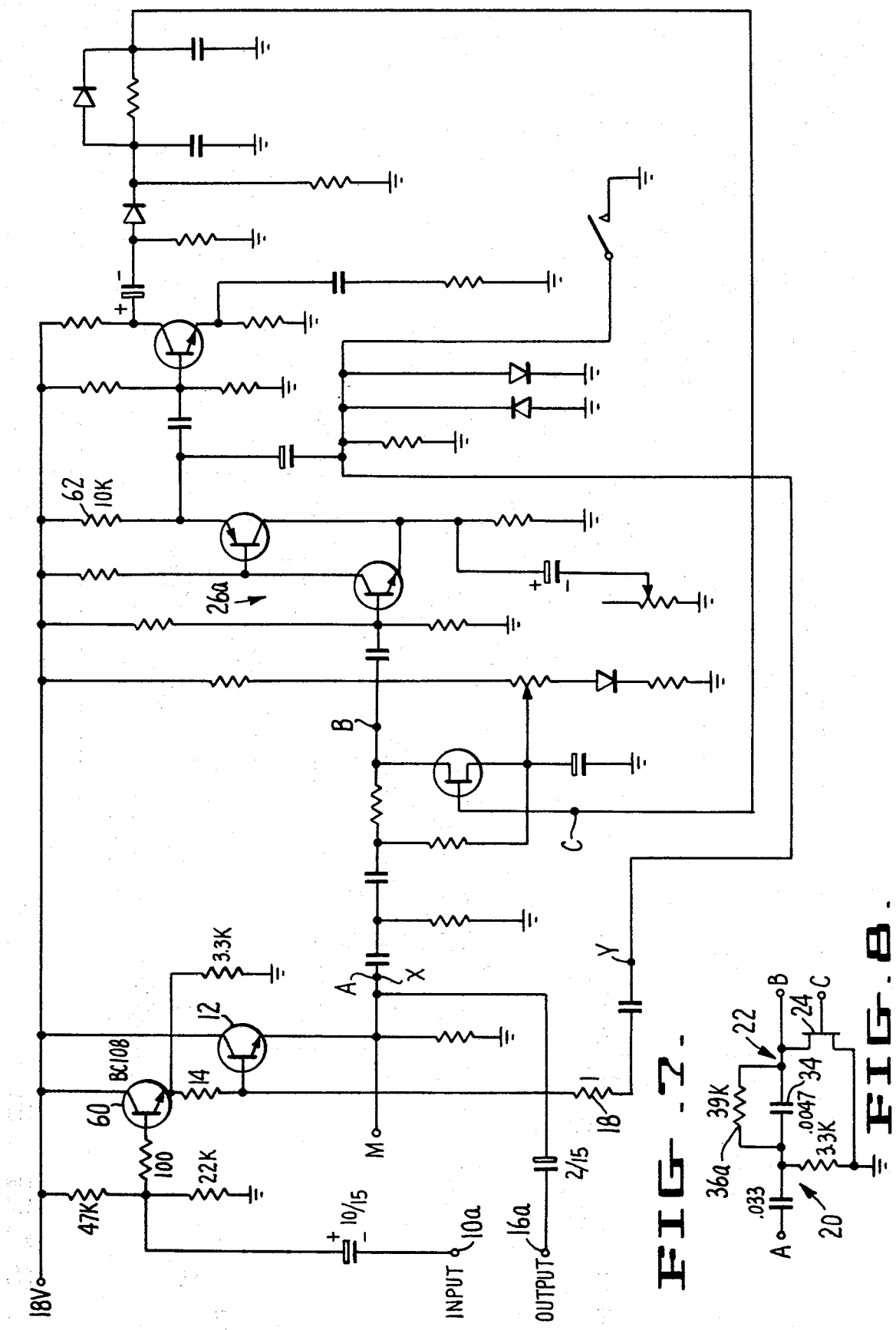

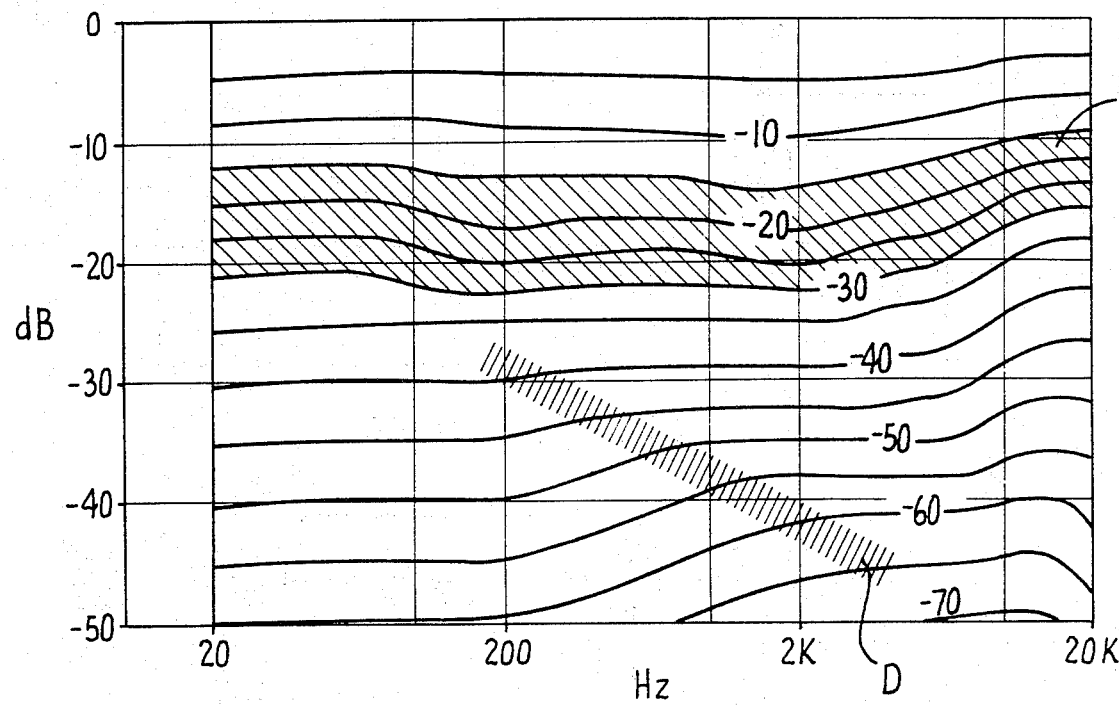
FIG_17.
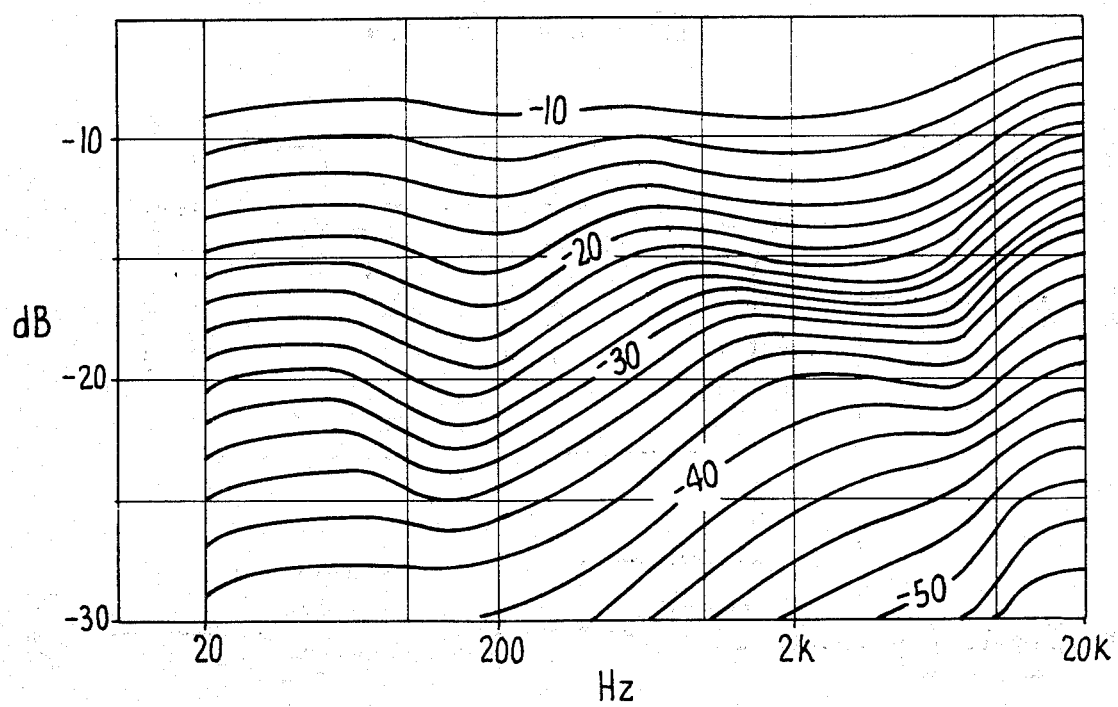
FIG_18.

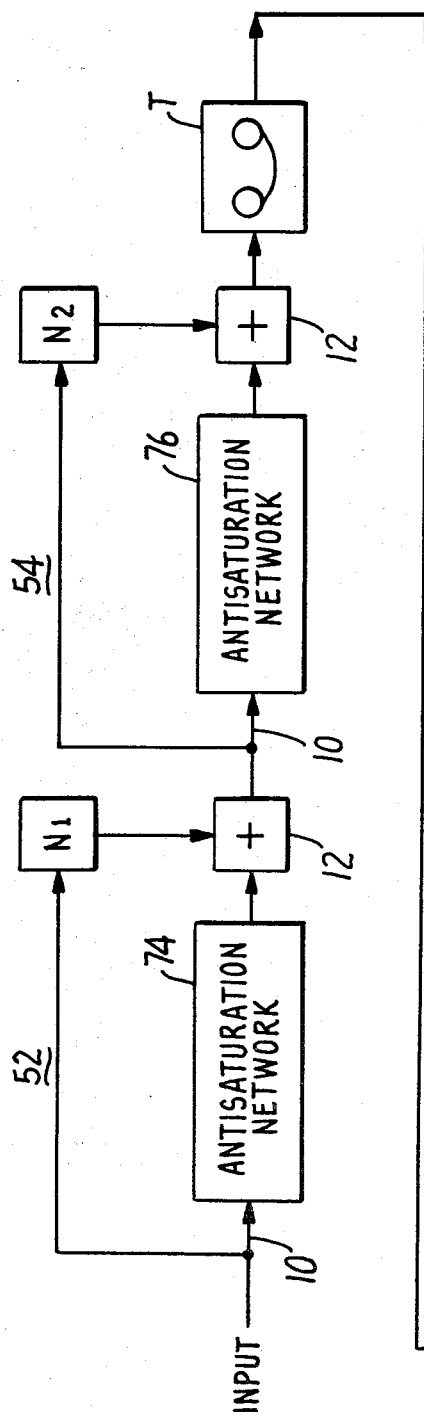
FIG. 43.
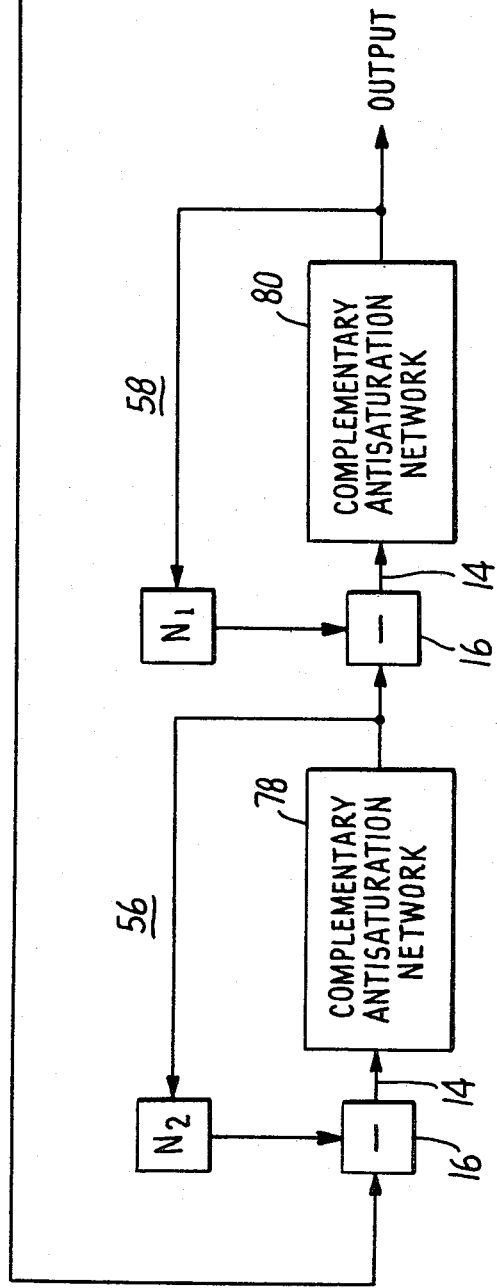
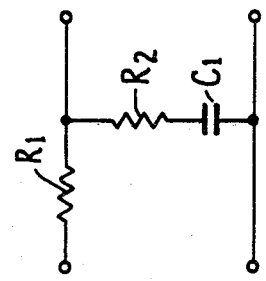
FIG. 44.

COMPRESSOR-EXPANDER CIRCUITS AND, CIRCUIT ARRANGEMENTS FOR MODIFYING DYNAMIC RANGE, FOR SUPPRESSING MID-FREQUENCY MODULATION EFFECTS AND FOR REDUCING MEDIA OVERLOAD

CROSS REFERENCE TO RELATED APPLICATIONS

This application is a continuation-in-part of the following applications, now abandoned, all of which were copending at the time of filing the present application:
Ser. No. 292,958, filed Aug. 14, 1981
Ser. No. 275,382, filed June 19, 1981
Ser. No. 275,205, filed June 19, 1981
Ser. No. 275,204, filed June 19, 1981
Ser. No. 180,771, filed Aug. 22, 1980
Ser. No. 163,950, filed June 30, 1980

ORGANIZATION OF APPLICATION

The present invention has three aspects that are usable independently but which also can be used advantageously in combination. For simplicity in presentation and greater ease of understanding, the disclosure is therefore arranged as follows:

CIRCUIT ARRANGEMENT FOR MODIFYING DYNAMIC RANGE

A. Background of the Invention—Aspect I.
B. Description of the Prior Art—Aspect I.
C. Summary of the Invention—Aspect I.
D. Brief Description of the Drawing Relating to Aspect I of the Invention. (FIGS. 1-21).
E. Description of the Preferred Embodiments of Aspect I.

II NETWORKS FOR SUPPRESSING MID-FREQUENCY MODULATION EFFECTS IN COMPRESSORS, EXPANDERS AND NOISE REDUCTION SYSTEMS

A. Background of the Invention (Field of the Invention)—Aspect II.
B. Summary of the Invention—Aspect II.
C. Description of the Prior Art—Aspect II.
D. Brief Description of the Drawing Relating to Aspect II of the Invention. (FIGS. 22-38).
E. Description of the Preferred Embodiments of Aspect II.

III CIRCUIT ARRANGEMENTS FOR REDUCING MEDIA OVERLOAD EFFECTS IN SIGNAL RECORDING AND TRANSMISSION SYSTEMS

A. Background of the Invention—Aspect III.
B. Description of the Prior Art—Aspect III.
C. Summary of the Invention—Aspect III.
D. Brief Description of the Drawing Relating to Aspect III of the Invention. (FIGS. 39-44).
E. Description of the Preferred Embodiments of Aspect III.

IV COMBINATION OF ASPECTS I, II AND III OF THE INVENTION

A. Background of the Invention—Combination of Aspects.
B. Summary of the Invention—Combination of Aspects.
C. Brief Description of the Drawing Relating to the Combination of Aspects. (FIGS. 45-69).
D. Description of the Preferred Embodiments—Combination of Aspects.

V CLAIMS

I CIRCUIT ARRANGEMENT FOR MODIFYING DYNAMIC RANGE

A. Background of the Invention—Aspect I

This aspect of the present invention is concerned in general with circuit arrangements which alter the dynamic range of signals, namely compressors which compress the dynamic range and expanders which expand the dynamic range. This aspect of the invention is particularly useful for treating audio signals but is also applicable to other signals.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, particularly audio recording and play back products, a single device is often configured for switchable mode operation as a compressor to record signals and as an expander to play back compressed broadcast or pre-recorded signals.

The amount of compression or expansion may be expressed in dB. For example, 10 dB of compression means that an input dynamic range of N dB is compressed to an output range of (N−10) dB. In a noise reduction system 10 dB of compression followed by 10 dB of complementary expansion is said to provide 10 dB of noise reduction.

Aspect I of the present invention relates in particular to a circuit arrangement for modifying the dynamic range of an input signal and comprising a first circuit with a bi-linear characteristic (where "linear" in this context denotes constant gain) composed of:

(1) a low level linear portion up to a threshold,
(2) an intermediate level non-linear (changing gain) portion, above the threshold and up to a finishing point, providing a predetermined maximum compression ratio or expansion ratio, and
(3) a high level linear portion having a gain different from the gain of the low level portion.

The characteristic is denoted a bi-linear characteristic because there are two portions of substantially constant gain.

In practice, the threshold and finishing point are not always well defined "points". The two transition regions where the intermediate level portion merges into the low level and high level linear portions can each vary in shape from a smooth curve to a shape curve, depending on the control characteristics of the compressor and expander.

It is also pointed out that circuit arrangements with bi-linear characteristics are distinguished from two other known classes of circuit arrangement, namely:

(a) a logarithmic or non-linear circuit arrangement with either a fixed or changing slope and with no linear portion: the gain changes over the whole dynamic range.

(b) circuit arrangements with a characteristic having two or more portions of which only one portion is linear ("uni-linear").

A circuit arrangement with a bi-linear characteristic has particular advantages and is widely used. The threshold can be set above the input noise level or transmission channel noise level in order to exclude the possibility of control of the circuit by noise. The high level portion of substantially constant gain avoids non-linear treatment of high level signals which would otherwise introduce distortion. Moreover, in the case of an audio signal, for which the circuit must be syllabic, the high level portion provides a region within which to deal with the overshoots which occur with a syllabic circuit when the signal level increases abruptly. The overshoots are suppressed by clipping diodes or similar means. Only bi-linear characteristics are capable of providing this combination of advantages.

The majority of the known circuits with a bi-linear characteristic in use today in audio products provide 10 dB of compression and expansion which is adequate for many purposes. However, this leaves some noise audible to some listeners and, for highest fidelity, more compression and expansion is desirable, say 20 dB. It is difficult to provide such a large amount of compression or expansion without encountering problems which affect the quality of the signal.

Circuits are known and commercially available which provide 20 dB of compression or expansion, and even more, but these are usually constant slope logarithmic circuit arrangements in which there is a constantly changing gain over the whole dynamic range or nearly the whole dynamic range. Such circuits suffer from higher distortion and more signal tracking problems at very low and very high signal levels than the bi-linear circuits in which the change of gain is restricted to an intermediate portion of the characteristic; overshoot problems are also more severe than with bi-linear characteristic arrangements. Known constant slope companders employ compression ratios in the range 1.5:1, 2:1 and 3:1, but 2:1 is most common.

Compression ratio is defined as the ratio of the incremental input dynamic range to the incremental output dynamic range (on a logarithmic scale). The expansion ratio for a complementary expander is the inverse of the compression ratio. If the compression ratio is 3:1, the expansion ratio is 1:3. It is sometimes convenient to utilize the concept of the inverse expansion ratio which, for the example just given is 3:1, i.e., it corresponds to the compression ratio. For simplicity, discussion herein will be confined largely to the compression ratio with the understanding that the same considerations apply, making appropriate changes, to the expansion ratio.

A high compression ratio has a disadvantage in that it is difficult to ensure complementarity between the compressor and the expander; in particular, level errors or errors in the frequency response of the transmission or recording medium lead to correspondingly multiplied errors at the output of the expander.

B. Description of the Prior Art

It is known (e.g., U.S. Pat. No. 2,558,002, U.S. Pat. No. 4,061,874 and Japanese Patent Publication No. 51-20124) to increse the amount of compression available by connecting in cascade a plurality of compressor stages. These known circuits (controlled impedance device, diodes, etc.) multiply the compression ratios of the individual stages so that a high compression ratio results, with the disadvantage explained above. For example, one circuit with a compression ratio of 2:1 and the other with a compression ratio of 3:1 will yield an overall ratio of 6:1. The resulting expansion ratio of 1:6 would place a heavy burden on the uniformity of the transmission channel. Another consideration is the demands that are made upon whatever circuit is effecting the change of gain required to establish the compressor or expander characteristic. It is relatively easy to make a circuit effect accurate gain changes over a range of 10 dB but significantly more difficult to make the same circuit effect accurate gain changes over a range of 20 dB. It is thus difficult to establish a controlled, reproducible characteristic for use in a compander system. The No. 51-20124 publication concludes that a plurality of series compressors (and expanders) is not suitable as a noise reduction system for high fidelity reproduction systems.

It is also known (U.S. Pat. Nos. 3,902,131 and 3,930,208) to cascade a plurality of compressor stages that operate in mutually exclusive frequency ranges. While such arrangements may not result in any increase in compression ratio over that of a single stage, they do not provide any increase in compression.

C. Summary of the Invention—Aspect I

In the light of all these considerations it is the object of this aspect of the invention to provide an increased amount of compression or expansion without an undesirably large increase in the compression ratio and without making excessive demands upon any circuit involved in effecting a change of gain.

A further object is to provide an increased amount of audio compression or expansion without producing an undesirably large increase in the overshoots produced under transient signal conditions.

A close examination of bi-linear circuits shows that they not only have the previously enumerated advantages but a further one as well—namely, a way of solving the high compression ratio problem and, in the case of audio circuits, also a way of solving the high overshoot problem.

Note that the superposition of the linear regions does not amplify the compression ratio in these regions; the compression ratio is increased only in the limited region in which dynamic action takes place. Therefore, I have found it possible to separate the areas of dynamic action in such a way as to obtain the required overall increase in compression, while at the same time not altering the overall maximum compression or expansion ratio significantly.

A further feature of this arrangement is that the overall result is bi-linear, with all of the attendant advantages. Thus the action staggering possibility of bi-linear devices represents a further hitherto unrecognized advantage of this class of device.

The above stated objects are met in accordance with this aspect of the invention which is characterized in that a first circuit, which has a bi-linear input-output characteristic, is followed by one or more further circuits which also have bi-linear characteristics at any given frequency within a frequency range common to the circuits. The thresholds and dynamic regions of the circuits are set to different values so as to stagger the intermediate level portions of the characteristics of the circuits to produce a change of gain over a wider range of intermediate input levels than for any of the circuits individually, and to produce an increased difference between the gains at low and high input levels, but with a maximum compression or expansion ratio which is substantially no greater than the maximum compression ratio of any single circuit, by virtue of the staggering.

In the case of audio circuits, in which the circuits usually have overshoot suppression (limiting) elements, then it is also possible to stagger their thresholds along with the stagger of the syllabic thresholds. The overshoots of the lower level circuits, or stages, are correspondingly reduced, with minimal overall overshoot of the several stages. This is in contrast with conventional logarithmic compressors in which large overshoots are inherently produced.

Each of the circuits may introduce an alteration of the spectral content of the signal—for example, a low level treble boost in the case of a compressor. Thus each succeeding stage may be actuated by a signal of progressively changing spectral content. In the case of complex signals, this has the virtue of spectrally spreading out the chances for error in the decoding function. In the case of a tape recorder with an uneven frequency response characteristic, for example, the spectral shifting tendency reduces the overall dynamic and frequency response errors of the decoded result.

Consideration will now be given to the amount of staggering required. For simplicity, reference is made to a series connection of two compressor circuits. The compression ratio of each of the first and second circuits will rise from unity at the respective threshold to a maximum and this will be called the rising flank of the compression ratio. The ratio will then fall back to unity and this will be called the falling flank. Strictly speaking the falling flank may approach unity asymptotically but for all practical purposes it may be considered to have reached unity when it is at some value differing only by an arbitrary small amount from unity.

The staggering of the intermediate level portions of the first and second circuits results in the falling flank of one circuit overlapping the rising flank of the other circuit. At least to a first approximation, the difference between the two thresholds can be made such that the overlap of flanks results in an overall compression ratio which does not substantially exceed the maximum compression ratio of either circuit by itself.

Preferably, the threshold of the second circuit is lower than that of the first circuit (if more than two circuits are used, each further circuit preferably has a progressively lower threshold), in the case of a compressor and vice versa in the case of an expander. In principle the order can be reversed, with the first compressor circuit having the lower threshold. In the case of more than 2 circuits, the order of threshold levels among them, in principle, can be scrambled and arranged in any order so long as the intermediate level portions of the circuits are properly staggered.

Thus the ideal stagger is considered to be that which causes the falling flank of one circuit to overlap the rising flank of the other circuit in order to restrict, so far as possible, the level region in which dynamic action occurs in the overall series connected device while at the same time avoiding any substantial increase in the maximum compression or expansion ratio over that of a single device. Then, for example, if the maximum compression ratio of each circuit is 2:1, the compression ratio of the overall circuit arrangement will rise to 2:1, maintain this value over the overlap, and then fall back to unity. Thus, ideally, there is no increase at all above the ratio of 2:1, in contrast to the prior art arrangements of cascaded compressor stages which multiply the ratios to 4:1.

In practice it may be difficult to achieve an optimum overlap at all frequencies but it can be seen that, providing a reasonable approximation is made to the ideal, the overall maximum compression ratio can be prevented from rising excessively above 2:1 in the example given. It may in a practical circuit arrangement perhaps rise to 2.5:1 in a particular frequency and level region.

A low maximum compression ratio (e.g., 1.5:1) permits an expander to track the compressor more easily to provide good complementarity with signal channels having somewhat unreliable gains and/or frequency responses. However, a low compression ratio spreads the dynamic action over a wider range of levels, causing greater susceptibility to noise modulation for a given maximum amount of noise reduction difference in gain at low and high input levels. Hence, there is a trade off between undesirable effects caused both by high and low compression ratios. Consequently, the ideal compression ratio will depend on the system environment and the system design goals.

The ability to stagger bi-linear stages provides the designer with an additional way in which to optimize an overall circuit. In so doing, the shapes of the compression characteristics of individual stages can be designed with staggering specifically in mind. The transient characteristics of the circuits are also taken into account and the opportunity is preferably taken to stagger the overshoot suppression thresholds in audio compressors and expanders so as to result in minimal overall overshoot.

A well known type of circuit, called "sliding band", which can be used for each of the first and second circuits, creates the specified desirable characteristic for the case of high frequency audio compression or expansion by applying high frequency boost (for compression) or cut (for expansion) by way of a high pass filter with a variable corner frequency. As the signal level in the high frequency band increases, the filter corner frequency slides upwardly so as to narrow the boosted or cut band and exclude the useful signal from the boost or cut. Examples of such circuits are to be found in U.S. Pat. No. Re. 28,426, U.S. Pat. Nos. 4,072,914, 3,934,190 and Japanese Patent Application No. 55529/71.

Accordingly, each of the first and second circuits can be such a "sliding band" circuit. In principle the quiescent corner frequencies of the two sliding band circuits can be different and use can be made of this to provide a degree of compression or expansion which is higher in one part of the treated frequency band than in another. However, in accordance with an important further development of the invention, the corner frequencies are made substantially identical. This leads to the advantage of sharper discriminations between the frequency region where boost or cut is being applied and the region where it is not applied, and accordingly, a sharper discrimination between the region where noise reduction is no longer taking place (because of the appearance of a significant useful signal) and the region where noise reduction remains effective.

On the other hand, circuits are also well known in which the frequency spectrum is split into a plurality of bands by corresponding band-pass filters and the compression or expansion is effected in each band by a gain control device (whether an automatically responsive diode type of limiting device or a controlled limiting device) in the case of a compressor, with some form of reciprocal or complementary circuitry for an expander. Examples of such circuits are to be found in U.S. Pat. No. 3,846,719. These split band or multi-band circuits have the advantage of independent action in the various frequency bands and, if this property is required, such circuits may be employed as the first, second, or more stages in the circuit arrangement of the invention.

In principle, one of the first and second circuits may be a multi-band circuit and the other may be a sliding band circuit. This will be of interest in a special situation in which it is, for example, desired to enhance the degree of compression or expansion in one portion of the total frequency band, the sliding band circuit and one or more of the band-splitting channels acting over this portion of the frequency band.

It is known to construct bi-linear compressors and expanders, of both sliding band and split band type, by the use of only a single signal path. However, it is generally preferred to construct such devices by providing a main signal circuit which is linear with respect to dynamic range, with a combining circuit in the main circuit, and a further circuit which derives its input from the input or output of the further circuit and has its output coupled to the combining circuit. The further circuit includes a limiter (self-acting or controlled) and the limited further circuit signal boosts the main circuit signal in the combining circuit for the case of compression but bucks the main circuit signal for the case of expansion. The limited further path signal is smaller than the main path signal in the upper part of the input dynamic range. The main and further circuits are preferably and most conveniently separately identifiable signal paths.

Such known compressors and expanders are particularly advantageous because they enable the desired kind of transfer characteristic to be established in a precise way without problems of high-level distortion. The low level portion of substantially constant gain is established by giving the further path a threshold above the noise level; below this threshold the further path is linear. The intermediate level portion is created by the region over which the further path limiting action becomes partially effective and the high level portion of substantially constant gain arises after the limiter has become fully effective so that the further path signal ceases to increase and becomes negligible compared to the main path signal. At the highest part of the input dynamic range, the output of the circuit arrangement is effectively only the signal passed by the linear main path, i.e., linear with respect to dynamic range. In dual path audio circuits the provision of overshoot suppression is particularly convenient.

Examples of these known circuits are to be found in U.S. Pat. No. 3,846,719, 3,903,485 and U.S. Pat. No. Re. 28,426. There are also known analogous circuits which achieve like results but wherein the further path has characteristics inverse to limiter characteristics and the further path output bucks the main path signal for compression and boosts the main path signal for expansion (U.S. Pat. Nos. 3,828,280 and 3,875,537).

Any of these known bi-linear circuits may accordingly be employed as the first and second circuits of the circuit arrangement according to the invention in order to obtain the advantages inherent therein and also to provide a good way of establishing the desired amount of staggering. This is done by setting the thresholds and dynamic regions of the two further paths appropriately.

As mentioned previously, it is not essential to create the desired form of bi-linear characteristic by such "dual path" techniques. Alternatives exist, operating with single paths, as described in U.S. Pat. Nos. 3,757,254, 3,967,219, 4,072,914, 3,909,733 and Japanese Patent Application No. 55529/71, for example. Although these alternative circuits usually are not capable of producing such good results as dual path circuits, or may be less convenient and thereby less economical, they can produce generally equivalent results. Accordingly, these known circuits can also be used as one or more of the circuits of a circuit arrangement according to the invention. If desired, one of the first and second circuits can be a dual path circuit and the other a single path circuit.

In economical circuit arrangements, the bi-linear circuits may be switched to either an encoding or decoding mode.

D. Brief Description of the Drawing Relating to Aspect I

This aspect of the invention will be described in more detail, by way of example, with reference to the accompanying drawings, in which:

FIG. 7 is a schematic circuit diagram of a prior art sliding band expander.

FIG. 8 is a schematic circuit diagram of a modification to FIGS. 6 and 7.

FIG. 17 shows characteristic curves similar in nature to those of FIG. 11, but for a further embodiment of this aspect of the invention.

FIG. 18 shows characteristic curves similar in nature to those of FIGS. 11 and 17, but illustrating excessive bunching.

E. Description of the Preferred Embodiments of Aspect I

Figure 1:
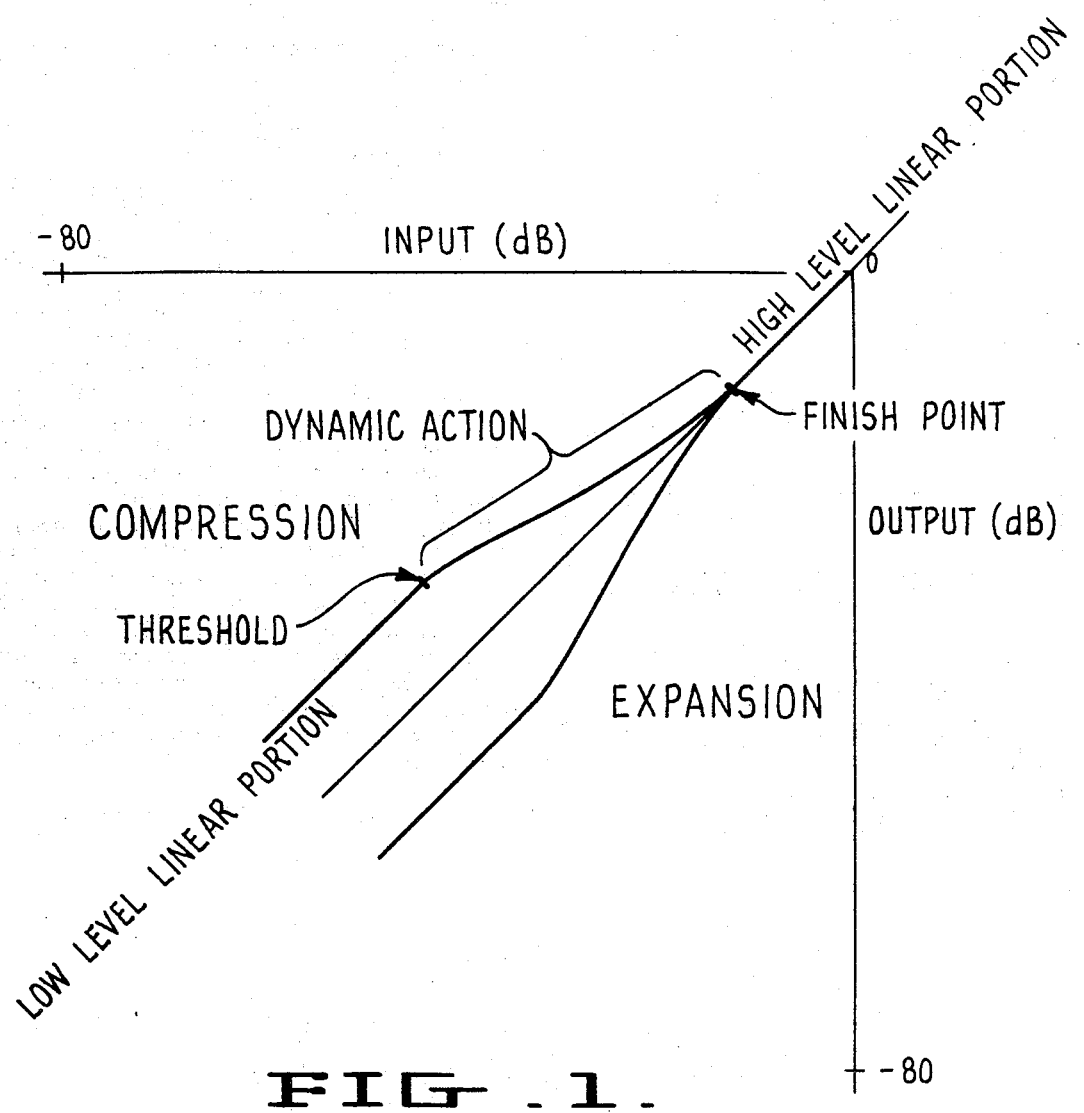
FIG. 1 is an exemplary set of curves showing complementary bi-linear compression and expansion characteristics.

Exemplary bi-linear complementary compression and expansion transfer characteristics (at a particular frequency) are shown in FIG. 1, indicating (for the compression characteristic) the low level portion of substantially constant gain, the threshold, the portion where dynamic action occurs, the finishing point, and the high level portion of substantially constant gain.

Figure 2:
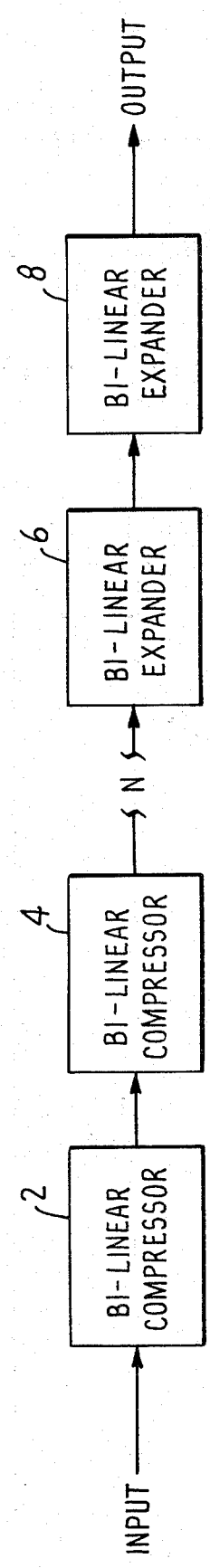
FIG. 2 is a block diagram showing this aspect of the present invention in general terms.

FIG. 2 shows this aspect of the present invention in general terms: a first bi-linear compressor 2 receives the input information and applies its output to a second bi-linear compressor 4 connected in series, which has its output applied to a noisy information carrying channel N. A pair of series connected bi-linear expanders 6 and 8 receive the input from channel N at expander 6 and provide a noise reduction system output at the output of expander 8. The areas of dynamic action of the series devices are separated or staggered with respect to each other within the frequency range that is common to the devices. Although the figure shows two devices on each side of the information channel N, two or more can be employed: the invention contemplates two or more series bi-linear compressors or expanders. When configured as a complementary noise reduction system, like numbers of series bi-linear compressors and expanders are provided.

For overall complementarity of the system, the order of stages having particular characteristics in the compressor is reversed in the expander. For example, the last stage of the expander is complementary to the first stage of the compressor in all respects—steady state and time dependent dynamic response (frequency, phase and transient response under all signal level and dynamic conditions).

Figure 3:
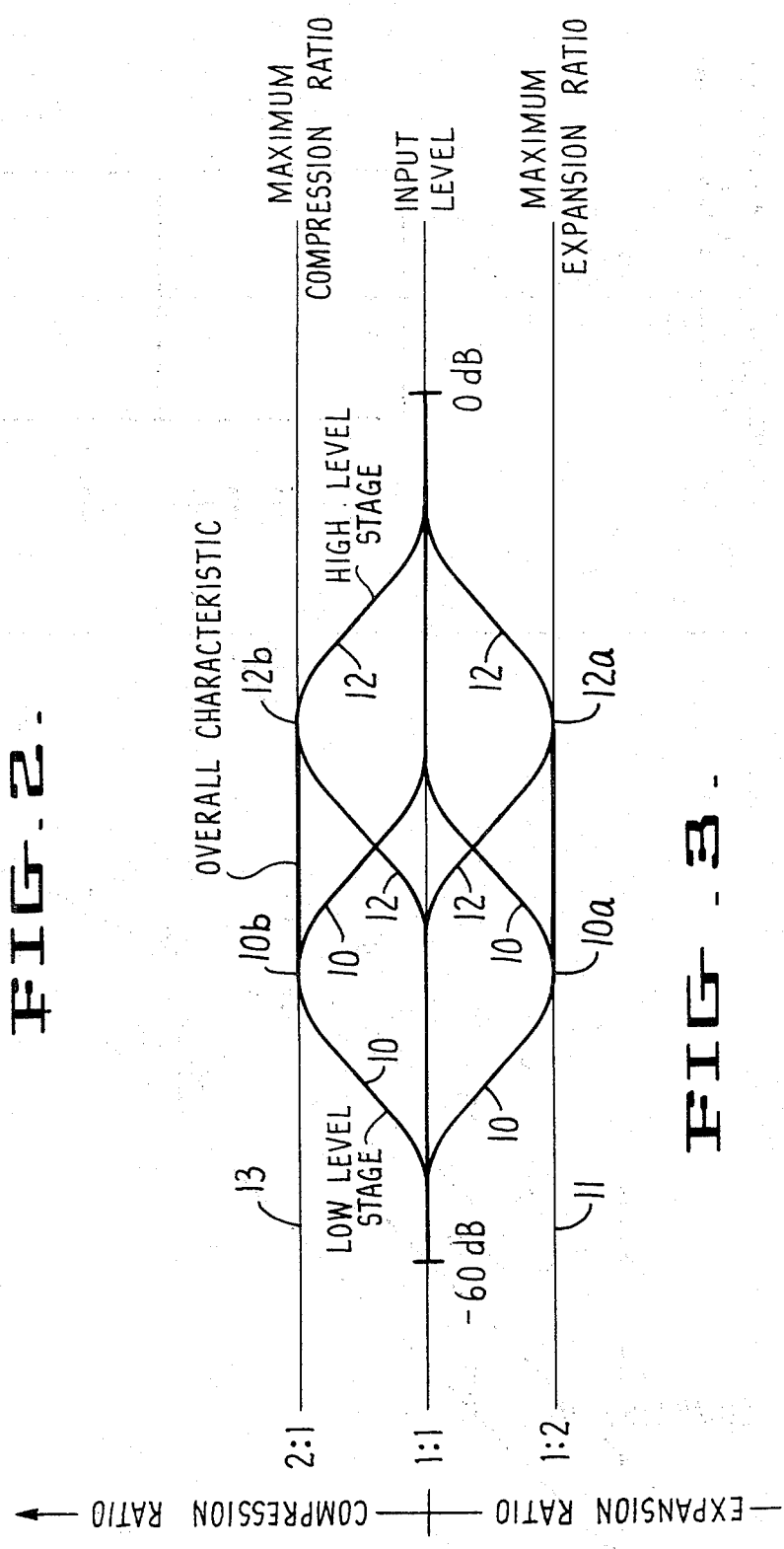
FIG. 3 is an exemplary graphic depiction of the areas of dynamic action and how they can be separated in series connected compressors or expanders.

An exemplary graphic depiction of the separation or staggering for two bi-linear devices is shown in FIG. 3, which plots compression ratio versus input amplitude level (horizontal axis) for a compressor or expander operating at a particular frequency. For clarity, the curves are shown in idealized form; as a practical matter the curves are somewhat asymmetrical in practical embodiments of applicant's A-Type and B-Type noise reduction systems, (U.S. Pat. No. 3,846,719 and U.S. Pat. No. Re. 28,426, respectively). Curve 12 refers to the dynamic action of one compressor or expander (the high level stage). Curve 10 is that of a further compressor or expander (the low level stage), with a separated area of dynamic action. If the high level stage is first in the series of compressors (second in the series of expanders), the curve 12 represents the variations of compression ratio of the first (compressor) stage as a function of the input level to the first stage and curve 10 is the variation of the compression ratio of the second (compressor) stage as a function of the input level to the first stage. The top curves are those of compressors, the bottom curves those of expanders. In this example, the areas of action in response to input amplitude level are separated such that the product of the two curves results in an overall characteristic having a compression ratio or expansion ratio which does not exceed 2:1 (1:2) between the two maximum compression points 10b and 12b (10a and 12a) of the two devices.

Thus, even with two devices in series, the end regions of operation still remain fixed, the maximum compression and maximum expansion ratios are not increased beyond those of single devices and the advantages of single bi-linear devices are retained. Consequently, any errors occurring within the range of dynamic action caused by the devices in series should not exceed those of a single device.

Most bi-linear devices determine the fixed end regions of constant gain by means of fixed, pre-set circuit elements, such as resistors and capacitors, which are inherently stable and cannot introduce dynamic errors, waveform distortions and the like. Consequently, only in a transitional area of operation, between the linear, constant gain regions, can any dynamically active portions of the circuits introduce signal errors.

Note that in the representation of FIG. 3, the dynamic action of a conventional logarithmic compressor or expander becomes a horizontal line; line 11, for example, is the characteristic of a 2:1 compressor, line 13 is that of a 1:2 expander. It is clear, in this analysis, that there is no opportunity for separating or staggering the actions of such devices.

Figure 4:
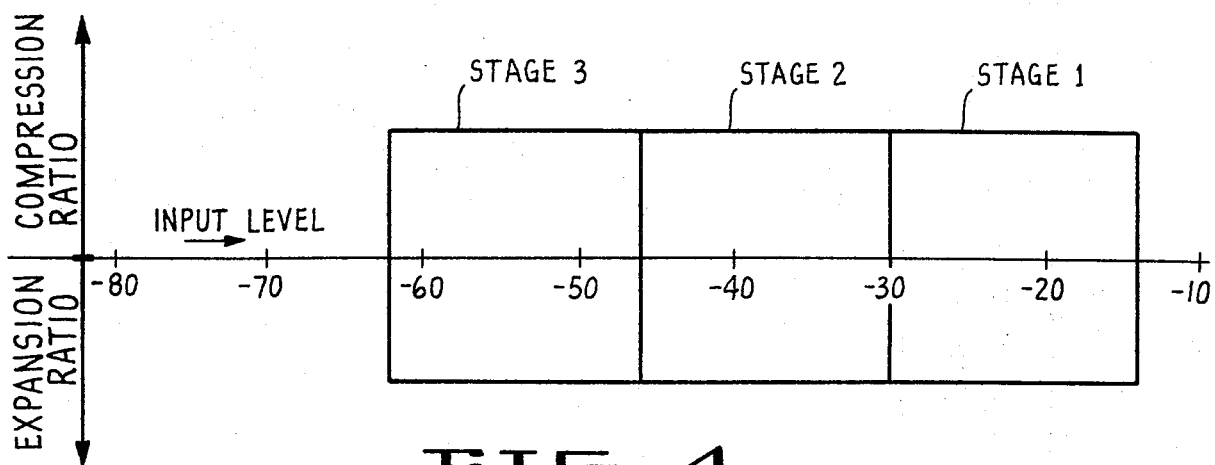
FIG. 4 is a further simplified form of FIG. 3.

For purposes of analysis and to obtain a first order approximation of necessary threshold levels to provide optimum staggering in accordance with the invention, it is useful to idealize FIG. 3 even further. Assume therefore that each compressor (and expander) immediately reaches its maximum compression ratio at a threshold level and holds that ratio until it reaches a finishing point at a higher level where its dynamic action abruptly stops. Then a series of compressors and expanders depicted in the manner of FIG. 3 appear as contiguous rectangular curves such as shown in FIG. 4. As an example, three bi-linear characteristic compressors and expanders are connected in the series. The low level device, which is preferably the third compressor (first expander), has the lowest threshold ($T_3$) shown at $-62$ dB, with its finish point ($F_3$) at $-46$ dB which is the threshold ($T_2$) of the medium level stage. The medium level stage has its finishing point ($F_2$) at $-30$ dB which is the threshold ($T_1$) of the high level stage. The high level stage has its finishing point ($F_1$) at $-14$ dB. All levels are with reference to the overall input. It is further assumed that each stage has a gain of 8 dB and a maximum compression ratio of 2:1.

Figure 5:
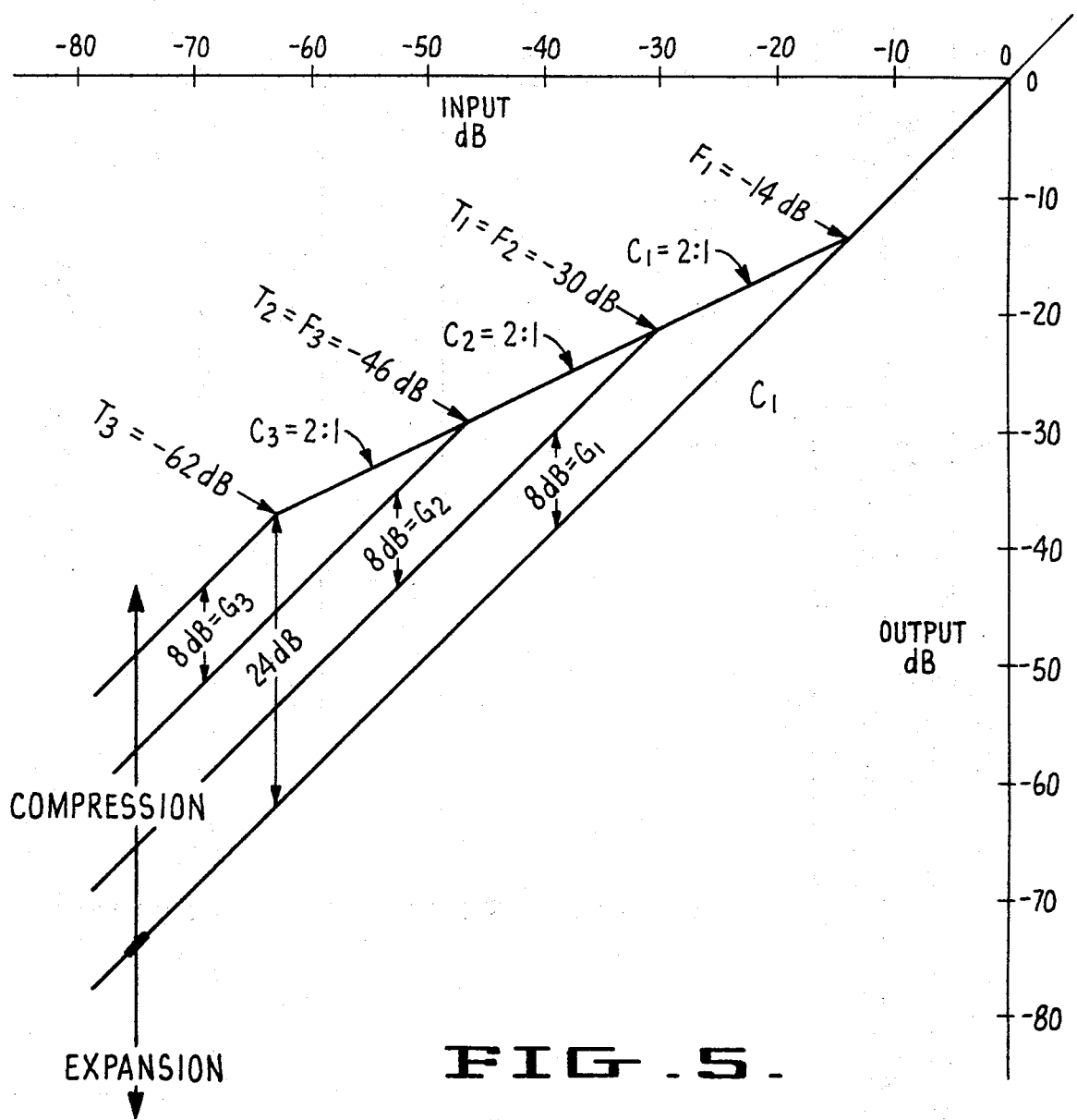
FIG. 5 is a series of idealized bi-linear characteristic curves illustrating a general technique for staggering the thresholds of series circuits.

FIG. 5 depicts idealized characteristic curves (overall input versus output) for compression based on the example of FIG. 4 (the mirror image expansion curves are omitted for clarity). The drawing shows how the dynamic action of each stage occurs next to that of its adjacent stage resulting in an overall compression ratio of 2:1 while obtaining 24 dB of compression.

Based on observations of FIGS. 4 and 5, a single equation sets forth the relationship between threshold levels (T), finishing point (F), maximum compression ratio (C) and gain (G) of any particular stage:

$$T = F - CG/(C-1).$$

Using this equation the threshold levels for each stage can be determined to a reasonably close approximation by an iterative process. For example, if an overall finishing point ($F_1$) of $-14$ dB is desired with a stage gain of 8 dB and a maximum compression ratio of 2, the equation shows that the high level threshold ($T_1$) is $-30$ dB.

This value is then used as the finishing point (F$_2$) of the middle level stage to determine that its threshold should be −46 dB, and so on. Thus each stage is referred back to the result of the previous stage in this analysis. However, the calculated threshold is the overall threshold, referred to the input of the series. To obtain the threshold of a particular circuit referred to its own input, the cumulative signal gain up to that point is taken into account. For example, the threshold of the lowest level stage of FIG. 5 is −46 dB when referred to the input of that stage.

The equation can also be solved for the finishing point F, the compression ratio C, or the gain G. Thus, the designer can determine his circuit parameters based on his design goals. Such goals may include requirements that the lowest level threshold be above the noise floor, that the highest level finishing point be low enough to permit the use of overshoot protection and that the overall maximum compression ratio not exceed a particular value.

In practical circuits, the threshold and finishing point are not always well defined points as they are in this analysis. As discussed in the introduction, the regions in which the intermediate level portion of the characteristic merge with the low level and high level linear portions may be smooth or sharp depending on the characteristics of the circuits that control the dynamic action. Thus, in practice, the threshold region of one circuit will overlap with the finishing point region of another circuit.

Consideration of the above equation and FIG. 5 shows that for the particular case of a 2:1 compression ratio, half of the threshold staggering is provided by the signal gains of the stages and that the other half must be provided by an altered bias on the control element and/or an altered control amplifier gain (increased gain for lower threshold). Similarly, for 1.5:1 and 3:1 compression ratios, respectively, ⅓ and ⅔ of the staggering, respectively, is provided by the stage gains and ⅔ and ⅓ of the staggering, respectively, must be provided by the control circuitry.

In both FIGS. 1 and 5, 0 dB is a nominal maximum or reference level. In practice, a linear headroom (up to the overload or clipping point) of some 10 to 20 dB is provided above the 0 dB level.

As mentioned earlier, it is usually preferable for the high-level stage to be first in a compressor series and the low-level stage to be last. However, a reversed arrangement is also possible. In the reversed case the control amplifier of the first stage needs a high gain in order to achieve the required low threshold. This high gain and low threshold then apply even in the presence of high level signals, which in the case of sliding band systems known in the prior art usually leads to poor noise modulation performance of the overall system. In this reversed arrangement each stage must provide sufficient control amplifier gain to achieve the threshold required of that stage. Moreover, each threshold is essentially fixed and independent of the operation of the other stages. This is a consequence of the fact that the signal gain of each earlier stage has fallen substantially to unity when the threshold is reached for the corresponding succeeding stage. The calculation of the thresholds required for optimal staggering in the reversed case is the same as that in the preferred case. However, the threshold of each stage referred to its own input becomes the same as the overall threshold.

In contrast to the reversed situation, in the preferred arrangement (in which the high-level stage is first in the compressor chain, and the low-level stage is last), there is a useful interaction between the stage gains and the thresholds. The thresholds of the downstream stages are partly determined by the signal gains of the preceding stages. Thus, in a 2 stage system with 10 dB of low level gain per stage, the control amplifier gain requirement of the second stage is reduced by 10 dB, by virtue of the low-level signal gain of the first stage. When a high level signal appears, the 10 dB gain of the first stage is eliminated and the threshold of the low level stage is effectively raised by 10 dB. With sliding band companders this improves the noise modulation performance of the noise reduction action.

In the preferred arrangement the gains of all preceding stages are fully effective up to the threshold of any particular succeeding stage. Thus, in contrast with the reversed order system described above, the preferred arrangement takes best advantage of the prevailing signal gains of the individual stages. Namely:

1. Under very low level (sub-threshold) signal conditions the control amplifier gain requirement of each stage is reduced by an amount equal to the cumulative signal gains of all preceding stages. In the example of FIG. 5, the control amplifier gain required of the lowest level stage, to achieve a threshold of −62 dB, is thus reduced by 16 dB relative to that required if that stage were operating independently or in the reversed configuration described previously. Similarly, the control amplifier gain of the mid-level stage is reduced by 8 dB, thus leading to the most economical circuitry.

2. A signal dependent variable threshold effect is achieved, whereby with sliding band stages, noise modulation effects are reduced. The effective thresholds of the low level stages are progressively raised with increasing signal level at a particular frequency. At high signal levels (on the high level linear portion of the transfer characteristic) the effective threshold of the lowest level stage is raised by a level equal to all the low-level (sub-threshold) stage gains up to that point. In the example of FIG. 5, the threshold of the lowest level stage, normally −62 dB under low level signal conditions, is thus raised by 16 dB, to −46 dB, under high level signal conditions. Similarly, the threshold of the mid-level stage is raised to −38 dB.

In a first practical embodiment of this aspect of the invention, employing series sliding band devices, the compressor 2 and expander 8 of FIG. 2 are essentially standard B-type sliding band devices as set forth in U.S. Pat. No. Re. 28,426, while compressor 4 and expander 6 have modified response characteristics. I have found that, with the noise generated by cassette tapes, a workable result is obtained when the second device (in the compression mode) not only has a staggered input amplitude level response but also has a cut off frequency some two to three octaves lower than that of a standard B-type device. More specifically, the threshold levels of the second device are lowered, both of the syllabic filter/limiters and of the overshoot suppression limiter, to effect staggering, and the corner frequency of the fixed filter is lowered by two to three octaves.

Figure 6:
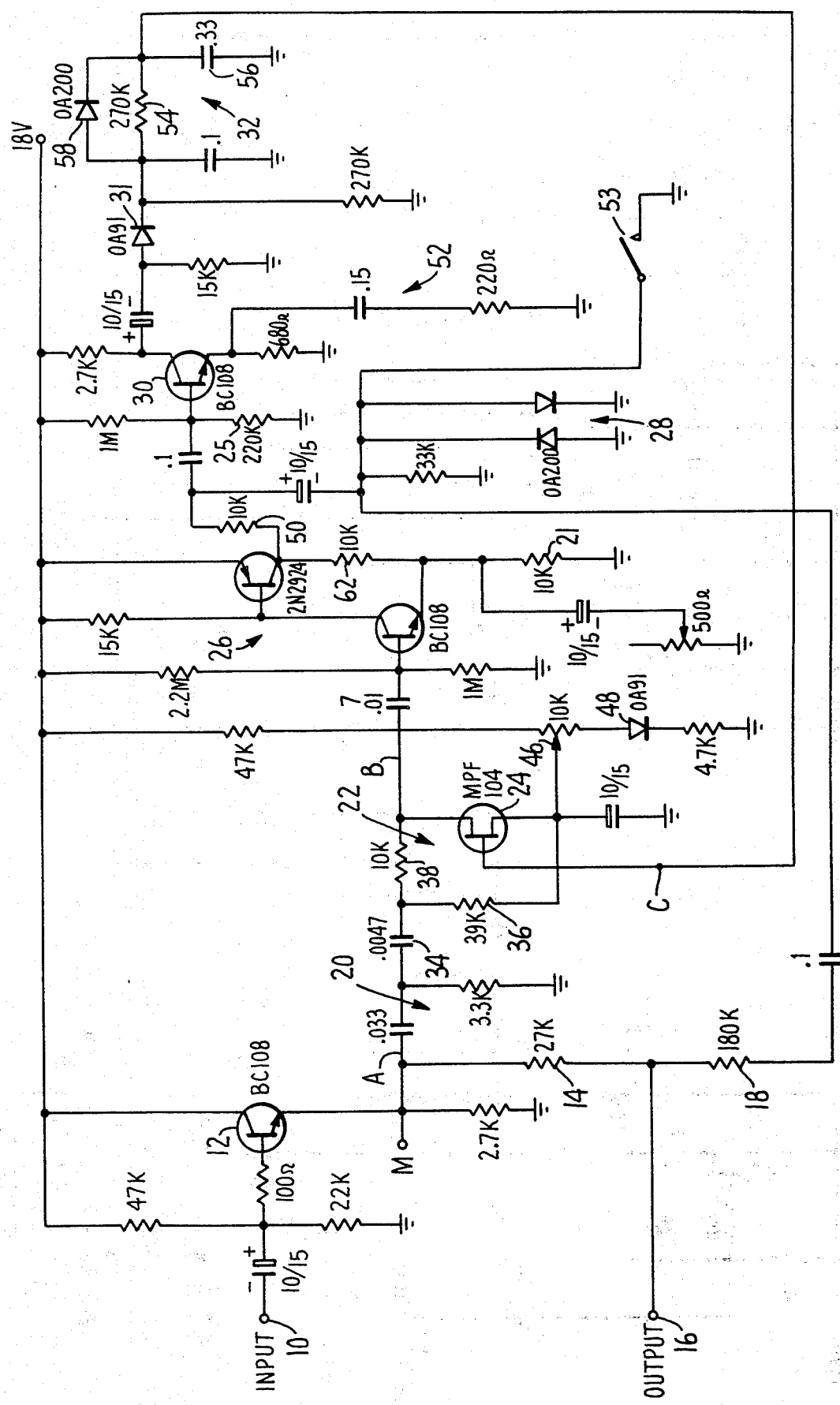
FIG. 6 is a schematic circuit diagram of a prior art sliding band compressor.
Figure 10:
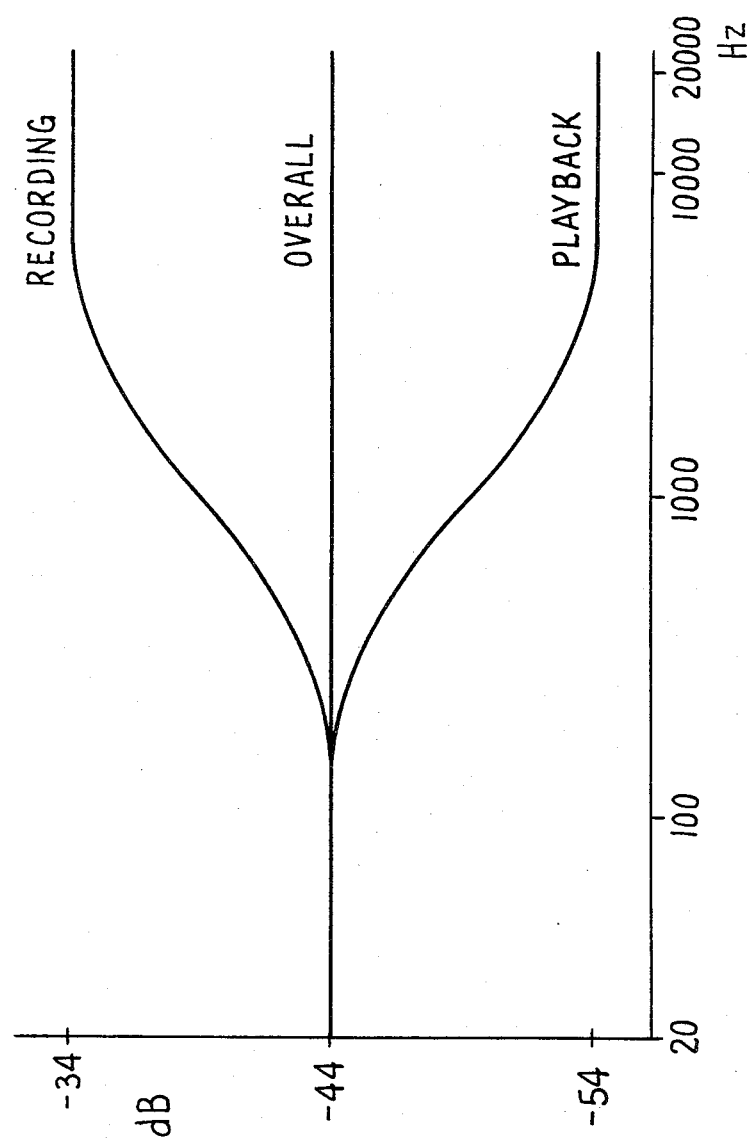
FIG. 10 is a chart recording showing the response below the compression threshold of a prior art compressor and expander according to FIGS. 6, 7 and 8.

Details of the B-type circuit are set forth in FIGS. 6, 7 and 8 which are the same as FIGS. 4, 5 and 10, respectively, of U.S. Pat. No. Re. 28,426 and further details of said circuits, their operation and theory, are set forth therein. The following description of FIGS. 6, 7 and 8 is taken from U.S. Pat. No. Re. 28,426.

The circuit of FIG. 6 is specifically designed for incorporation in the record channel of a consumer tape recorder, two such circuits being required for a stereo recorder. The input signal is applied at terminal 10 to an emitter follower stage 12 which provides a low impedance signal. This signal is applied firstly through a main, straight-through path constituted by a resistor 14 to an output terminal 16 and secondly through a further path the last element of which is a resistor 18 also connected to the terminal 16. The resistors 14 and 18 add the outputs of the main and further paths to provide the required compression law.

The further path consists of a fixed filter 20, a variable cut-off filter 22 including a FET 24 (these constituting the filter/limiter), and an amplifier 26 the output of which is coupled to a double diode limiter or clipper 28 and to the resistor 18. The non-linear limiter suppresses overshoots of the output signal with abruptly increasing input signals. The amplifier 26 increases the signal in the further path to a level such that the knee in the characteristic of the limiter or overshoot suppressor 28, comprising silicon diodes, is effective at the appropriate signal level under transient conditions. The effective threshold of the overshoot suppressor is somewhat above that of the syllabic filter/limiter. The resistors 14 and 18 are so proportioned that the required compensating degree of attenuation is then provided for the signal in the further path.

The output of the amplifier 26 is also coupled to an amplifier 30 the output of which is rectified by a germanium diode 31 and integrated by a smoothing filter 32 to provide the control voltage for the FET 24.

Two simple RC filters are used, though equivalent LC or LCR filters could be used. The fixed filter 20 provides a cut-off frequency of 1700 Hz, below which diminishing compression takes place. The filter 22 comprises a series capacitor 34 and shunt resistor 36 followed by a series resistor 38 and the FET 24, with its source-drain path connected as a shunt resistor. Under quiescent conditions with zero signal on the gate of the FET 24, the FET is pinched off and presents substantially infinite impedance; the presence of the resistor 38 can then be ignored. The cut-off (turnover) frequency of the filter 22 is thus 800 Hz, which it will be noted is substantially below the cut-off frequency of the fixed filter 20.

When the signal on the gate increases sufficiently for the resistance of the FET to fall to less than say 1K, the resistor 38 effectively shunts the resistor 36 and the cut-off frequency rises, markedly narrowing the pass band of the filter. The rise in cut-off frequency is, of course, a progressive action.

The use of a FET is convenient because, within a suitable restricted range of signal amplitudes, such a device acts substantially as a linear resistor (for either polarity signal), the value of which is determined by the control voltage on the gate.

The resistor 36 and FET are returned to an adjustable tap 46 in a potential divider which includes a temperature compensating germanium diode 48. The tap 46 enables the compression threshold of the filter 22 to be adjusted.

The amplifier 26 comprises complementary transistors giving high input impedance and low output impedance. Since the amplifier drives the diode limiter 28, a finite output impedance is required and is provided by a coupling resistor 50. The diodes 28 are, as already noted, silicon diodes and have a sharp knee around ½ volt.

The signal on the limiter and hence on the resistor 18 can be shorted to ground by a switch 53 when it is required to switch the compressor out of action.

The amplifier 30 is an NPN transistor with an emitter time constant network 52 giving increased gain at high frequencies. Strong high frequencies (e.g., a cymbal crash) will therefore lead to rapid narrowing of the band in which compression takes place, so as to avoid signal distortion.

The amplifier is coupled to the smoothing filter 32 through the rectifying diode 31. The filter comprises a series resistor 54 and shunt capacitor 56. The resistor 54 is shunted by a silicon diode 58 which allows rapid charging of the capacitor 56 for fast attack, coupled with good smoothing under steady-state conditions. The voltage on capacitor 56 is applied directly to the gate of the FET 24.

A complete circuit diagram of the complementary expander is provided in FIG. 7, but a full description is not required as the circuit is identical to FIG. 6. Component values, are therefore not, for the most part, shown in FIG. 7.

The differences between FIGS. 6 and 7 are as follows:

In FIG. 7, the further path derives its input from the output terminal 16a, the amplifier 26a is inverting, and the signals combined by the resistors 14 and 18 are applied to the input (base) of the emitter follower 12, the output (emitter) of which is coupled to the terminal 16a. To ensure low driving impedance, the input terminal 10a is coupled to the resistor 14 through an emitter follower 60. Suitable measures must be taken to prevent bias getting in the expander.

The amplifier 26a is rendered inverting by taking the output from the emitter, instead of the collector, of the second (PNP) transistor. This alteration involves shifting the 10K resistor 62 (FIG. 6) from the collector to the emitter (FIG. 6), which automatically gives a suitable output impedance for driving the limiter. The resistor 50 is therefore omitted in FIG. 7.

It should be noted that it is important in aligning a complete noise reduction system to have equal signal levels on the emitters of the transistors 12 in both compressor and expander. Metering terminals M are shown connected to these emitters.

FIG. 8 shows a preferred circuit, for replacing the circuit between points A, B and C in FIGS. 6 and 7. When the FET 24 is pinched off, the second RC network 22 is inoperative, and the first RC network 20 then determines the response of the further path. The improved circuit combines the phase advantages of having only a single RC section under quiescent conditions with the 12 dB per octave attenuation characteristics of a two-section RC filter under signal conditions.

In the practical circuit, using MPF 104 FET's, the 39K resistor 36a is necessary in order to provide a finite source impedance to work into the FET. In this way the compression ratio at all frequencies and levels is held to a maximum of about 2. The 39K resistor 36a serves the same compression ratio limiting function in the improved circuit as the resistor 36 in the circuit of FIG. 6 or FIG. 7. In addition, this resistor provides a low frequency path for the signal.

MODIFICATIONS TO FIGS. 6, 7 AND 8

As mentioned previously, in the first practical embodiment of this aspect of the present invention, compressor 4 and expander 6 of FIG. 2 employ devices of the type shown in FIGS. 6, 7 and 8 with modified characteristics. The altered cut off frequency and lowered threshold are accomplished, respectively, by modifying the characteristics of the fixed filter (fixed filter 20 of FIG. 6) and also the control amplifier gain by altering its pre-emphasis characteristics (emitter time constant network 52 of amplifier 30 in said FIG. 6). The threshold of the overshoot suppressor is lowered by the application of suitable DC biases (in the forward direction) to the diodes 28. Biases of about plus and minus ¼ volt in the forward direction are applied to silicon diodes 28, thereby reducing the overshoot suppression level by several decibels. Alternatively, the gain of amplifier 26 (FIG. 6) can be increased to the required level or the amplifier 26 gain can be increased to a high level and attenuation used to adjust the signal level to the diodes. The impedances of the variable filter (variable filter 22 in FIGS. 6 and 8) are left generally unaltered in order to retain a suitable match to the characteristics of available voltage controllable variable circuit elements. Suitable modifications of the B-Type sliding band circuit shown in FIGS. 6, 7 and 8 are to change the value of the 3.3K resistor in fixed filter 20 to a value of 18K in order to lower its cutoff frequency two to three octaves. For an increase in the control amplifier gain, the value of the capacitor in the amplifier 30 emitter time constant network 52 is increased from 0.15 to 0.60 microfarads (or from 0.1 to 0.4 microfarads if the 0.1 microfarads value suggested in U.S. Pat. No. Re. 28,426 is used).

Variable filter 22 has an all pass frequency characteristic in response to the quiescent control voltage and thus the overall filter cut off is lowered two to three octaves. Increasing the capacitor value in the emitter network of control amplifier 30 increases the amplifier gain at any given frequency. As explained above and in U.S. Pat. No. Re. 28,426, as the control voltage (from amplifier 30, rectifier 31 and smoothing filter 32) increases, the cut off frequency of the variable RC filter 22 rises. Thus, with larger values of capacitance in network 52, the variable filter responds by moving up in frequency from its quiescent value in response to lower level signals, thus staggering the level response or threshold from that in the unmodified B-Type circuit.

The level response can be staggered in numerous ways in addition to changing the emitter network of the control amplifier. Other possibilities include changing the bias on the control element, otherwise altering the gain of the control amplifier, altering the relative signal levels between the filter path and the control signal derivation path, and so on.

Certain details of the circuit of FIGS. 6, 7 and 8 have evolved over the years and more modern forms of the circuit have been published and are well known in the art. For example, the corner or cut-off (turnover) frequency of the fixed filter 20 is 1500 Hz rather than 1700 Hz. Also, the cut-off frequency of variable filter 22 is 750 Hz rather than 800 Hz. Reference to the specific circuit in U.S. Pat. No. Re. 28,426 is made for convenience in presentation.

Figure 9:
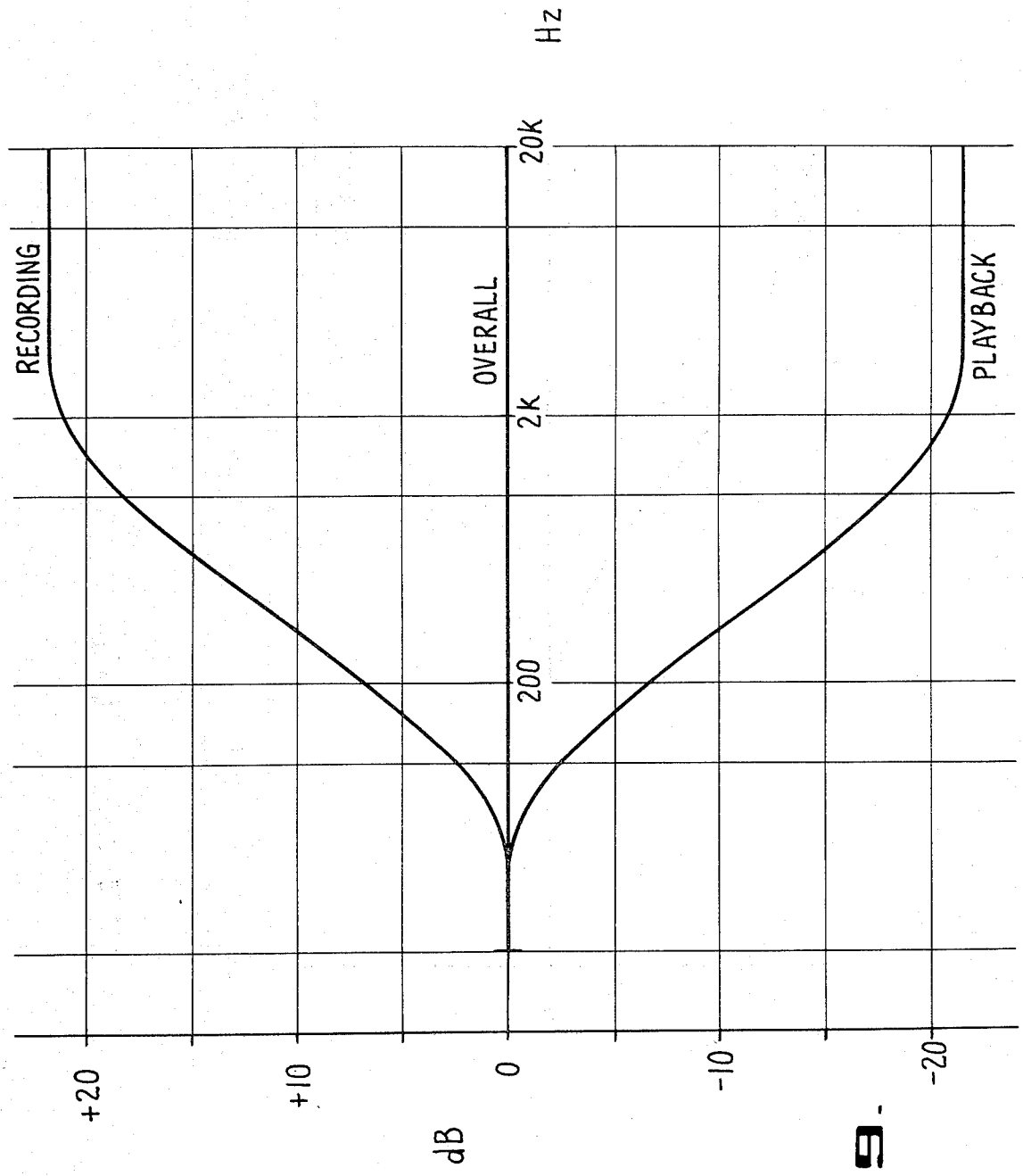
FIG. 9 is a chart recording showing the response below the compression threshold of two series compressors and expanders according to an embodiment of the invention.
Figure 12:
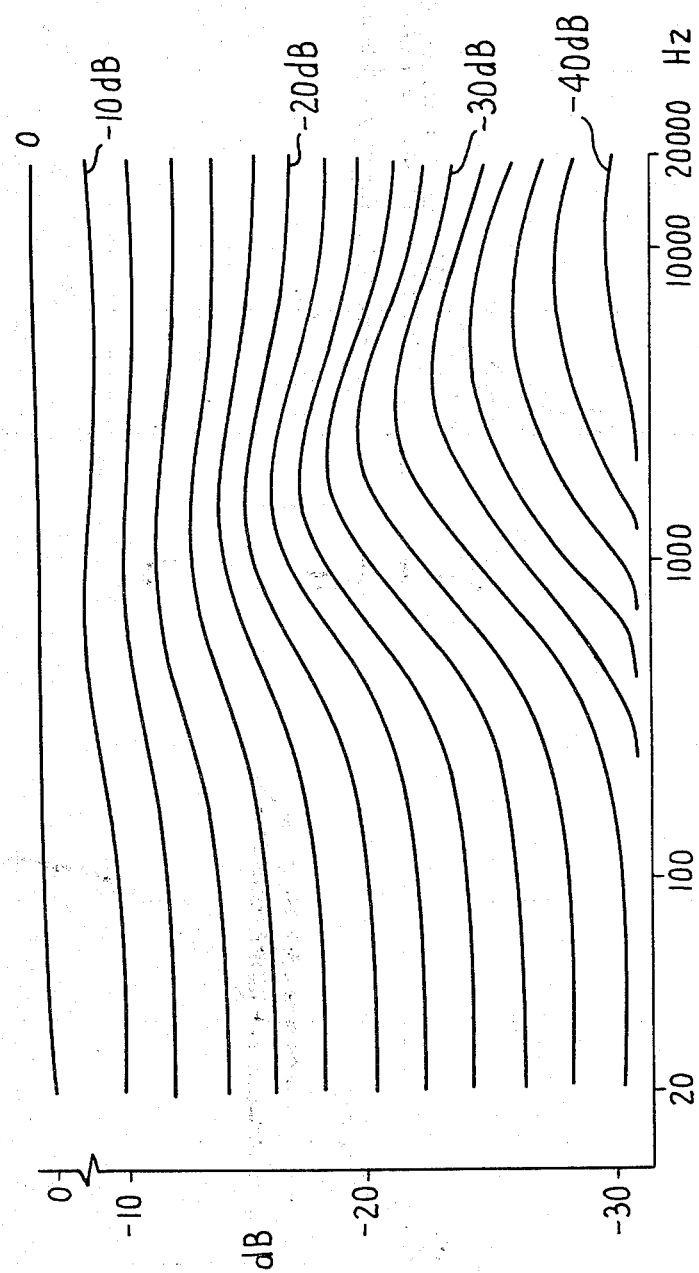
FIG. 12 is a chart recording of the input-output response as a function of frequency of a prior art compressor having a single device.

FIG. 9 shows an actual chart recording plot of response below the compression threshold of the two series connected compressors, the first being modified as described above; the expander response is also shown. Compare to FIG. 10 (which is FIG. 12 of U.S. Pat. No. Re. 28,426) showing an actual chart recording plot of response below the compression threshold of a single compressor or expander according to FIGS. 6, 7 and 8.

Figure 11:
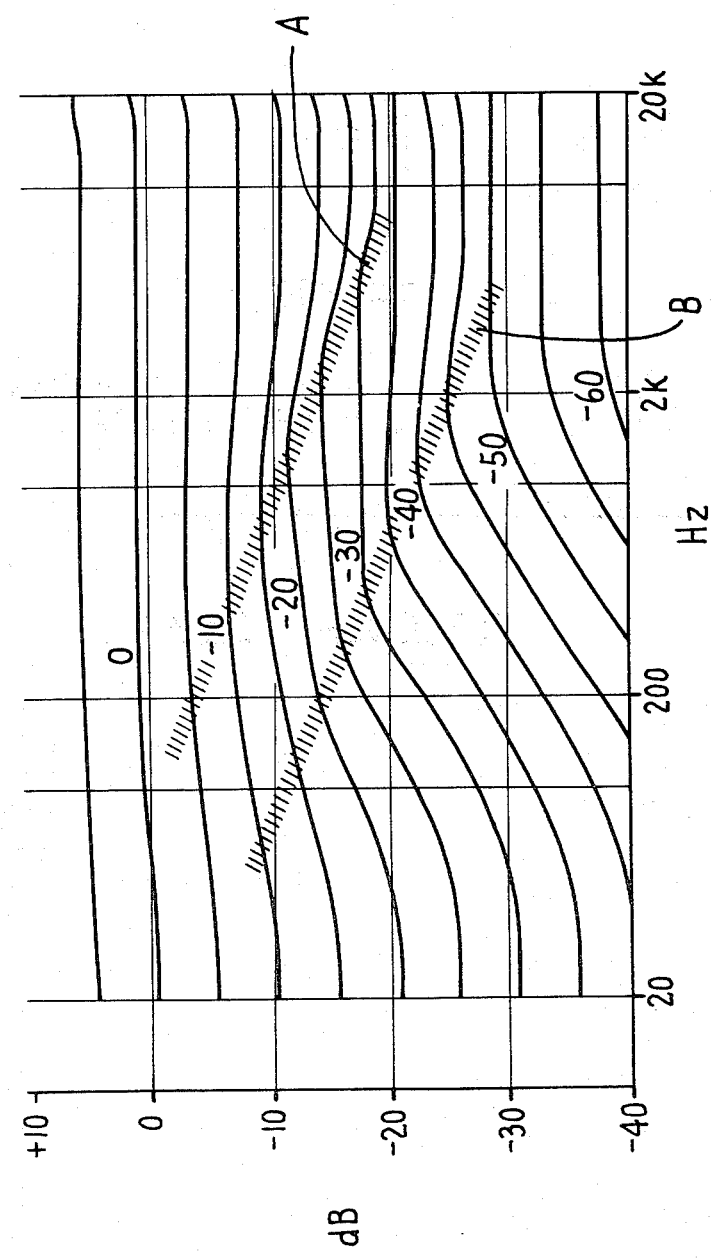
FIG. 11 is a chart recording of the input-output response as a function of frequency of a compressor having series devices according to an embodiment of the invention.

FIG. 11 is a chart recording of the input-output response of the series compressors as a function of frequency. Inspection of the response plots shows the two dynamic areas for the curves indicating the two staggered areas of action. While the observability of the dynamic areas in these curves is useful to demonstrate the staggered action of the devices, in practice it is preferred that the curves are as smooth as possible, without discernible dynamic areas or "bumps". Parallel lines A and B are drawn through the threshold regions: line A referring to the standard circuit and line B to the modified circuit. Compare these curves to FIG. 12 (which is FIG. 11 of U.S. Pat. No. Re. 28,426) which plots similar response curves for a single unmodified B-type sliding band compressor. FIG. 11 shows that the compressor comprising series devices provides essentially twice as much compression which is distributed over a greater frequency and level area.

Figure 13:
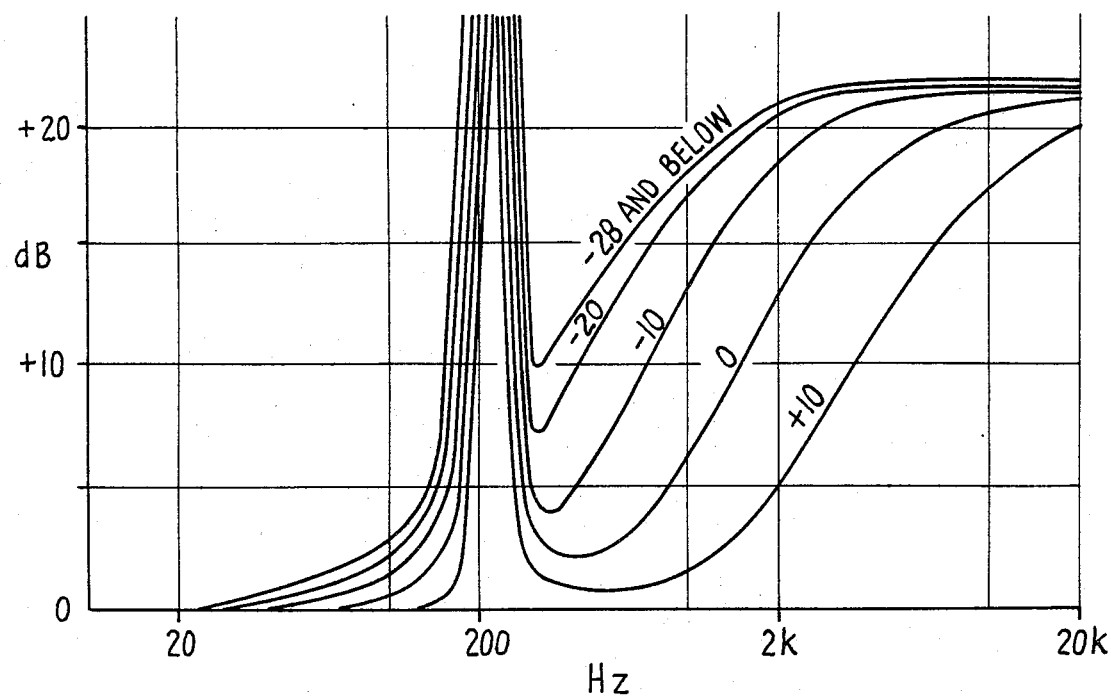
FIGS. 13–15 are a series of probe tone curves illustrating the sliding band action of an embodiment of the invention and the circuit of FIGS. 6 and 8.
Figure 14:
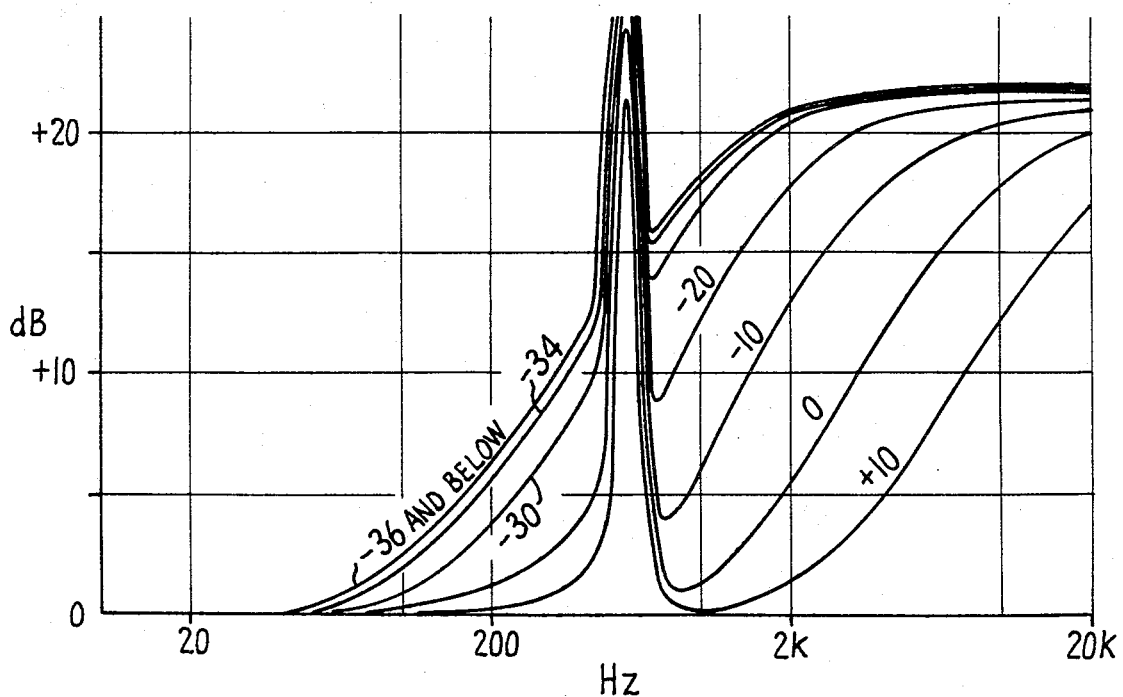
Figure 15:
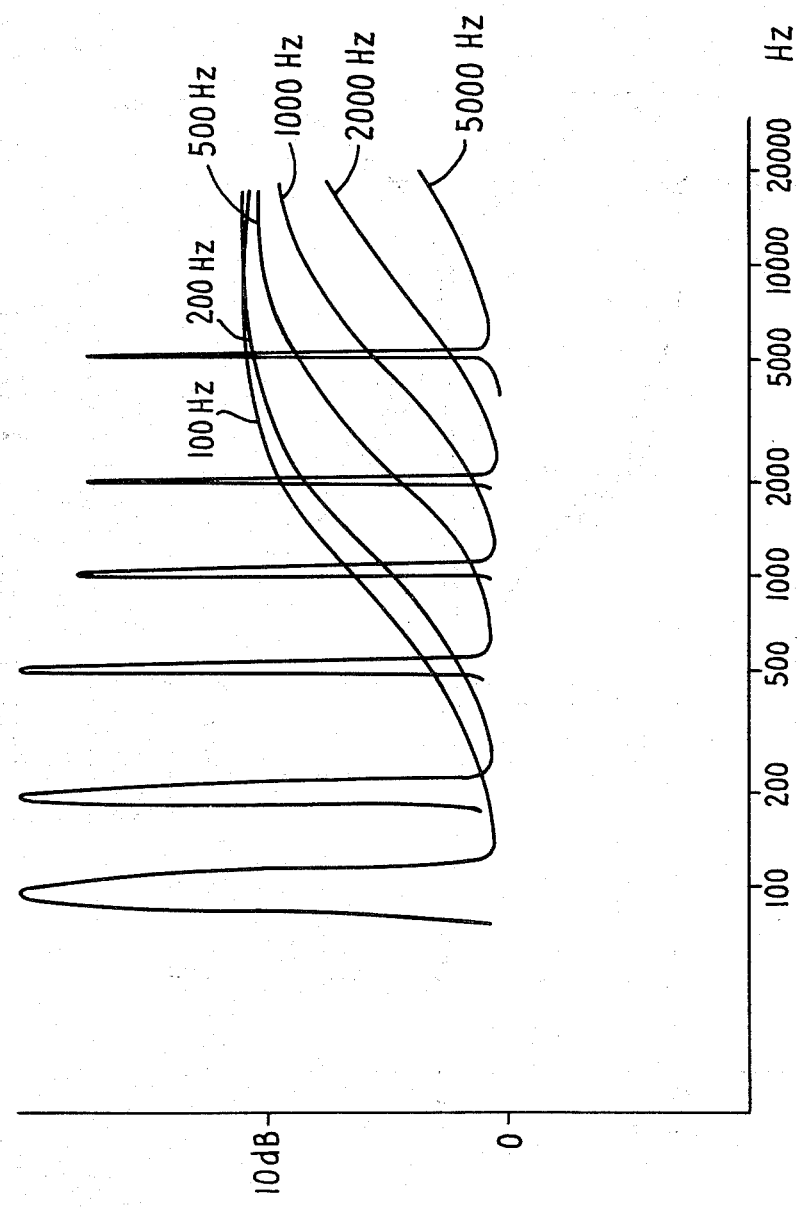

The variable band action of the staggered action series devices can be seen in FIGS. 13 and 14, showing a chart recorder probe tone response of said series connected compressors. Compare to FIG. 15 (which is FIG. 9 of U.S. Pat. No. Re. 28,426) which is an actual chart recording obtained from the circuit of FIG. 6 incorporating FIG. 8. The variable band action is shown by plotting the compressor frequency response by means of a low-level probe tone (the level of which is below the compressor threshold) in the presence of a high-level signal; the probe is detected at the compressor output by means of a tracking filter. The high-level signal causes the compressor circuitry to operate, the graph showing the effect on the turnover frequency of the filter.

FIG. 13 shows the response for a probe tone at −65 dB and 200 Hz signal tones at levels ranging from −28 dB and below to +10 dB. FIG. 14 is for a 500 Hz signal tone at levels ranging from −34 dB and below to +10 dB.

In a further practical embodiment of this aspect of the invention, giving improved performance, the compressor 2 and expander 8 of FIG. 2 are both modifications of standard B-type devices in addition to compressor 4 and expander 6. Both series devices have their corner frequency lowered by two octaves in order to provide a sharply rising low-level response characteristic. Dynamic action staggering is provided by decreasing the thresholds (both syllabic and overshoot suppression) of the second (in the compressor mode) device.

A feature and useful advantage of this aspect of the invention is that the frequency responses of the individual circuits are compounded. If the most sharply rising noise reduction characteristic is desired, this is accomplished by the use of circuits having the same low level (quiescent) frequency response characteristics.

Accordingly, in the improved embodiment, the choice of identical filter characteristics at about 2 octaves below that of the standard B-Type device results in a characteristic that rises rapidly above about 300 Hz. Thus, the system becomes capable of achieving substantial noise reduction in the critical 300 Hz to 2 kHz range, a region in which tape noise is discernible once noises above 2 kHz have been reduced. There is negligible audible noise contribution from the tape below about 300 Hz. By providing only minimal noise reduction action below 300 Hz, the system avoids the manipulation of fundamental signal frequencies and improves the complementarity of the system in practical tape recorders, which, for example, may have frequency response errors due to head bumps and the like. Moreover, by avoiding the compression of low frequency signals, system compatibility is improved because the boosting of low frequency signals would result in annoying rumble and bass enhancement when encoded tapes are played on systems not having complementary expanders.

Referring once again to FIGS. 6 and 8, the two series devices in the practical embodiment under discussion both have the resistor in fixed filter 20 changed from 3.3K to 13K, which causes the overall lower cut off frequency of the filters 20 and 22 to shift about 2 octaves lower to about 375 Hz. In the second device, the capacitor in the emitter network 52 of control amplifier 30 is increased in value by a factor of about 4 as in the previously discussed embodiment. In practice a factor of 4.7 is used. This results in a staggering of threshold levels of roughly 12 dB (depending on signal level and signal frequency). The overshoot of the suppression level of the diode limiter circuit 28 is lowered as discussed above.

In a modification of the last described practical embodiment the capacitor 34 in filter 22 can be increased in value to 0.01 microfarads in order to promote consistency in characteristics from unit to unit and to improve the noise modulation characteristics. In that case, due to the substantially equal time constants of fixed filter 20 and variable filter 22, the arrangement is equivalent to a single pole variable filter and the fixed filter can be eliminated. In that case the resistor 36a (which has a value of 47K in modern forms of the B-type circuit) is placed in shunt with the source-drain path of FET 24 so as to provide a quiescent corner frequency of about 375 Hz. It is, however, desirable to retain the fixed filter in the high level circuit so that the circuit can be switched to operate by itself as a standard B-type circuit.

As a practical matter, a consumer product embodying the improved systems just described will be compatible with existing non-encoded and B-Type encoded software (e.g., tapes and FM broadcasts). The improved systems incorporate a standard B-Type device and, hence, can be switched to operate as a B-Type device for full compatibility. On the other hand, when recorded tapes become available encoded with the improved system, existing B-Type consumer systems should observe very little alteration of spectral balance if the improved system also incorporates the other two aspects of the invention described hereinafter (e.g., the "C-Type" system).

The standard B-Type circuit described in U.S. Pat. No. Re. 28,426 has a maximum compression ratio of about 2:1. This compression ratio has proven to be a good practical choice for consumer cassette tape compander systems. In the series connected circuits of the embodiments described above, each circuit retains a maximum compression ratio of about 2:1 and the maximum compression ratio of the overall combination of series circuits is about 2:1 at most input signal levels and frequencies. However, in practical embodiments, it is difficult to avoid somewhat greater ratios, e.g., 2.5:1, in a small range of levels and frequencies. This can be tolerated if the compression ratio is not more than about 2.5:1 (or about 1¼ times that of each circuit) and if the range of levels and frequencies in which it occurs is not large.

Another specific embodiment of the invention depicted generally in FIG. 2 is to configure one compressor and expander as a split band device, such as described in U.S. Pat. Nos. 3,846,719 and 3,903,485, and the other compressor and expander as a sliding band device. One suitable split band or multi-band device is described in the *Journal of the Audio Engineering Society*, Vol. 15, No. 4, October, 1967, pp. 383–388. Split band devices in accordance with the parameters in that paper have become well known as A-Type devices.

In a practical embodiment, an A-Type compressor receives a flat input signal and provides its output to a specially tailored sliding band device. It is most advantageous to locate the A-Type device so as to receive an unprocessed input signal because it is designed to process a flat input signal. Placing the sliding band device first would have the disadvantage of changing the flat input signal to a form less suited for the A-Type device input. On the reproducing side, the sliding band expander receives the channel N signal, processes it and applies it to the A-Type expander.

Figure 16:
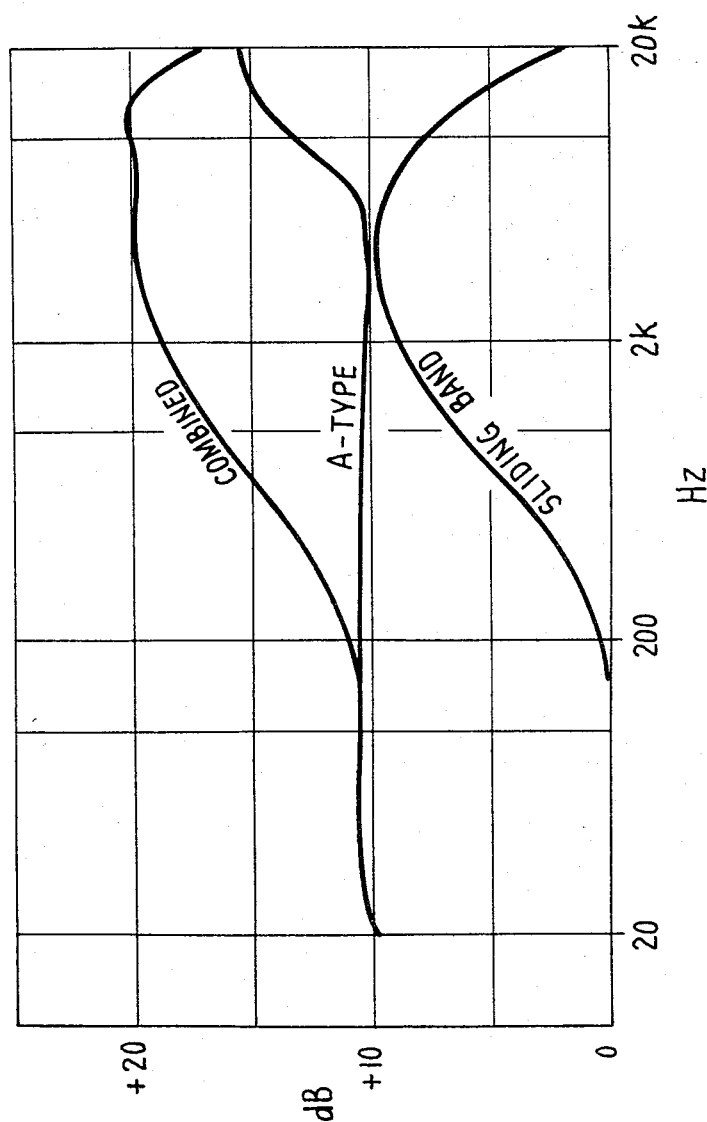
FIG. 16 shows characteristic curves below the compression threshold of a further embodiment of this aspect of the invention.

FIG. 16 shows curves similar to FIG. 9 for the low signal level response of an A-Type compressor alone, the sliding band compressor alone and the combined compressor response. The expansion response curves are complementary in the manner of FIG. 9. The A-Type device provides 10 dB compression up to about 5 kHz, above which the increase in level rises smoothly to 15 dB at 15 kHz. Advantage is taken of this rising response of the A-Type characteristic to desensitize the sliding band characteristic at high frequencies (see the high frequency portion of the "sliding band" curve in FIG. 16); this is advantageous in reducing the effects of high frequency channel-response uncertainties, hereinafter described in greater detail. Thus, the combined response curve climbs smoothly to 20 dB where it remains essentially level to about 14 kHz where it drops off. The sliding band device is designed to have operating thresholds and resulting areas of dynamic action which are well clear of those of the A-Type circuit.

FIG. 17 shows a series of response curves at different levels for the series A-Type and sliding band compressors. These curves present the same type of information as FIG. 11. The shaded area C indicates generally the dynamic regions resulting from action of the A-Type device; shaded area D from action of the sliding band device. This arrangement results in a maximum compression ratio which at any level or frequency does not exceed about 2:1 and therefore is relatively free of error amplification effects in practical tape recording channels.

It will be understood that for exemplary purposes a standard A-Type device is connected in series with a special sliding band device. However, in principle, the A-Type device can be modified to shift its areas of dynamic action so as to provide the best fit with the action areas of the sliding band device.

The precise amount of staggering or shifting necessary in this and other configurations set forth herein will depend on the parameters of the signal processing devices used. The goal in staggering the areas of dynamic action is to minimize bunching effects in the response curves. Bunching is an indication of large compression or expansion ratios. For example, see FIG. 18 which shows excessive bunching; that is, at some frequencies and levels a 10 dB change in input level results in a 2½ dB change in output—a 4:1 ratio. Optimally, with appropriate staggering, a 2:1 ratio is never substantially exceeded in a cassette compander system throughout most of the range of levels and frequencies. In other types of transmission systems higher compression ratios may be acceptable.

As discussed in U.S. Pat. No. Re. 28,426, for economy in manufacture of tape recorders, a single compressor/expander is employed with a mode switch. In the present invention it is also desirable to have a switchable mode feature. However, the use of series devices appears to complicate such a switching arrangement. If the switchable processor (encoder/decoder) comprises series connected sections which may be called A and B, then the switching arrangement must provide for the following: In the record mode, 1. Arrangement of the processor as series connected sections in A-B sequence.
2. Switching of the operation of each section to the encode mode.
3. Feed of the line input signal to section A input.
4. Feed of section B output signal to the recording amplifier input.
5. Feed of the line input signal directly to the line output terminal for purposes of monitoring during recording.

In the playback mode,

1. Arrangement of the processor as reversed series connected sections in B-A sequence for overall complementary operation.
2. Switching of the operation of each section to the decode mode.
3. Feed of the playback amplifier output signal to section B input.
4. Feed of section A output signal to the line output terminal.

The above numerous requirements do not appear to make the provision of a simple and practical switching scheme an easy one. It is, nevertheless, possible to devise a relatively simple implementation using either a four-pole or two-pole double-throw (changeover) switch.

Figure 19:
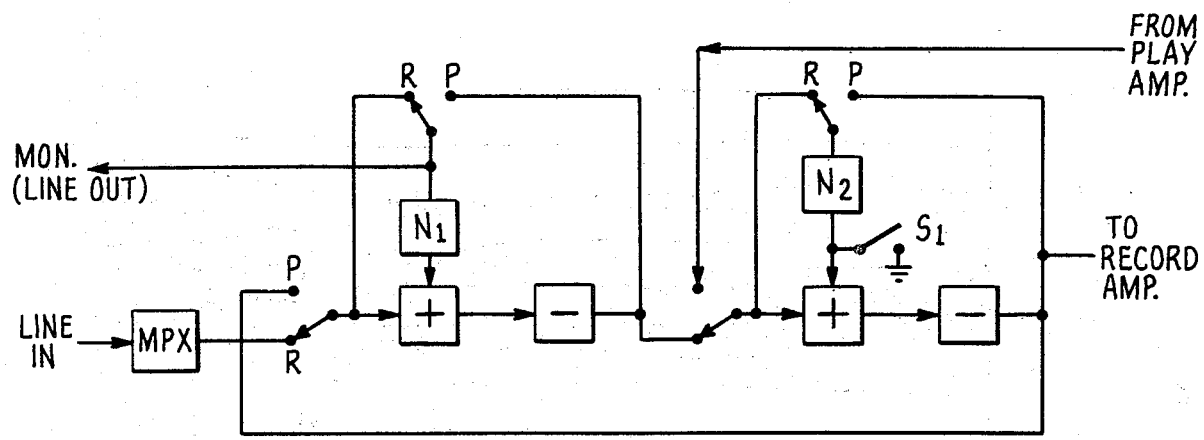
FIGS. 19–21 are block diagrams of a switched compressor/expander according to this aspect of the invention.
Figure 20:
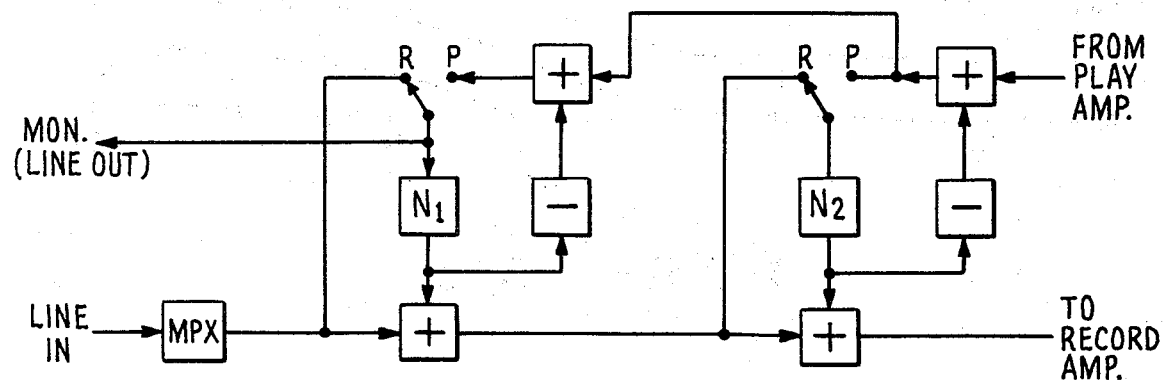
Figure 21:
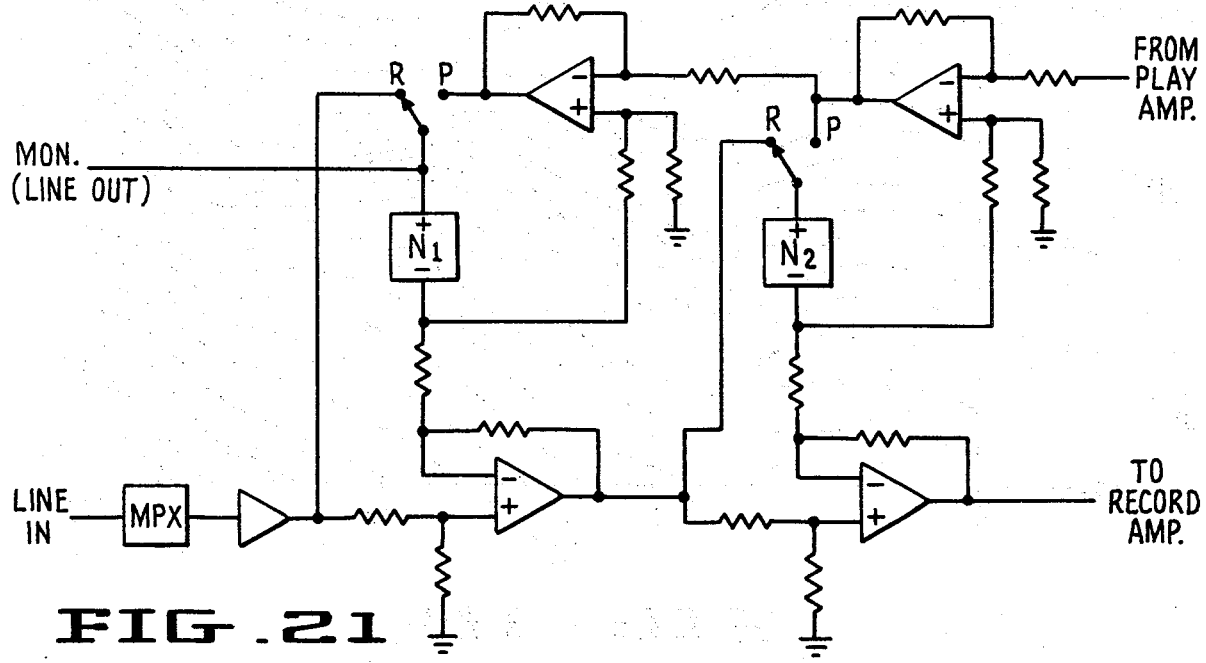

FIG. 19 shows a block diagram of the resulting four-pole switching arrangement, where both stages may, for example, comprise sliding band device integrated circuits (IC's). In FIG. 20, the block diagram shows a two-pole switching configuration. If standard B-Type IC's are used then only the portion of each device containing the noise reduction path (N) is used. FIG. 21 shows the arrangement of FIG. 20 in greater detail. The combining networks can be implemented with a quad op-amp (four section operational amplifier). Thus, each processor (switchable compressor/expander) can be implemented practically with two single channel B-Type IC's (or a dual channel IC), a quad op-amp, and a two-pole changeover switch. In FIGS. 19–21, "MPX" refers to a sharp low pass filter popularly known as a multiplex filter, "$N_1$", is a B-Type or modified B-Type noise reduction side path as set forth above and "$N_2$" is a modified noise reduction side path. Blocks labelled "+" and "−" are additive and subtractive combiners, respectively. It will be understood that FIGS. 19–21 are shown by way of example to illustrate switching techniques.

A further important switching consideration in C-Type circuitry is that of providing compatibility with conventional B-Type operation. This may be achieved by actuation of switch $S_1$ in FIG. 19, which serves to disable the additional noise reduction circuitry, and by similarly placed switches in FIGS. 20 and 21.

The switching techniques of FIGS. 19, 20 and 21 are also applicable to the further practical embodiment of this aspect of the invention. Further details on switching are set forth below in connection with the combination of aspects of the invention.

II NETWORKS FOR SUPPRESSING MID-FREQUENCY MODULATION EFFECTS IN COMPRESSORS, EXPANDERS AND NOISE REDUCTION SYSTEMS

A. Background of the Invention (Field of the Invention)—Aspect II

This aspect of the present invention is concerned in general with circuit arrangements which alter the dynamic range of signals, namely compressors which compress the dynamic range and expanders which expand the dynamic range. This aspect of the invention is particularly useful for treating audio signals but is also applicable to other signals.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, particularly audio recording and play back products, a single device is often configured for switchable mode operation as a compressor to record signals and as an expander to play back compressed broadcast or pre-recorded signals.

Transmission channels are known to have frequency dependent characteristics. Consequently the frequency spectrum of received or played back signals is altered and when compressed signals are applied to a transmission channel, complementary expansion of the signals is degraded by the transmission channel frequency characteristics.

In compander type noise reduction systems, complementarity requires not only that the expander have essentially the inverse characteristics of the compressor, but also that the transmission channel between the compressor and expander preserve relative signal amplitudes (and preferably also the phases) at all frequencies within the bandwidth of signals compressed. As received at the expander, changes in the relative levels caused by the transmission channel are indistinguishable from signal processing by the compressor. Hence, errors in the transmission channel cause the expanded signals to differ from the input signals to the compressor. Such differences can be significant and audible depending on the spectral content of the signals. With high compression/expansion ratios, errors in the transmission channel become more significant. Typically, the most audible effect is not the direct effect on very high or very low frequency signals themselves, but rather the modulation effect on signals between the bandwidth extremes that is caused by failure of the extreme high and low frequency signals to reach the expander. The modulation effect may include amplitude errors, phase errors and dynamic errors. For discussion purposes this effect will be referred to as the mid-band modulation effect.

In wideband companders an amplitude error at the controlling frequency will manifest itself to the same degree in all other portions of the spectrum. This may or may not be acceptable. In sliding band companders, as described hereafter, if the controlling frequencies are at the bandwidth extremes, errors at such frequencies are substantially multiplied at mid-frequencies. (Conversely, if the controlling frequencies are at mid-frequencies, as they usually are, then any errors at the frequency extremes are reduced; this is an advantage of sliding band companders.) "Transmission channel" as used herein is defined to include all portions of the system between a compressor and an expander.

In the case of noise reduction systems that record compressed signals on relatively narrow bandwidth media such as slow speed magnetic tape, e.g., compact cassettes, it is particularly difficult to provide accurate complementary expansion of the compressed signals. This is due to the inability of such systems to provide a flat signal amplitude response particularly at low and high frequencies. However, such problems exist even in professional compressor/expander systems. The inadequacy occurs after the compressor and can be caused by the recorder, the tape, the playback unit or any combination thereof, including bandwidth limitation filters. Similarly in other systems, such as FM or satellite broadcasting, the errors occur after compression in the transmitter, the broadcast signal carrying media, the receiver or combinations thereof.

In practical compressor/expander systems it has been found necessary to incorporate sharp cutoff filters before the compressor and before the expander. The filters are at least low pass, but preferably also include highpass sections. Such band-limitation filters have corner frequencies (about 16 kHz in consumer systems and somewhat above 20 kHz in professional systems) at the edges of or outside the useful bandpass of the system in order not to limit the system bandwidth. Such filters have several functions:

(a) Attenuation of subcarrier components and the 19 kHz pilot tone used in FM broadcasting, in order to avoid bias "birdie" beats (whistles) and mistracking of encode and decode noise reduction processor circuits.

(b) Attenuation of the tape recorder bias which may leak in the signal circuits, in order to avoid encoder/decoder mistracking.

(c) Attenuation of rf or supersonic components in the encoder input signal which may otherwise result in audible intermodulation products and/or bias "birdies."

(d) Attenuation of supersonic tape noise or other transmission channel noise at the decoder input, in order to avoid encoder/decoder mistracking.

(e) A signal bandwidth definition to promote complementarity in response of the encoder/decoder.

In professional applications it is desirable to employ a high frequency bandwidth limitation filter (e.g., at 20-25 kHz) and preferably also a low frequency bandwidth limitation filter (e.g., at 20 Hz).

Strictly speaking, if an ideal channel exists between the encoder and decoder, then the input filter to the decoder should be disconnected, as its inclusion may result in some signal situations in a slight noncomplementarity (the encoder signal is subjected to one stage of filtering; the decoder is subjected to two stages of filtering). However, removal of the decoder input filter is not practical because of considerations (a) to (e) above. Therefore, even when there is a good channel between the encoder output and decoder input, the presence of the very necessary decoder input filter (for protection purposes) results in an inherently non-complementary system under certain signal conditions. Because of this it is helpful to consider the expander input filter to be an integral part of the transmission channel.

B. Summary of the Invention—Aspect II

It is an object of this aspect of the present invention to provide for the suppression of the adverse effects on complementarity in compander type noise reduction systems caused by errors in transmission channel amplitude response.

Stated in other words, it is an object of this aspect of the present invention to provide for the suppression of the adverse effects on complementarity in compander type noise reduction systems caused by errors in amplitude response that occur between the compressor and expander.

It is a particular object of this aspect of the invention to suppress non-complementarity effects at very high (low) frequencies that produce audible effects at mid-frequencies (to reduce the mid-band modulation effect).

A further object of this aspect of the invention is to suppress such adverse effects in systems in which the bandwidth of compressed signals exceeds the bandwidth in which the transmission channel amplitude response is relatively flat.

It is yet a further object of this aspect of the invention to suppress such adverse effects in audio tape systems employing Compact Cassette or other bandwidth restricted media, including the audio portion of video cassettes and video discs.

It is a further object of this aspect of the invention to reduce the non-complementary modulation of low level medium frequency (e.g. 500 Hz–1 kHz, or so) signals when present with extremely high frequency signals (e.g. above 10 kHz) in such audio tape systems.

It is a further object to reduce non-complementary effects introduced by the use of expander input filters.

It is yet a further object of this aspect of the invention to reduce the above effects in sliding band systems of the type described hereinafter.

In bandwidth restricted systems the frequency bandwidth of compressed signals approaches or exceeds the usable bandwidth of the record/playback transmission channel and thus such systems are especially susceptible to errors in record/playback frequency response, particularly in the region of the high and low frequency band edges.

There are two aspects to the problem: (1) the compressor output bandwidth may exceed the bandwidth in which the record/playback response is relatively flat in that self-contained audio device, and (2) the compressor output bandwidth of the device used in preparing prerecorded tapes or discs may exceed the bandwidth in which the audio device playback response is flat.

While errors may theoretically occur anywhere in the spectrum, as explained further below, this aspect of the invention is directed to suppressing the effect of errors at the bandwidth extremes of the system, particularly to suppressing the mid-band modulation effects caused by such errors.

The aspect of the invention which is the solution to the mid-band modulation problem is rather surprising in its simplicity. Advantage is taken of the fact that signals which cause problems are usually complex in nature, i.e., they occupy a relatively broad band of frequencies and are not at single discrete frequencies. More specifically, the inventive solution is to subject the complex signals processed by the compressor to an *abrupt* high (and/or low) frequency drop-off with a corner frequency well within the useful bandpass of the system, somewhat below (above) the frequency at which the transmission channel or record/plyback response has substantial errors. Signals processed by the expander are preferably subjected to a complementary boost so that an overall flat frequency response is maintained. If lack of overall flat frequency response is acceptable, this aspect of the invention may be incorporated only in the compressor portions of the compander system.

Thus, this aspect of the invention provides for a signal compressor for use with complex signals in a signal transmission system in which the compressed signal is applied to a transmission channel which in turn feeds an expander, wherein the relative signal amplitude response in the transmission channel between the compressor and expander is uncertain in the region of the high and/or low frequency extremes of the useful bandwidth of said complex signals applied to the compressor, the compressor having its compression controlled by control circuits which respond to the frequency and amplitude characteristics of the complex signals, the compressor having filter means for affecting the spectral balance of signals ("spectral skewing") in said compressor to substantially exclude said high and/or low frequency extreme region components of said complex signals from controlling the control circuits and to attenuate the high and/or low frequency extreme regions in the compressed signal. Thus, the compressor action is significantly less susceptible to the influence of complex signals beyond the abrupt roll-off frequency.

One preferred embodiment of this aspect of the invention is to locate a suitable filter (or network) in the signal path of the compressor input (and preferably a complementary filter in the signal path of the expander output). This approach is preferred because it requires the least amount of circuit components while performing both of the functions mentioned above and it also operates at all signal levels. However, an equivalent arrangement is to employ two filters: one in the control circuit path of the compressor and the other in the signal path of the compressor output. Similarly, in the expander, one filter is located in the control circuit path and the other in the signal path of the expander input. Further alternatives are possible in the case of a dual path compressor or expander (for example, as disclosed in U.S. Pat. No. 3,846,719 and U.S. Pat. No. Re. 28,426): a suitable filter may be located only in the input of the processor side path so as to affect both the signals passing therethrough and also the control circuit of the side path; or, the equivalent two filter arrangement may be employed where one filter is placed in the side path control circuit path and the other in the side path signal output path.

C. Description of the Prior Art—Aspect II

It is known in compander systems to provide a roll off at high frequencies in the compressor side of the system and to provide a complementary boost in the expander side of the system in order to reduce tape saturation, for example (U.S. Pat. Nos. 3,846,719, 4,072,914, *Rundfunktechn. Mitteilungen*, Jahrg. 22 (1978) H.2, pp. 63–74.) However, the roll off is gentle and is not sufficient to keep high level signals at high (low) frequencies in the uncertain response region of the system from affecting the compressor as is accomplished with the present invention.

It is known from the above disclosures to place antisaturation filters at various places in the signal path; before and after the compressor/expander and within the compressor/expander including at the same time in its control circuit. Thus, there are many possible locations of antisaturation filters in the compressor and expander signal paths that will serve the purpose of reducing the high frequency signals applied to the recording tape. In contrast, the circuitry according to the present invention must be more precisely located because it is intended to affect the compressor and consequently the expander by altering the frequency spectrum of signals that the compressor processes.

Although this aspect of the present invention is not directed to alleviating saturation effects it nevertheless will assist in avoiding tape saturation to some extent. However, because the corner frequency of the abrupt drop-off is ordinarily located at a frequency above (below) the region in which saturation begins to occur, tape saturation is preferably treated by other means as for example as described in connection with Aspect III of the present invention.

As with the known anti-saturation arrangements, this aspect of the present invention does result in a loss of noise reduction effect in the region in which the signals are abruptly attenuated as a function of frequency. However, the corner frequency of the abrupt drop off for the upper frequency end of the system is at a relatively high frequency in the region in which the human ear is much less sensitive to noise. With respect to use of the invention at the low frequency end of the system, the ear is also less sensitive and also there should be essentially no audible noise at such frequencies in properly engineered systems even with reduced noise reduction. This aspect of the invention contemplates spectral skewing only at the high and/or low frequency extremes because in practical systems those frequency regions are the only ones in which the transmission channel amplitude response has significant errors. A further reason is that an impairment of the noise reduction can be tolerated at these extremes due to the response of the human ear.

In another known system, a 12 dB/octave bandpass filter having corner frequencies of about 20 Hz and 10 kHz is employed in the control circuit of a wide band consumer audio tape compander type noise reduction system (sold under the trademark "dbx II"). However, this arrangement does not achieve the results of this aspect of the present invention because no filter is provided in the signal path and a high level high (low) frequency signal beyond 10 kHz (or below 20 Hz) is amplified in accordance with the level of whatever signals are present within the bandpass of the control circuit. Hence, such an arrangement provides excessive amplification of high level, high (low) frequency signals (outside the 20 Hz—10 kHz band) when high amplitude signals within the 20 Hz—10 kHz band are *not* present, resulting in overdriving the transmission channel.

It is also known in a video noise reduction system (U.S. Pat. No. 3,846,719) to provide a variable-Q notch filter responsive to chroma level, centered on the color television subcarrier frequency, in order to prevent the chroma signals from choking the compressor and expander and thus eliminating noise reduction at frequencies below the color subcarrier frequency. Thus, the filter center is within the bandwidth extremes of the signals in the system and within the predictable response of the system transmission channel and, moreover, is not for the purpose of overcoming record/playback response errors, which purpose underlies the present invention.

It is further known to provide 12 dB/octave low pass, bandpass and high pass filters in the side paths of dual path compressors and expanders (U.S. Pat. No. 3,846,719; *Journal of the Audio Engineering Society*, Vol. 15, No. 4, October, 1967, pp. 383–388.) However, these filters are for an entirely different purpose; namely, band splitting of the noise reduction action in separate side paths, and do not affect the upper or lower frequency extremes of the compressor input signals.

Likewise, the sharp cut off band limitation filters described earlier have corner frequencies purposely located outside the useful system bandwidth because they are not intended to affect the upper or lower frequency bandwidth extremes.

Heretofore, it has been considered undesirable to subtantially alter the frequency spectrum within the usable system bandwidth. For example, in professional recording it is considered unthinkable to locate the corner frequency of any upper band-limitation filter below 20 kHz. Similarly, in FM broadcasting, a 15 kHz upper bandpass limit is rigorously maintained throughout all the audio signal stages.

Although this aspect of the present invention is not limited to use with any particular type of noise reduction companding system and it will improve the operation of all types of companders, including wide band companders, it is particularly useful for use with sliding band noise reduction systems. An example of such a system is to be found in U.S. Pat. No. Re. 28,426. In such known sliding band circuits, high frequency audio compression or expansion is achieved by applying high frequency boost (for compression) or cut (for expansion) by way of a high pass filter with a varible lower corner frequency. As the signal level in the high frequency band increases, the filter corner frequency slides upwardly so as to narrow the boosted or cut band and exclude the useful signal from the boost or cut.

In sliding band devices one effect of uncertainties in record/playback response is the resulting modulation of low level medium frequency signals when high frequency signals in the region of record/playback uncertainties are present at the compressor input. In dual path sliding band devices of the type such as described in U.S. Pat. No. Re. 28,426, this effect can be suppressed by providing the abrupt high frequency drop-off at the input to the side path of the device. While such a configuration provides the abrupt drop-off only at medium and low signal levels, it is adequate to substantially satisfy the objects of the invention in dual path devices of both the sliding band type (U.S. Pat. No. Re. 28,426) and the fixed band type (U.S. Pat. No. 3,846,719).

D. Brief Description of the Drawings—Aspect II

This aspect of the invention will be described in more detail, by way of example, with reference to the accompanying drawings, in which:

FIGS. 22–25 are block diagrams showing alternative placements of the spectral skewing network(s) according to this aspect of the invention.

Figure 26:
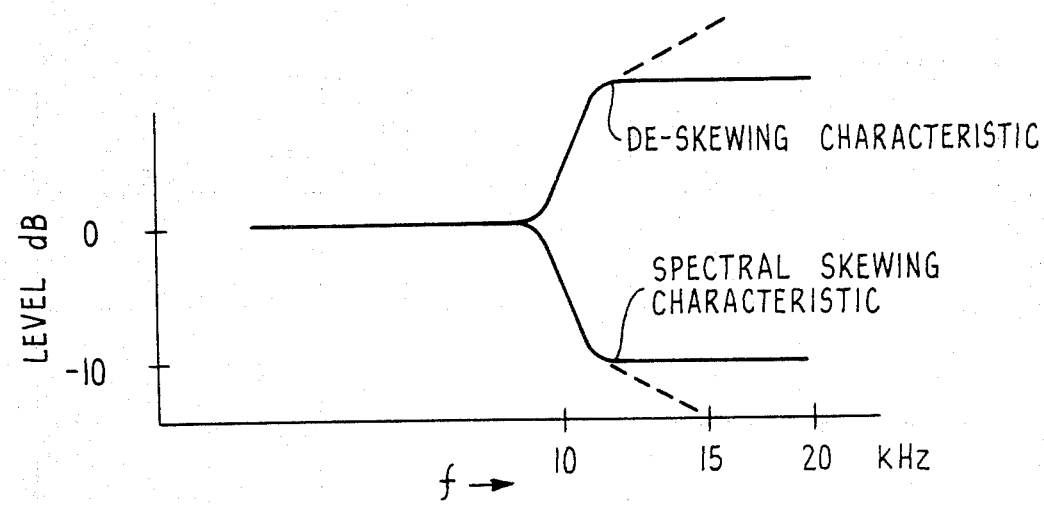

FIG. 26 is a response curve showing generally the characteristics of a high frequency spectral skewing network and complementary de-skewing network for use in a cassette tape recorder/reproducer.

Figure 27:
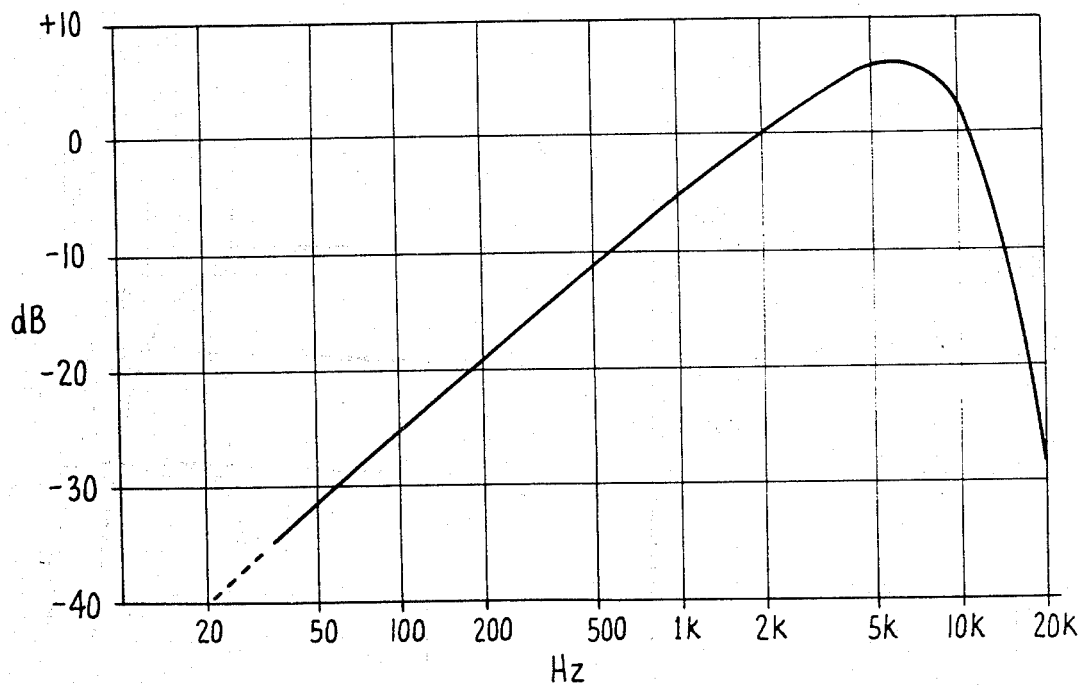

FIG. 27 is the standard CCIR noise weighting characteristic curve.

Figure 28:
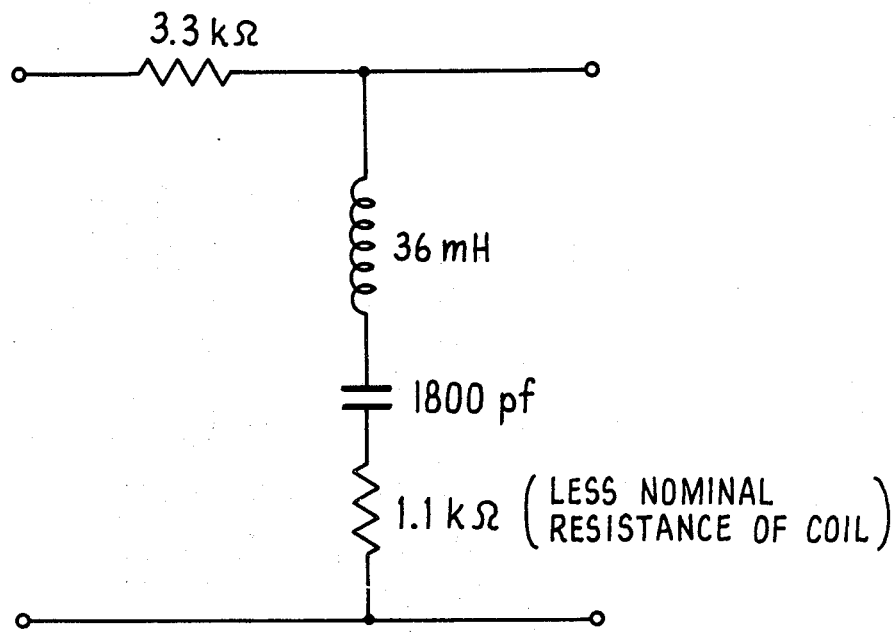

FIG. 28 is a schematic diagram of a suitable spectral skewing network.

FIGS. 29–32 are representative response curves of typical cassette tape recorders/reproducers.

FIGS. 33–38 are representative curves useful in understanding this aspect of the invention.

Referring now to FIGS. 22–25, generalized block diagrams are shown to illustrate the various locations where spectral skewing networks according to this aspect of the invention can be located.

Figure 22:
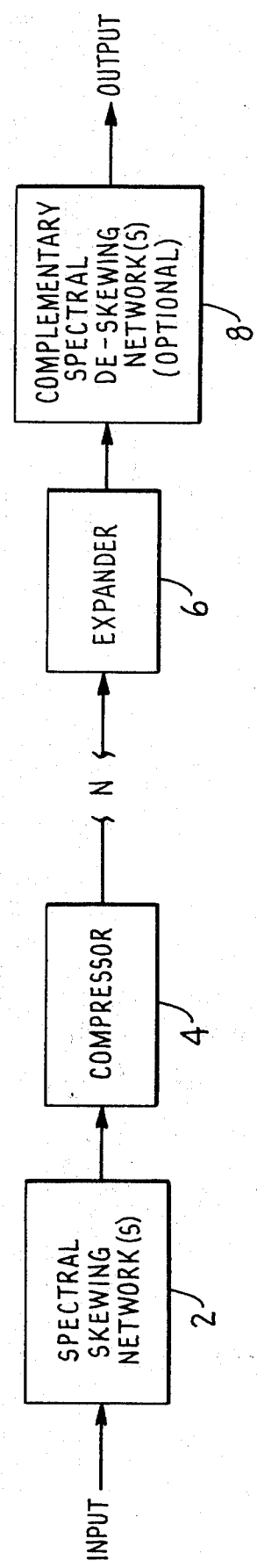

In FIG. 22, which shows the simplest and preferred embodiment, the spectral skewing network (having a low or high frequency section) or networks (having both low and high frequency sections) 2 is (are) located in the input signal path to a compressor 4, the output of which is applied to a transmission channel N. On the reproduce side of the channel N, a complementary expander 6 acts on the reproduced signal and applies it to an optional spectral de-skewing network(s) 8 that has (have) a characteristic(s) complementary to the network(s) in the compressor input path. This location of the network is particularly advantageous where the compressor and expander each include two or more series devices such as above in connection with Aspect I of the invention. Note that the mid-frequency modulation effect is eliminated whether or not a de-skewing network is employed in the expander.

Figure 23:
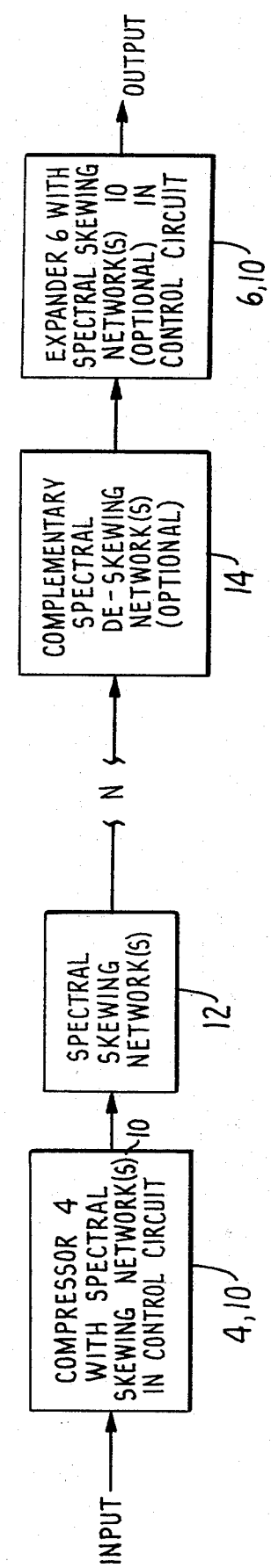

FIG. 23 illustrates an equivalent configuration, which in practice is not preferred because it is more complex, requires additional circuitry and is more expensive. In this equivalent configuration a spectral skewing network(s) 10 is placed in the compressor control circuit and a further spectral skewing network(s) 12 in the compressor signal output path. If the optional de-skewing is employed in the reproduce side, a complementary de-skewing network(s) 14 is employed in the expander signal input path and a spectral skewing network(s) 10, that has the same characteristics as the network(s) 10 in the compressor control circuit, is placed in the expander 6 control circuit. Where compressor 4 and expander 6 each include series devices, such as described above in connection with Aspect I of the invention, a spectral skewing network(s) 10 is required only in the control circuit of the first compressor device and a network(s) 12 is located only in the output path of the first compressor series device, and (optionally) a network(s) 14 only in the input path of the last expander series device with a network(s) 16 only in its control circuit.

Figure 24:
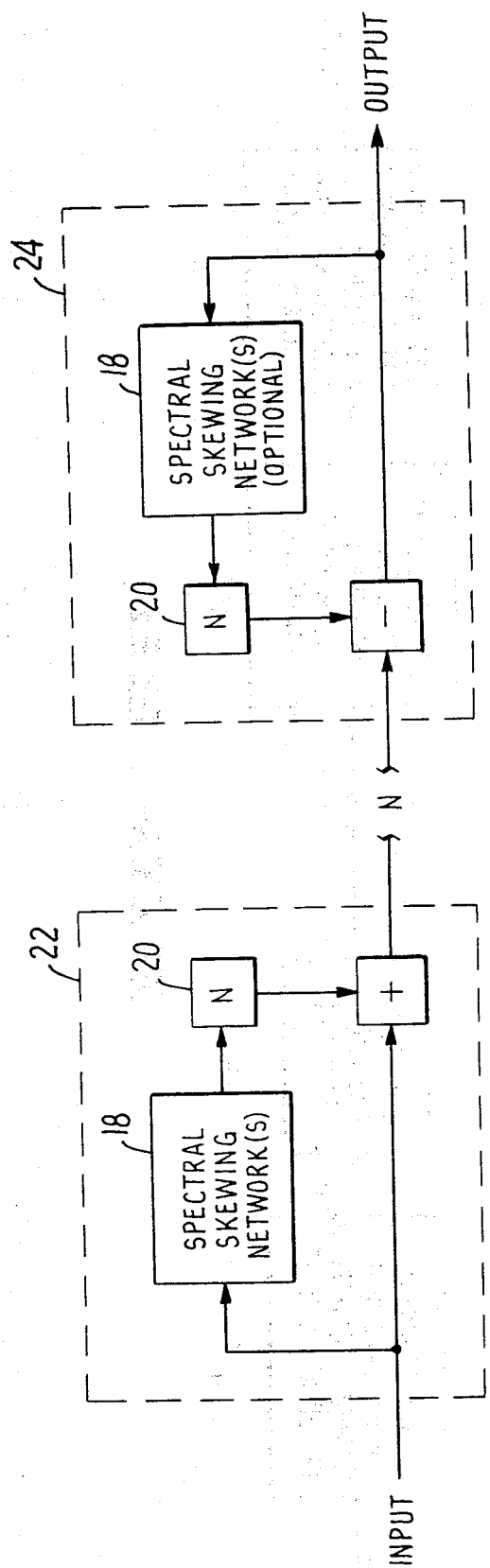
Figure 25:
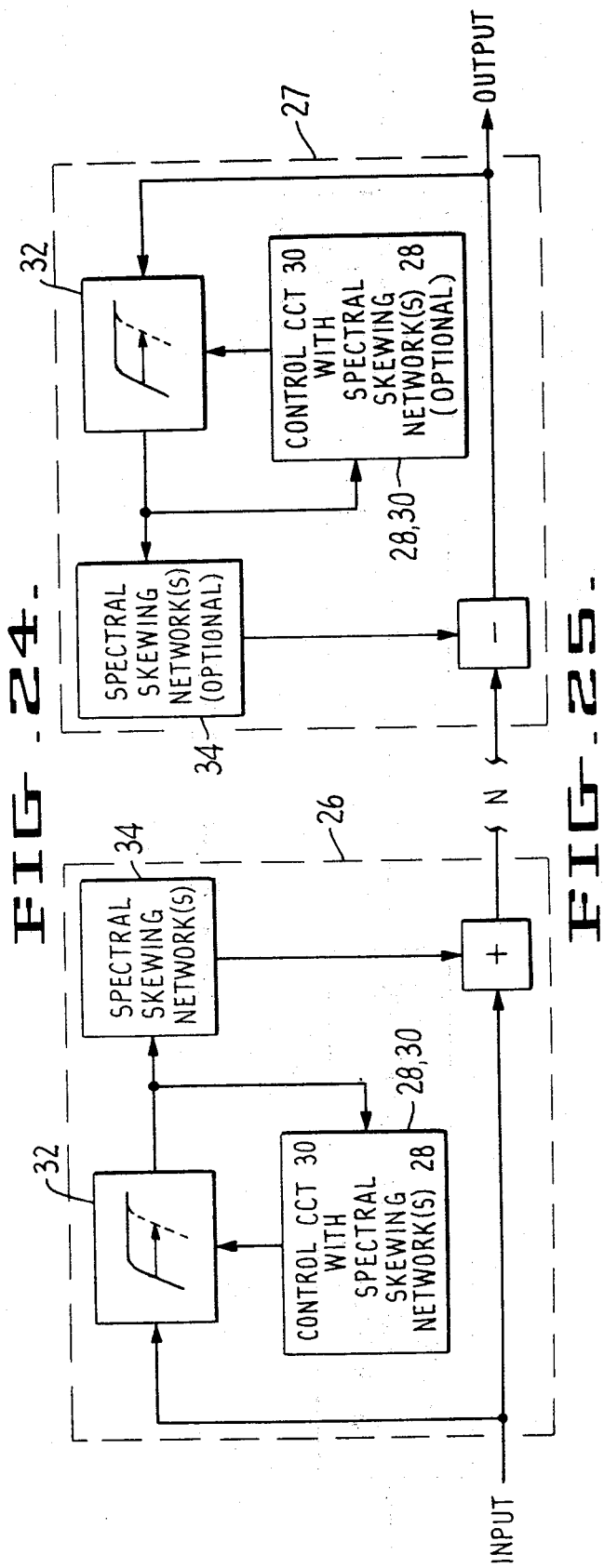

FIGS. 24 and 25 illustrate placement of the spectral skewing networks in the side paths of dual path compressors and expanders. Such compressor and expander configurations are well known in themselves and will therefore not be described in great detail. However, there are two main forms for the further path N (20). One alternative (FIGS. 7 and 8 of U.S. Pat. No. 3,846,719) is a filter followed by a controlled limiter which is caused to limit progressively, as the signal level rises, by a rectified and smoothed control signal. Another alternative (U.S. Pat. No. Re. 28,426) is a sliding band high pass filter whose pass band is progressively narrowed by the control signal so as to exclude large signal components from the output of the filter. Advantageous corner frequency values for the variable filters are about 375 Hz in the quiescent state but become progressively narrower high pass in response to the control signal. Dual path compressors and expanders (singly or in series) can also be employed in the configurations of FIGS. 22 and 23.

In FIG. 24 the spectral skewing network(s) 18 is (are) placed in the input signal path of the noise reduction side path circuitry 20 of the compressor 22 and (optionally) the expander 24. In FIG. 25, an equivalent configuration is shown in connection with a sliding band type compressor 26 and expander 28. In this equivalent configuration, a spectral skewing network(s) 28 is placed in the side path control circuit 30 which controls a frequency variable shelf or sliding band filter circuit 32. A further spectral skewing network 34 is placed in the side path output. Optionally, the same networks are located in the expander side path. The configurations of FIGS. 22 and 23 are usually preferred to those of FIGS. 24 and 25 because the former act at all signal levels and hence also reduce channel overload or tape saturation effects at the band extreme(s).

Although in FIGS. 24 and 25 only a single side path is shown, several side paths may be employed such as in, for example, U.S. Pat. No. 3,846,719. Further, the side paths may be configured such that the compressor side path has a feedback configuration and the expander side path a feedforward configuration, as, for example, in U.S. Pat. No. 3,903,485. Where series dual path devices are employed in a compressor and expander, such as the type described in connection with Aspect I of the invention, it is sufficient to employ a spectral skewing network(s) in the first series device in the compressor and (optionally) in the last series device in the expander, although the configuration of FIG. 22 herein is preferred.

The spectral skewing characteristic has preferably:

(a) A drop-off corner frequency within the region in which the transmission channel or tape recorder response, including that of the expander band-pass filter, is reasonably dependable—that is, somewhat below (above) the frequency at which the transmission channel or tape recorder response is uncertain or begins to roll off.

(b) An abrupt drop-off, to provide a well defined limit for the frequencies controlling the circuit.

(c) A well defined shape following the drop-off, so as to permit the easy creation of the reciprocal characteristic during reproduction or playback to retain an overall flat frequency response (if desired).

(d) A shape which takes optimal advantage of the low level noise sensitivity characteristic of human hearing—that is, frequency response drop-off as steep and as deep as possible without introducing a noticeable increase in noise level when employing the reciprocal characteristic during playback.

While the spectral skewing characteristic effectively reduces the noise reduction action above (below) the sharp corner frequency, if the frequency is above about 8 kHz (or below about 50 Hz), the increased noise will not be audible in view of the human ear's response to low-level high and low frequency noise, especially if the noise level is extremely low as it is when this aspect of the present invention is used in a tape recording compander.

The validity of this treatment has been determined experimentally in listening tests but can also be found in the shape of the CCIR noise weighting curve, shown in FIG. 27. The curve follows the low-level noise sensitivity of the human ear. Note that the sensitivity is low at low frequencies, and also falls off very rapidly above a peak at about 6–7 kHz. Thus, there is a reduced psychoacoustic need for maintaining substantial noise reduction at frequencies above 8–10 kHz. This is the high frequency counterpart of the observed ability of noise reduction systems to provide a subjectively large amount of noise reduction even though the low frequencies may be treated little if at all. Good engineering can eliminate hum, which in cassette tape recording is the only low frequency noise which is subjectively troublesome.

In professional noise reduction systems, in which low frequency noise reduction is provided as an insurance against unexpected hum problems, there is usually little need for any noise reduction below the lowest hum component likely to be encountered (i.e., 50 Hz).

Especially at the high frequency end of the spectrum, the use of a spectral skewing network does not obviate or replace an overall band limitation filter, sometimes popularly known as a "multiplex filter" ("MPX"). The reasons have been given previously. As discussed, a band limitation filter, usually used in both recording and playback, has several functions only peripherally related to those in these discussions. Therefore, even in the case of an ideal signal channel, it is desirable to have in encoding and decoding both:

(1) bandwidth limitation filters; and
(2) spectral skewing and de-skewing networks.

The spectral skewing network(s) (2, 10, 12, 18, 28, 34) provide an abrupt shelf, dip or drop-off as shown in FIG. 26. The dashed lines are intended to show that the ultimate high frequency (low frequency response) need not be precisely as shown in the solid lines.

One suitable form of the spectral skewing network(s) (2, 10, 12, 18, 28, 34), is a sharp low-pass (high-pass) filter, with an 18 dB/octave slope, and having a corner frequency within the rapidly declining portion of the CCIR noise weighting curve (FIG. 27) and below (above) the upper cut off frequency of the transmission channel. A corner or cutoff frequency of about 8–10 kHz (50 Hz at the low frequency end) would be suitable for a high quality tape deck having a useful but uncertain response out to some 15 kHz (or 30–60 Hz at the low frequency end).

The network could also take the form of a shelf network with about a 10 dB floor such as shown in the solid lines of FIG. 26.

Another suitable form of the network is a notch filter with a center frequency of about 16 kHz (20 Hz), a Q such that a corner frequency of about 8–10 kHz (40 Hz) is obtained, and a depth of some 10 dB. A double tuned (stagger tuned) notch filter can also be used, especially in professional applications, in order to provide a wider overall notch, the second notch being placed some fraction of an octave above the first notch (say $\frac{1}{3}$ octave).

In a practical embodiment of this aspect of the invention, a spectral skewing network 2 (FIG. 22) is configured as a notch filter employing a network having the transfer function:

$$\frac{1 + jWT_1 - W^2 T_3^2}{1 + jWT_2 - W^2 T_3^2}$$

where $T_1 = 2$ microseconds and $T_2$ and $T_3$ are both 8 microseconds.

This provides the following characteristic:

| Freqeuncy in kHz | Attenuation in dB |
|---|---|
| 7 | 0.6 |
| 10 | 1.5 |
| 12 | 2.5 |
| 15 | 5.2 |
| 18 | 9.9 |
| 20 | 12.0 |

Physically, such a network can be realized in the form shown in FIG. 28. Approximate values are shown for the network components. The nominal value of the 3.3 K resistor depends on the output impedance of the amplifier feeding it. The complementary de-skewing network 8 (FIG. 22) has the reciprocal characteristic.

A depth of some 10–15 dB has been proven experimentally to eliminate the mid-band modulation effect in the most difficult cases. However, a depth of as little as 6 dB has been found to make a substantial improvement in the mid-band modulation effect, particularly when the drop-off is very abrupt such as 18 dB per octave.

For flat overall response, the same network and/or complementary networks 8, 10, 14, 18, 28, and 34 are employed in the reproduce or playback portion of the system.

Figure 29:
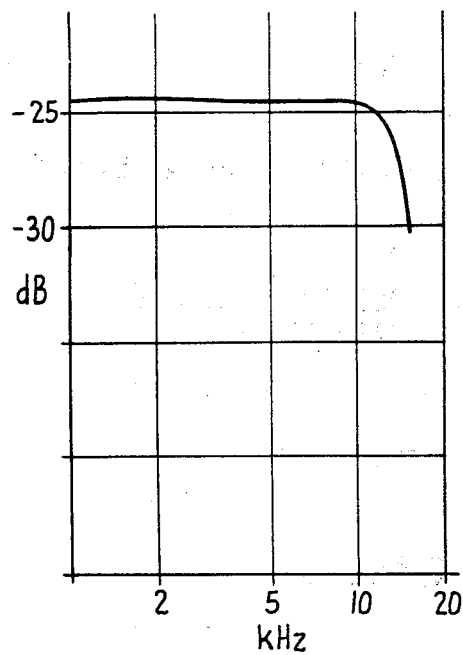
Figure 30:
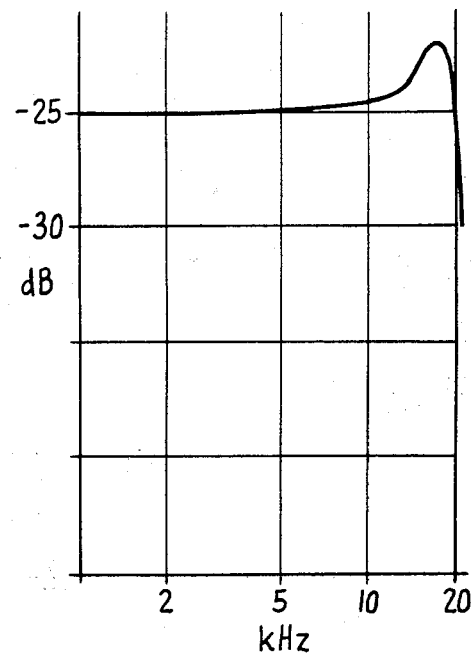
Figure 31:
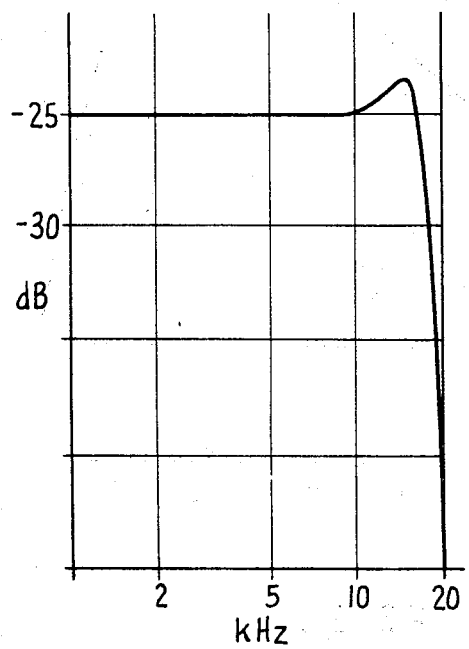
Figure 32:
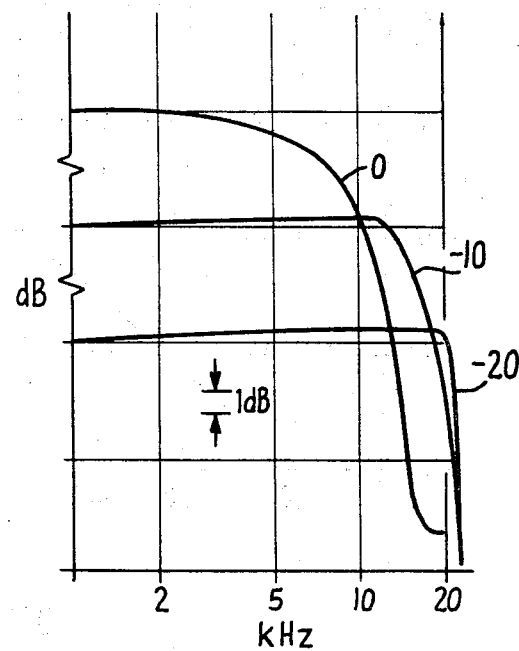
Figure 33:
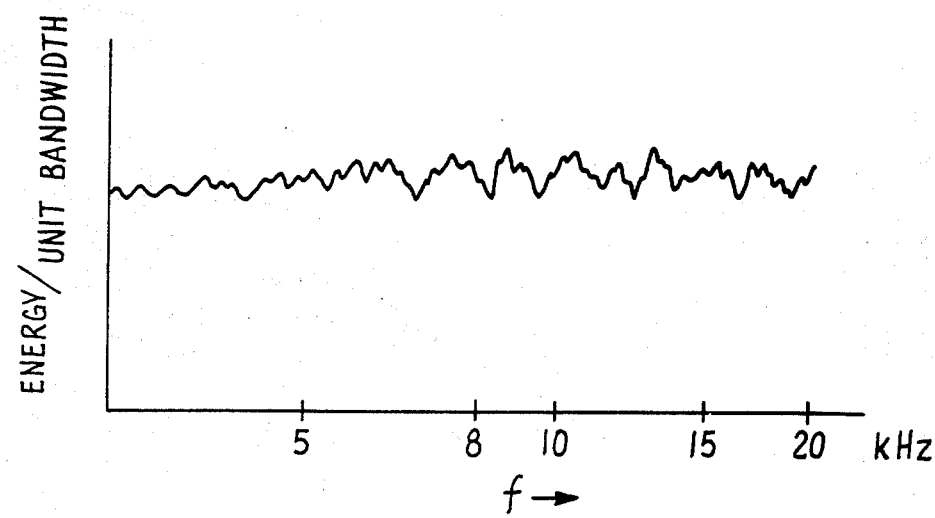

Referring particularly to the characteristics of consumer compact cassette audio tape recorder and playback devices, in order to appreciate the invention more fully, reference is made to FIGS. 29–31 which show representative measured high frequency response curves at input levels low enough to avoid tape saturation for several typical compact cassette recorders. FIG. 32 shows representative high frequency response curves at several input levels for another typical compact cassette recorder. Note that in FIG. 29, the recorder response falls off rapidly beyond 10 kHz. In FIG. 30, there is a rise in response starting about 10 kHz with a pronounced peak at about 17 kHz. The response in FIG. 31 has a high frequency peak at 15 kHz with a rapid fall off or response beyond that frequency. The response in FIG. 32 for a level of −20 dB, which avoids saturation, is nearly ideal, being substantially flat out to 20 kHz. Such a good response is, however, rare.

Thus, the selection of a high frequency spectral skewing network corner frequency of about 10 kHz is a good choice for such devices because the response curves in FIGS. 29–32 show that for levels below saturation, the typical recorder in good adjustment has little deficiency in response below 10 kHz. Hence, the spectral skewing network will ensure, at most levels, that there will be essentially no level discrepancy in the playback control signal caused by uncertainties in response at extremely high frequencies. A corner frequency of about 10 kHz is a good choice for such devices because, in addition, that frequency is on the steeply declining portion of the CCIR noise weighting curve (FIG. 27) and thus some loss of noise reduction can be tolerated by the human ear.

In selecting a suitable corner frequency for a spectral skewing network, the designer can select approximate frequencies different from 10 kHz based on the parameters of his system. For example, in the case of a higher quality transmission channel, a higher corner frequency may be acceptable. With respect to Compact Cassette devices of the type whose characteristics are shown in FIGS. 29–32, acceptable high frequency corner frequency can range from about 8 kHz to perhaps 11 or 12 kHz. Also, while a filter of about 18 dB/octave is desirable to assure that high level high (low) frequency signals do not control the compressor, a drop-off as little as 12 dB/octave will substantially meet the objectives of this aspect of the invention for most signals. Attenuations much sharper than 18 dB/octave present difficulties in providing complementary de-skewing and are more costly.

Figure 34:
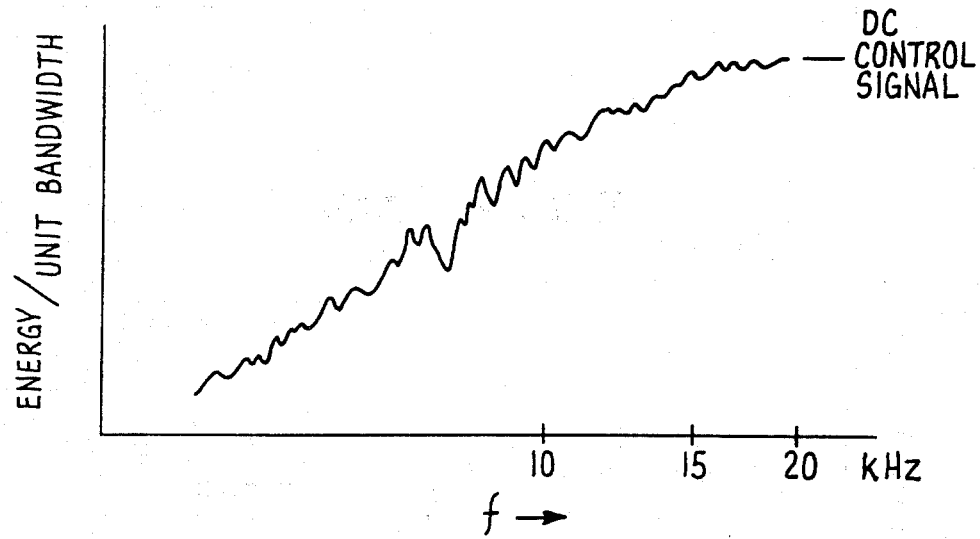

The required filter drop off rate depends in part on the sensitivity of the compressor to signals beyond the filter cut off frequency. Consider, for example, the dual path sliding band compressor as disclosed in U.S. Pat. No. Re. 28,426. In that device, high frequency pre-emphasis is used in the compressor control circuit such that if a signal such as shown in FIG. 30 is applied to the compressor (such a signal might be generated by a wideband percussive sound), the control circuit pre-emphasis causes the signal to have an energy spectrum as shown in FIG. 34. The pre-emphasized signal spectrum has a peak. After rectification, this peak provides the DC control signal which controls the compressor's sliding band action.

Figure 35:
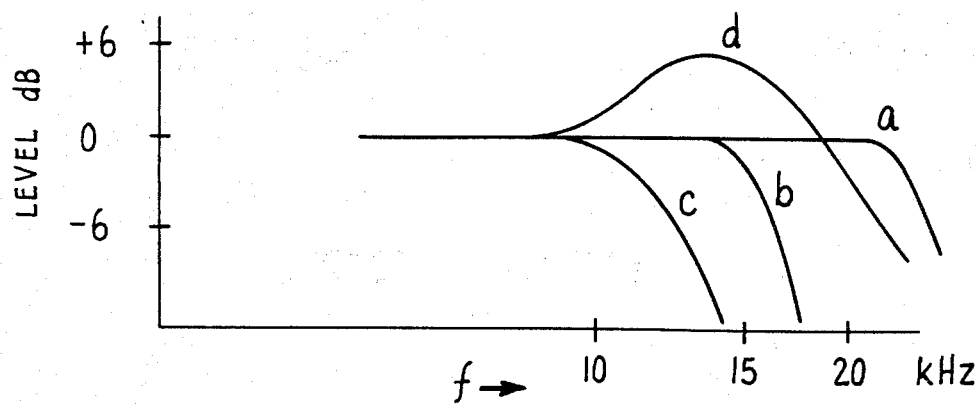
Figure 36:
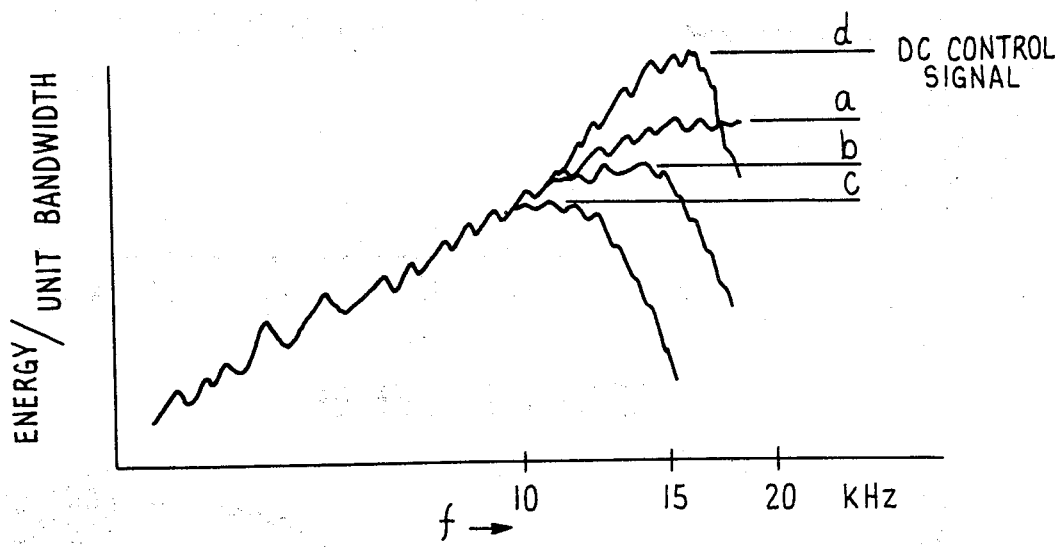

FIG. 35 illustrates the uncertain frequency responses of the tape recorder channel, shown for four representative Compact Cassette tape recorders a, b, c and d. The effect on the spectrum of FIG. 34 is to cause four different spectra to be present in the control circuit of the expander (decoder), resulting in four different DC control signals as shown in FIG. 36. Clearly, errors in decoding will result.

Figure 37:
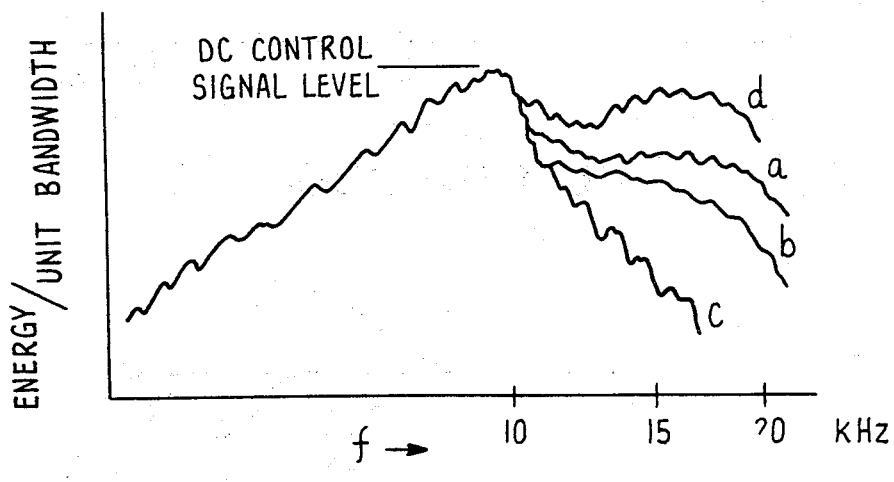

In such a case, a desirable spectral skewing network characteristic causes the expander (decoder) to generate the same DC control signal in each case such as shown in FIG. 37. A network characteristic having a corner frequency at about 10 kHz, such as shown in FIG. 26 is suitable. Note that the network does not eliminate the sliding of the frequency band; indeed, it may be only slightly reduced. However, the sliding (or compression as in the band splitting system of U.S. Pat. No. 3,846,719) now becomes recoverable during playback.

It should be appreciated that the primary object of this aspect of the invention can be seen in FIG. 37—namely, to assure the same peak in the spectrum of the AC control signal is present at the rectification point in both the compressor and the expander.

With respect to sliding band systems of the type just mentioned, the spectral skewing network is particularly useful in suppressing mid-frequency modulation caused by the presence of high level, high frequency signals in the compressor that are not recovered and applied to the expander. This modulation effect, which occurs very rarely in actual music sources, relates to the basic operation of the sliding band device with imperfect signal channels: a predominant signal effectively controls the sliding band frequency characteristic and may cause audible effects when the signal is at a high frequency which is not recovered in playback. When that predominating signal is at a high frequency, significantly above the frequency of a low level mid-frequency signal, the mid-frequency modulation effect is audible if the high frequency signal is intermittent such as with percussive sounds, brushed cymbals, for example, and is not reproduced at the same level by the tape recorder. In that case the mid-frequency signals are modulated in amplitude, even after decoding, because the high frequency signal causes the sliding band frequency response to vary without complementary expansion in the playback decoder. It should be noted that this effect is basically not a tape saturation effect; it might be caused by inaccurate biasing and equalization or by gap loss, poor azimuth and the like. However, it is clear that the effect will be worse if there is also saturation in the controlling frequency region.

Figure 38:
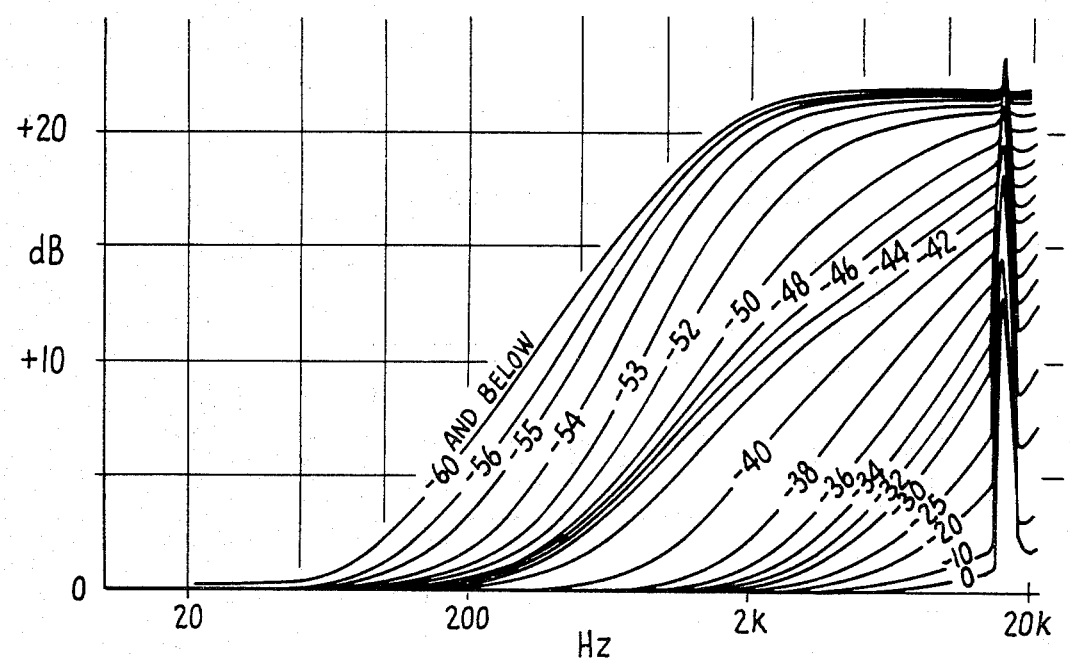

This problem of low-level, mid-frequency modulation effects may be better understood by reference to FIG. 38, which shows the results when a series of probe tone curves using a 15 kHz signal at levels from 0 to −60 dB and below and a sweeping low-level probe tone at −65 dB are recorded and played back on a sliding band system.

Note that when a dominant 15 kHz signal increases in amplitude from −60 dB to, e.g., −50 dB, the gain of the compressor at 15 kHz changes by about 2 dB. This 2 dB change must be accurately preserved in the recording process because of the dependence of the mid-frequency dynamics on this dominant signal (a change of some 10 dB is produced in the region of 1 kHz). Thus, any error in playback in the controlling frequency region is transferred to the mid-frequency region and the error may be magnified.

If a noise reduction system treats low frequencies, then there will be a corresponding effect at low frequencies. Extremely low frequency rumble in the input signal to the compressor may actuate the compressor circuitry. If the recorder does not reproduce the rumble components, then signal modulation effects at the expander output will be evident.

III CIRCUIT ARRANGEMENTS FOR REDUCING MEDIA OVERLOAD EFFECTS IN SIGNAL RECORDING AND TRANSMISSION SYSTEMS

A. Background of the Invention—Aspect III

This aspect of the present invention is concerned in general with recording and transmission systems and with circuit arrangements which alter the dynamic range of signals handled by such systems, namely, compressors which compress the dynamic range and expanders which expand the dynamic range. The invention is particularly useful for treating audio signals but is also applicable to other signals, including video signals.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, particularly audio recording and play back products, a single device is often configured for switchable mode operation as a compressor to record signals and as an expander to play back compressed broadcast or pre-recorded signals.

More specifically, this aspect of the present invention relates to compressors and expanders which, in addition to providing compression or expansion, also effect level dependent equalization. In magnetic recording, the need for such equalization arises because of the tendency of magnetic tape to saturate, particularly at high frequencies.

B. Description of the Prior Art—Aspect III

Various proposals have been made for achieving equalization, several being discussed in *Rundfunktechn. Mitteilungen,* Jahrg. 22 (1978) H. 2, pp. 63–74. A need for equalization can also arise with other recording or transmission media which are susceptible to high level saturation or overload effect at certain frequencies.

One possibility (but which fails to provide level dependent equalization) is to provide a high-frequency roll-off circuit after the compressor and a compensating boost circuit before the expander. An alternative is to put the roll-off circuit before the compressor and the boost circuit after the expander. A disadvantage of any such technique is that signals at all levels are subject to the same roll-off action (and subsequent boost) so that there is a significant decrease in the amount of noise reduction which is obtained. it is suggested in the *Rundfunktechn. Mitteilungen* article that the loss of noise reduction can be tolerated if the amount of noise reduction without such techniques is as high as 20 dB. This is only partially true. In practice, particularly with respect to some Compact Cassette tapes, tape saturation effects extend down as low as 2 kHz and the change in equalization required to take account of this will lead to a significant increase in audible noise.

Attempts have been made to overcome this problem by making the response of the roll-off and boost circuits level-dependent (U.S. Pat. No. 4,072,914). In the case of the roll-off circuit the roll-off is steeper at high levels than at low levels. For the boost circuit, the boost characteristic is likewise steeper at high levels than at low levels. A disadvantage of this approach is the consequential increase in circuit complexity.

In the *Rundfunktechn. Mitteilungen* article there is also a proposal to put a high-frequency boost circuit in front of the control circuit of both the compressor and the expander, but it is also there pointed out that the resulting roll-off is only noticeable in the medium level signal range, whereas it is desired to obtain the effect principally at high levels.

In video recording systems high frequency saturation problems may be caused by the recording pre-emphasis used. A similar problem exists in FM broadcasting.

Although not discussed in the prior art, there is a related problem in that low frequency equalization (roll-off in the compressor and boost in the expander) is desirable if the compression and expansion are effective at low frequencies also. Low frequency compression and expansion are useful for hum noise reduction and may be achieved using wide band compressors and expanders or compressors and expanders with circuits operating independently at low and high frequencies. At low frequencies, the primary objective of equalization is to counteract the effect of the 3180 microsecond (+3 dB at 50 Hz) recording boost built into many magnetic tape recorders, which causes low frequency tape saturation problems, e.g., with organ music.

C. Summary of the Invention—Aspect III

It is therefore one object of this aspect of the invention to provide a better solution to the problems discussed above, namely a solution which is both effective and simple.

Another object of this aspect of the invention is to provide a means whereby the required equalization can be effected additionally at low frequencies, if required.

A further object of this aspect of the invention is to increase the headroom and accordingly, the dynamic range of recording media subject to saturation.

The starting point of this aspect of the invention is a compressor or expander comprising a main signal path which is linear with respect to dynamic range, a combining circuit in the main path, and a further path which has its input derived from, connected or coupled to the input or output of the main path and its output derived from, connected or coupled to the combining circuit, the further path providing a signal which, at least in an upper part of the frequency band, boosts or bucks the main path signal by way of the combining circuit, but which is so limited that, in the upper part of the input dynamic range, the further path signal is smaller than the main path signal.

The upper part of the frequency band typically extends up from a value of some hundreds of Hertz, say a value of 300-400 Hz, although a higher value may be used. In the upper part of the input dynamic range, say −10 dB to +10 dB, relative to a reference level, the further path signal is small relative to the main path signal. In some instances the further path signal may be an order of magnitude smaller than the main path signal or even smaller.

Such compressors and expanders are well known and widely used, examples being described in U.S. Pat. Nos. 3,846,719, 3,903,485 and U.S. Pat. No. Re. 28,426. They are designated dual path compressors and expanders. The further path signal boosts the main path signal in the compressor but bucks the main path signal in the expander. A Type I configuration (for example as in U.S. Pat. No. 3,846,719) is generally used for audio applications and a Type II configuration (for example as in U.S. Pat. No. 3,903,485) is generally used for video applications.

In the case of the compressor the invention is characterized by a frequency dependent circuit connected only in the main path and providing a reduction in frequency response in the part of the frequency band affected by saturation.

In the case of the expander the invention is characterized by a frequency dependent circuit connected only in the main path and providing an increase in frequency response in the part of the frequency band affected by saturation.

The frequency dependent circuit in the main path is connected between the further path take off point and the combining circuit, in both compressors and expanders, both Type I and Type II.

The invention also provides a complete noise reduction system as set forth in the claims.

The said part of the frequency band affected by saturation is usually the upper extreme—that is, said upper extreme is whatever upper frequency is regarded as the top end of the audio frequency band in any given practical case, whether this is 15 kHz or 20 kHz or some other value, in the case of audio, or such as 4-6 MHz in the case of video.

In an audio development of this aspect of the invention, where the compressor or expander also acts at low frequencies, the frequency dependent circuit also provides a reduction (compressor) or increase (expander) in frequency response in the lower part of the audio frequency band (e.g., extending downward from about one hundred Hertz towards its lower extreme, which extreme is typically in the region of 20 Hz).

This aspect of the invention will be described in more detail, by way of example, with reference to the accompanying drawings, in which:

D. Brief Description of the Drawing Relating to Aspect III

Figure 39:
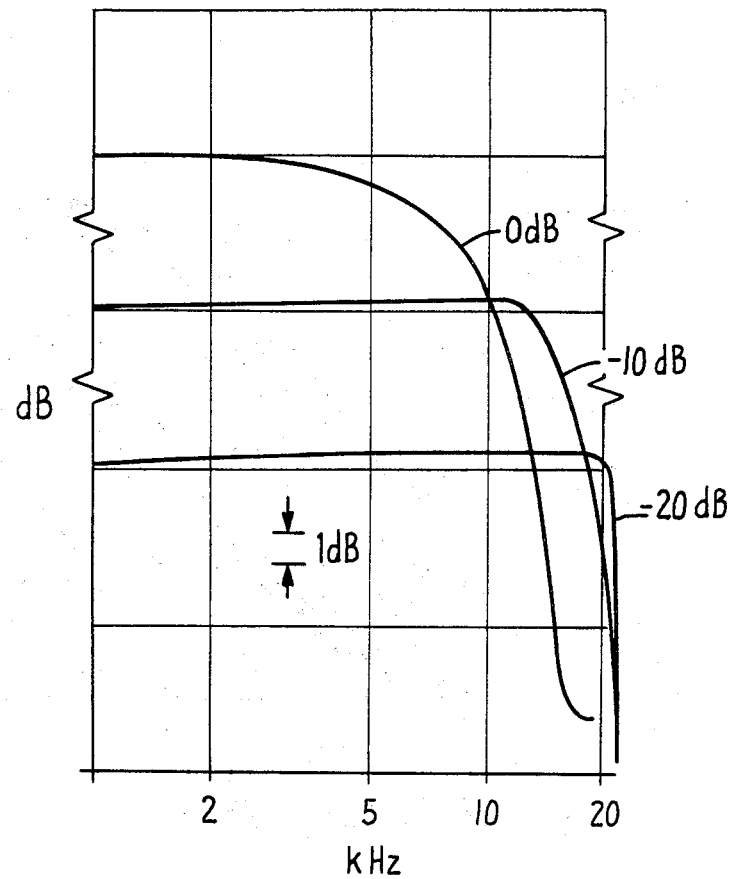

FIG. 39 shows a representative response curve of a cassette tape recorder/reproducer.

Figure 40:
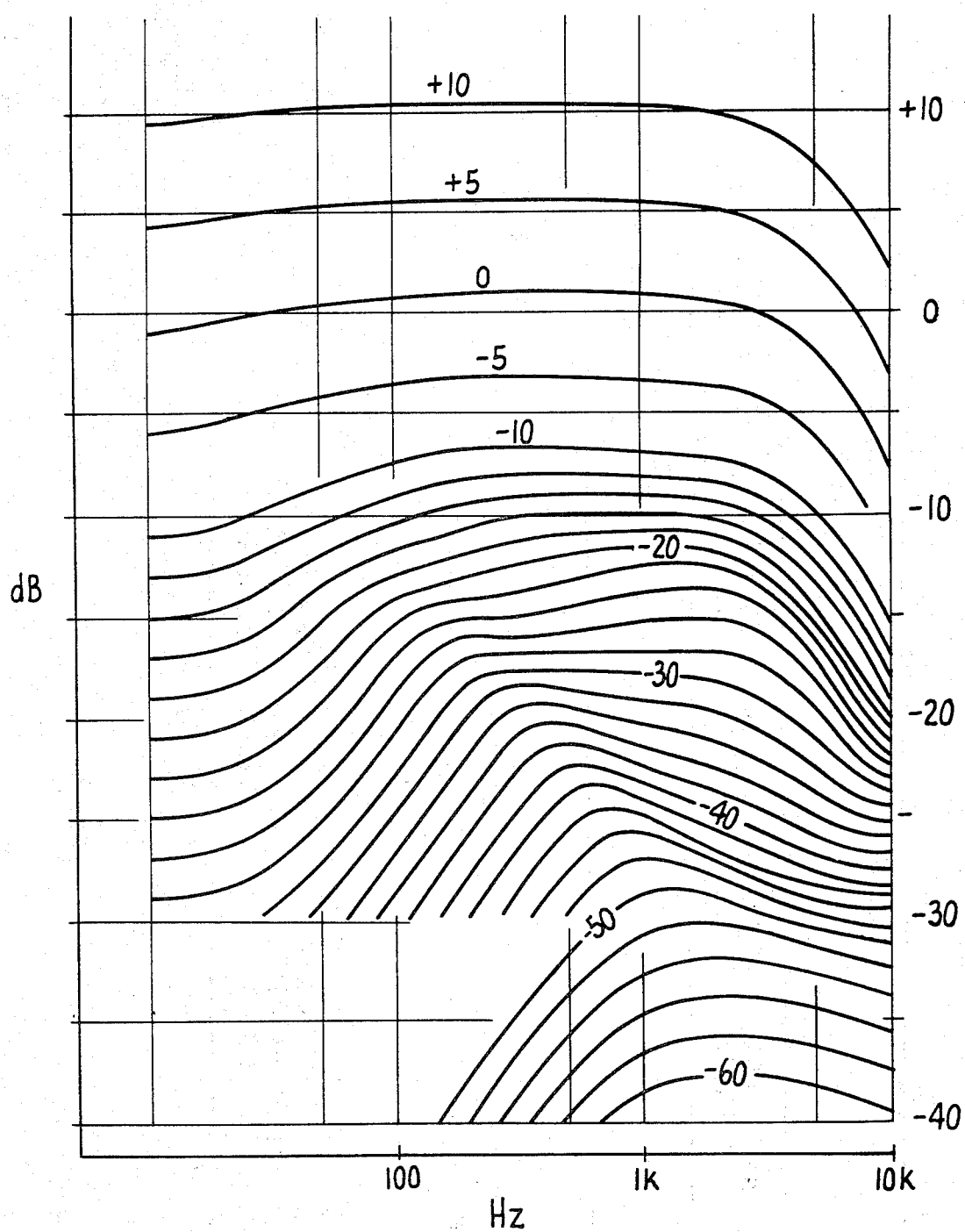

FIG. 40 shows an explanatory characteristic curve.

Figure 41:
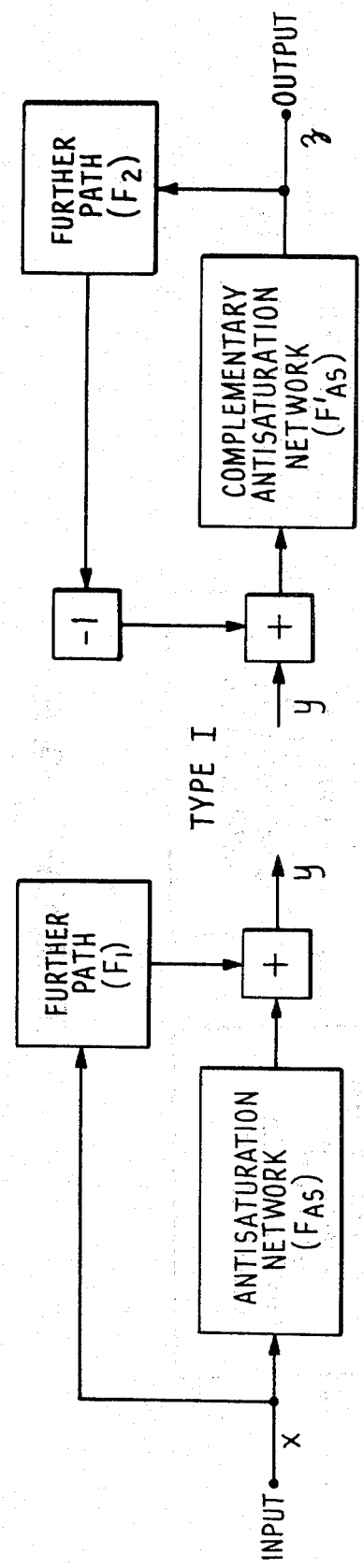

FIG. 41 is a block diagram of an embodiment of this aspect of the invention in the context of Type I compressors and expanders.

Figure 42:
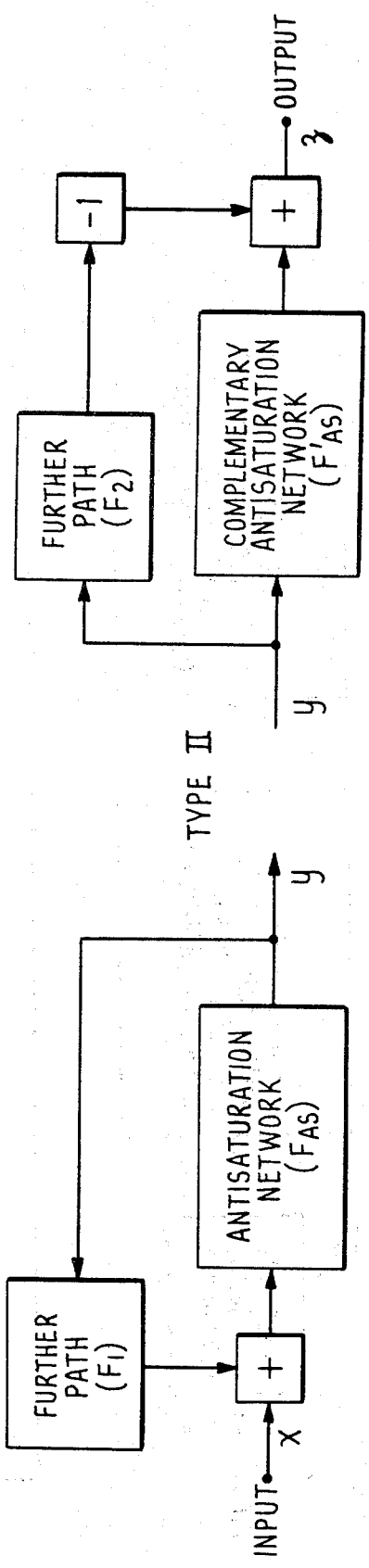

FIG. 42 is a block diagram of this aspect of the invention in the context of Type II compressors and expanders.

FIG. 43 is a block diagram of an embodiment of this aspect of the invention in the context of a dual stage compander system for magnetic tape recording.

FIG. 44 is a schematic diagram of a suitable antisaturation network.

E. Description of the Preferred Embodiments of Aspect III

The problem of high frequency saturation is common to all magnetic tape and optical film recorders. It may also occur in pre-emphasized recording and transmission systems of many kinds, including FM broadcasting systems. Although it is most severe in low speed tape recorders, particularly those using low cost tape formulations, it affects the ability to record at higher levels even in high quality professional magnetic tape and optical film recorders. That is, the recording medium does not accurately record the high level, high frequency signals applied to it. The main audible effect is intermodulation distortion and a reduction in high frequency content of the recording. However, in the context of the present invention, such saturation is especially undesirable because with certain combinations of signal levels and frequencies it upsets the playback complementarity of the expander. Hence, the expander will inaccurately decode the played back signal to some extent depending on the degree of saturation. The main audible effect is usually an exaggeration of the high frequency loss by the expander but it may also include a spurious modulation of mid-frequency signals.

The illustrated embodiment is considered primarily in the context of a cassette tape recorder/reproducer although the invention is applicable as well to professional quality magnetic tape, optical film recording and recording and transmission systems in general.

FIG. 39 shows the response of a well above average Compact Cassette recorder/reproducer. At a recording level of −20 dB the response is substantially flat out to 20 kHz. At higher recording levels the effects of high frequency tape saturation become apparent, causing a substantial high frequency roll off at a record level of 0 dB. Typical cassette units exhibit substantially greater saturation effects.

The most straightforward way of reducing the above saturation effect is to change the recording equalization in such a way that the tape is not driven so hard in the frequency range in which saturation is troublesome. The playback equalization is then altered in a complementary way. Unfortunately, in cassette recording, saturation effects may extend down to frequencies as low as 2 kHz or more as FIG. 39 suggests. The required change in equalization would thus result in a significant increase in audible noise.

The circuit described below effectively permits a treatment to reduce high frequency saturation without sacrificing any significant noise reduction in the treated frequency range. The same technique may be used to reduce low frequency tape distortion where a full-range noise reduction system is employed. In particular, note that in a dual path compressor or expander circuit the output of the circuit at very low signal levels is provided mostly by the further path or noise reduction path. In the case of one such device providing 10 dB of dynamic action, the contributions of the main and noise reduction paths are in the ratios of 1 and 2.16, respectively. At high signal levels the roles of the two paths are reversed; the main path provides the predominant signal component, and the further path contribution is negligible.

The saturation or distortion reduction effect is based on the above observations. Namely, an equalizer providing the required reduction in high or low frequency drive is placed in the main path of the compressor. As shown in FIG. 40, which shows the operation of a high frequency distortion reduction circuit according to this aspect of the invention, at high signal levels essentially the full effect of the equalization is obtained, with a consequent reduction in high frequency saturation. However, at low levels, the equalization effect is reduced, since the contribution of the noise reduction path becomes significant. If, for example, the antisaturation network provides for as much as a 12 dB attenuation at a particular frequency, then, ignoring phase considerations, the low level effect will be $$0.25 \times 1 + 2.16 = 2.41 = 7.6 \text{ dB}$$

That is, a 12 dB reduction in high level recording drive is obtained for a 2.4 dB loss in noise reduction effect. Such a high degree of distortion reduction would be required only at the highest frequencies, at 15 kHz, for example. At lower frequencies the required reduction in saturation would be less, with a correspondingly reduced loss of noise reduction effect. At low frequencies, the primary objective would be to counteract the effect of the 3180 microsecond (+3 dB at 50 Hz) recording boost built into many tape recorders, which causes low frequency tape saturation problems, e.g., with organ music, as already mentioned.

In audio applications, the requirements of a suitable anti-saturation network may be determined as follows. The maximum usable output level of the tape, optical film, FM channel, or otherwise, is determined at low to medium frequencies and at higher frequencies up to the highest frequency of interest. The resulting maximum output level curve is compared to a plot of energy distribution as a function of frequency for normally encountered music and speech sounds. Such a plot is presented in my paper in *Journal of the Audio Engineering Society*, Vol. 21, No. 5, June, 1973, pp. 357-362. The difference between the two curves is an indication of the required high level anti-saturation characteristics. Once such characteristics are determined and implemented, the resulting compression characteristic curves should be checked to determine if the anti-saturation network has caused an increase in compression ratio at any frequency or level. If so, appropriate changes can be made in the limiting characteristics of the noise reduction path and/or, where several series connected compressors (or expanders) are used, the anti-saturation characteristic can be distributed among the devices.

Similar considerations apply in the case of video devices. In video recorders high frequency pre-emphasis is frequently used, which can result in FM overmodulation problems. The overmodulation tendency of any particular recording system can be measured and an appropriate kind and degree of anti-saturation can be provided. If video compressors and expanders of the types described in U.S. Pat. Nos. 3,846,719 and 3,903,485 are used, there will be a further overmodulation tendency produced by small residual overshoots (a few percent) from the compressors. These overshoots can be this aspect of the present invention.

While it would be possible to operate with only the antisaturation network in the encoder unit, it is preferable to provide a complementary correction on the playback side, so that flat frequency response is maintained at all levels. The following analysis shows the type of correction required.

Referring to FIG. 41, which shows the Type I dual path compressor and expander configurations, let the input signal to the compressor be x, the signal in the information channel be y, and the output signal of the expander be z. Let $F_1$ and $F_2$ be the transfer characteristics of the further path of the compressor and expander, respectively, and $F_{AS}$ be the transfer characteristic of the antisaturation network. Let $F'_{AS}$ be the required compensating characteristic in the decoder.

$y = (F_{AS} + F_1)x$ and $z = yF'_{AS} - zF_2F'_{AS}$ thus, $$z = \frac{F_{AS}F'_{AS} + F_1F'_{AS}}{1 + F_2F'_{AS}} x$$

Inspection shows that z=x if $F_1=F_2$ and $F'_{AS}=1/F_{AS}$.

A similar derivation applies to the Type II configuration shown in FIG. 42:

$y = F_{AS}x + F_1F_{AS}y$ and $z = (F_{AS} - F_2)y$ thus $$z = \frac{(F_{AS} - F_2)}{\frac{1}{F_{AS}} - F_1} x$$

Inspection shows that z=x if $F_1=F_2$ and $F'_{AS}=1/F_{AS}$.

The above shows not only that the two noise reduction networks should be *identical*, as is known from the applicant's prior art, but that the antisaturation compensation network in the decoder should have an *inverse* characteristic to that of the network employed in the encoder. Simple corrections can be achieved passively, such as by RC combinations, while more complex ones can employ feedback techniques, especially to achieve the inverse characteristics required in the decoder.

Referring now to FIG. 43, a block diagram of this aspect of the present invention is shown embodied in a dual stage Type I configuration primarily for use in magnetic tape recording and reproduction.

The illustrated embodiment employs cascaded compressors 52 and 54 to obtain an enhanced amount of compression and, correspondingly, cascaded expanders 56 and 58 such as described above in connection with Aspect I of the invention. The invention is applicable as well to single stage dual path compressors and expanders. Each compressor has a main path 10 including a combining circuit 12 which adds to the main path the output of the further path $N_1$, $N_2$, whose input is connected to the input of the corresponding main path. The expanders have main paths 14 and combining circuits 16 which subtract from the main path signal the output of the further path $N_2$, $N_1$, whose input is connected to the corresponding main path output.

Such compressor and expander configurations are well known in themselves and will therefore not be described in great detail. However, there are two main forms for the further path $N_1$ or $N_2$. One alternative (FIGS. 7 and 8 of U.S. Pat. No. 3,846,719) is a filter followed by a controlled limiter which is caused to limit progressively, as the signal level rises, by a rectified and smoothed control signal. Another alternative (U.S. Pat. No. Re. 28,426) is a sliding band high pass filter whose pass band is progressively narrowed by the control signal so as to exclude large signal components from the output of the filter. Advantageous corner frequency values for the sliding band filters in consumer applications are about 375 Hz in the quiescent state but become progressively narrower high pass in response to the control signal.

The first and second compressors 52 and 54 each have high frequency and/or low frequency (and/or any other particular frequency or frequency range) antisaturation networks 74, 76 affecting the main signal components. On the reproduce side of the tape recorder T, the first and second expanders 56 and 58 have complementary networks 78 and 80 affecting the main signal components. Alternately, such compensation may be provided in only one of the compressors and in only the corresponding expander. The compensation, may, for example, take the form of a gentle high frequency roll off in the encoder (compressor), increasing at very high frequencies, say above 10 kHz, and complementary boost in the decoder (expander).

Because the high frequency channel overload reduction is applied only to the main signal components, the low level components in the side channels are unaffected and thus the overload reduction does not greatly affect the noise reduction. Consequently, the channel overload reduction can extend down to the mid-frequency range.

The antisaturation networks in the encoders, 74, 76, and the complementary networks in the decoders, 78, 80, are located in the main signal paths. This arrangement results in very little loss of noise reduction effect, since the bulk of signal at low levels is provided by the noise reduction side chain. Therefore, it is possible to provide antisaturation networks that taken together have a gradual high frequency roll off, 3–6 dB/octave, for example, (and complementary boost in the decoder) extending quite far down in frequency, for example, to 2–3 kHz, to deal with saturation effects without a high degree of noise reduction loss. The frequency response at 0 dB in FIG. 39, shows, for example, a fall off of high frequency response from saturation beginning about 2 kHz. Since the antisaturation networks are in the main channels, which carry the high level signals, only those signals which cause saturation are affected. As shown in FIG. 39, low level signals do not cause significant tape saturation.

Optionally, half of the 3–6 dB/octave roll off is provided in each network 74 and 76 and half of the complementary boost is provided in each network 78 and 80. If all of the roll off and boost is placed in single networks 76 and 78, then the associated compressor or expander will have an increased compression or expansion ratio in the particular level and frequency region associated with that compressor or expander. However, in a consumer system the use of a single network is adequate.

One suitable single network (for use at block 76 of FIG. 43) is a shelf or shelving network having a transfer function $$\frac{1 + jWT_{4'}}{1 + jWT_5}$$

where $T_4 = 50$ microseconds and $T_5 = 70$ microseconds. This gives the following characteristic:

| Frequency in Hz | Attenuation in dB |
|---|---|
| up to 200 Hz | 0 |
| 500 Hz | 0.2 |
| 1 kHz | 0.4 |
| 2 kHz | 1.0 |
| 3 kHz | 1.6 |
| 5 kHz | 2.3 |
| 10 kHz | 2.7 |
| 15 kHz | 2.8 |

$T_5$ corresponds to about 2.3 kHz and $T_4$ corresponds to about 3.2 kHz.

Physically such a network can be realized in the form shown in FIG. 44. $T_5$ is determined by $(R_1+R_2)C_1$ and $T_4$ is determined by $R_2C_1$.

IV COMBINATION OF ASPECTS I, II AND III

This aspect of the present invention is concerned in general with recording and transmission systems and with circuit arrangements which alter the dynamic range of signals handled by such systems, namely compressors which compress the dynamic range and expanders which expand the dynamic range. The invention is particularly useful for treating audio signals but is also applicable to other signals, including video signals.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, particularly audio recording and play back products, a single device is often configured for switchable mode operation as a compressor to record signals and as an expander to play back compressed broadcast or pre-recorded signals.

More specifically, this aspect of the present invention relates to compressors, expanders and noise reduction systems which may incorporate any two but preferably all three aspects of the invention thus far described. Although the three aspects of the invention are usable independently as has been described, additional advantages are obtained by using them in combination.

For example, a spectral skewing network, such as described in connection with Aspect II of the invention, tends to reduce high frequency saturation in magnetic recording. However, it cannot do so down to lower frequencies without causing a loss of subjective noise reduction. On the other hand, an antisaturation network, such as described in connection with Aspect III of the invention, does not eliminate the midfrequency modulation effect because its frequency roll off is too gradual. Therefore, it is advantageous to combine the spectral skewing and antisaturation aspects of the present invention to achieve enhanced antisaturation effects along with suppression of the mid-frequency modulation effect. Particularly in a noise reduction compander system for magnetic recording, the combination results in substantial immunity to mistracking due to recorder and magnetic recording media errors.

Employment of the spectral skewing and antisaturation is particularly desirable in combination with compressors and expanders embodying the staggering technique as described in connection with Aspect I of the invention. Although the staggering aspect of the invention provides for substantially increased compression, expansion and noise reduction without any significant increase in compression ratio, it does, nevertheless, place greater demands on the system in which it is embodied. This is because the frequency and level area of dynamic action is larger with two or more staggered devices than with a single device. Consequently, the spectral skewing and/or antisaturation aspects of the invention are advantageously combined with the staggering aspect to assure that the increased area of dynamic action does not cause mistracking.

The combination of all three aspects of the invention is particularly desirable in systems for recording and/or playing back audio signals on slow speed magnetic tape, such as on Compact Cassettes, micro-cassettes, and the audio tracks of video tape (particularly in consumer type videocassettes). In such systems the reliable bandwidth is inherently limited by the media.

B. Summary of the Invention—Combination of Aspects

In light of these considerations it is the object of this aspect of the invention to combine two or more of the previous aspects of the invention in order to achieve not only the advantages of the individual aspects of the invention but also a further enhancement of those advantages and additional advantages resulting from a combination of the aspects of the invention.

It is a particular object of this aspect of the invention to embody all three aspects of the invention in a system for recording or playing back audio signals on slow speed magnetic tape, such as Compact Cassettes, microcassettes and the audio tracks of video tape, particularly consumer type video-cassettes.

The above stated objects are met in accordance with this aspect of the invention in which compressors, expanders, and noise reduction compander systems are provided embodying any two, but preferably all three of the previously described aspects of the invention.

Figure 45:
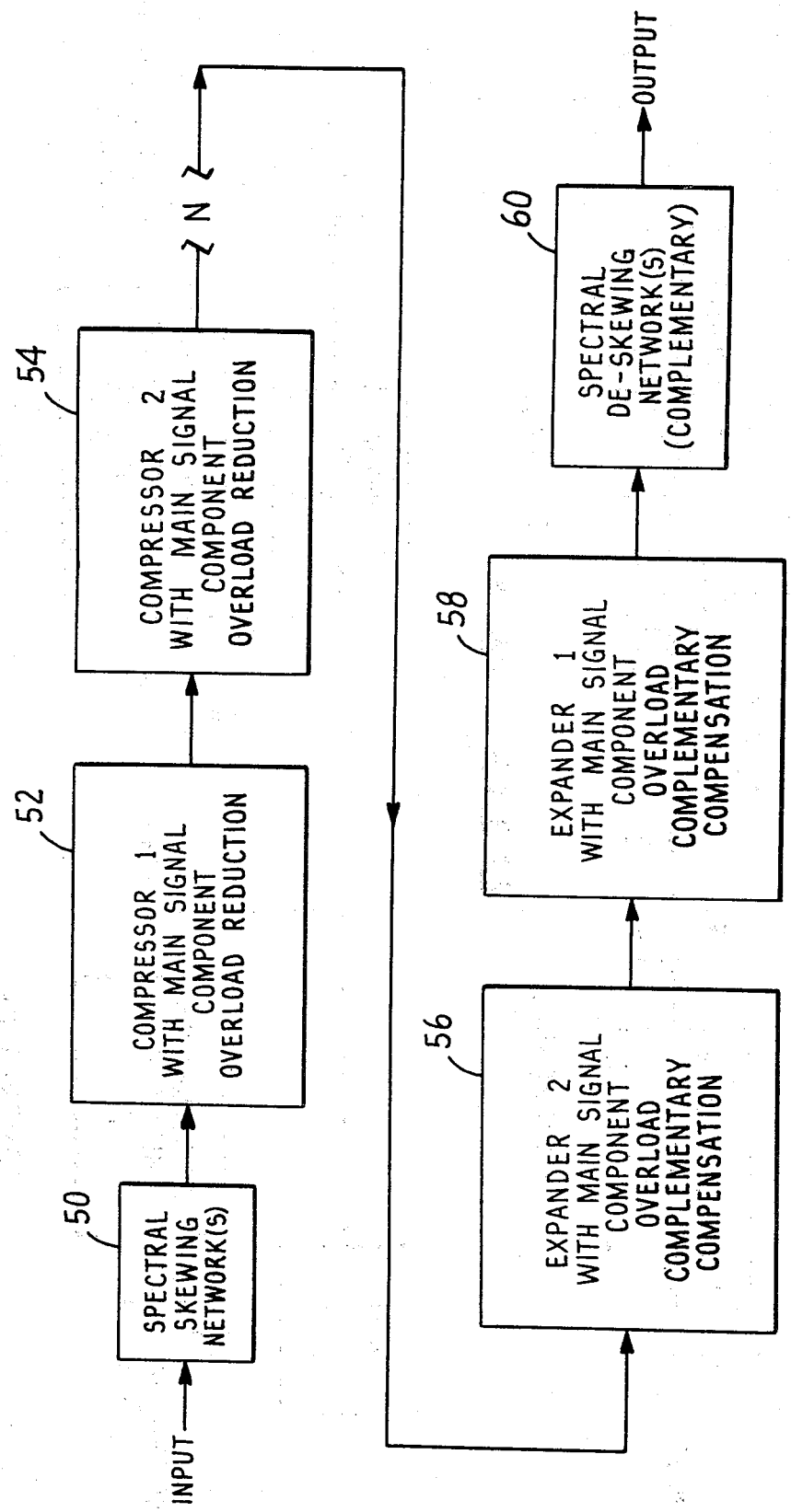

C. Brief Description of the Drawing Relating to the Combined Aspects of the Invention The combination aspect of the invention will be described in more detail, by way of example, with reference to the accompanying drawings, in which:

FIG. 45 is a generalized block diagram showing an aspect of the invention in which the heretofore described staggering, spectral skewing and antisaturation aspects of the invention are combined.

Figure 46:
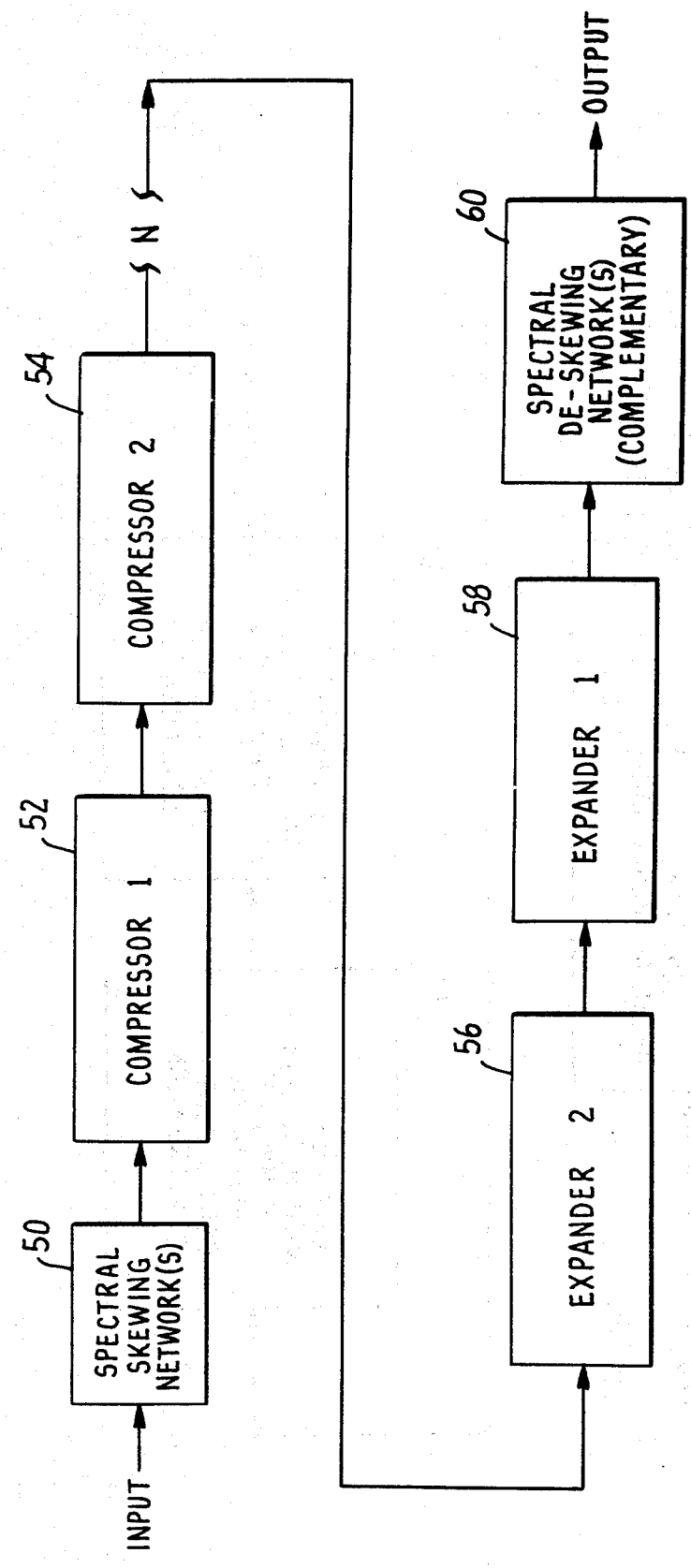
Figure 42:
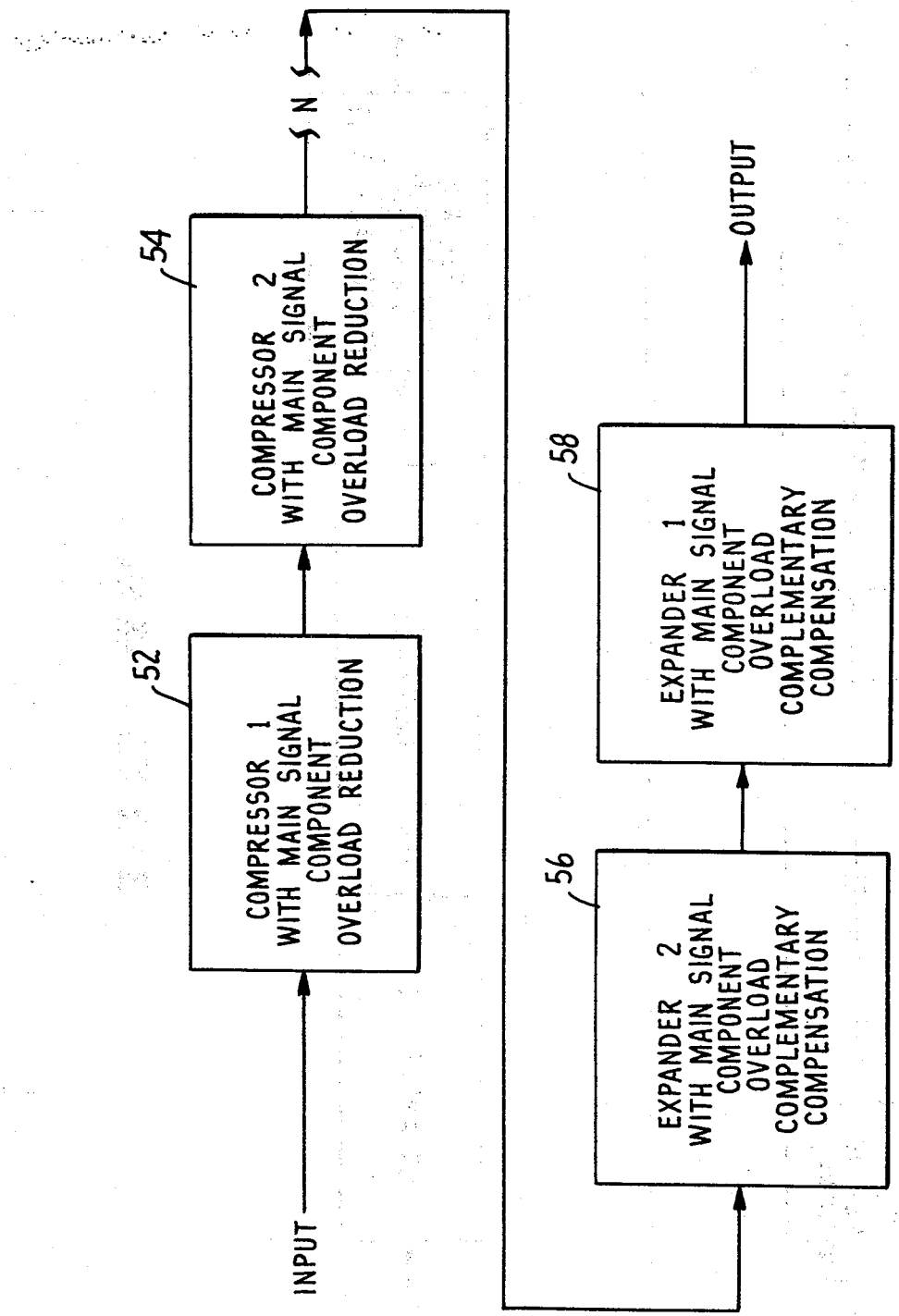

FIG. 46 is a generalized block diagram showing an aspect of the invention in which the heretofore described staggering and spectral skewing aspects of the invention are combined.

FIG. 47 is a generalized block diagram showing an aspect of the invention in which the heretofore described staggering and antisaturation aspects of the invention are combined.

Figure 48:
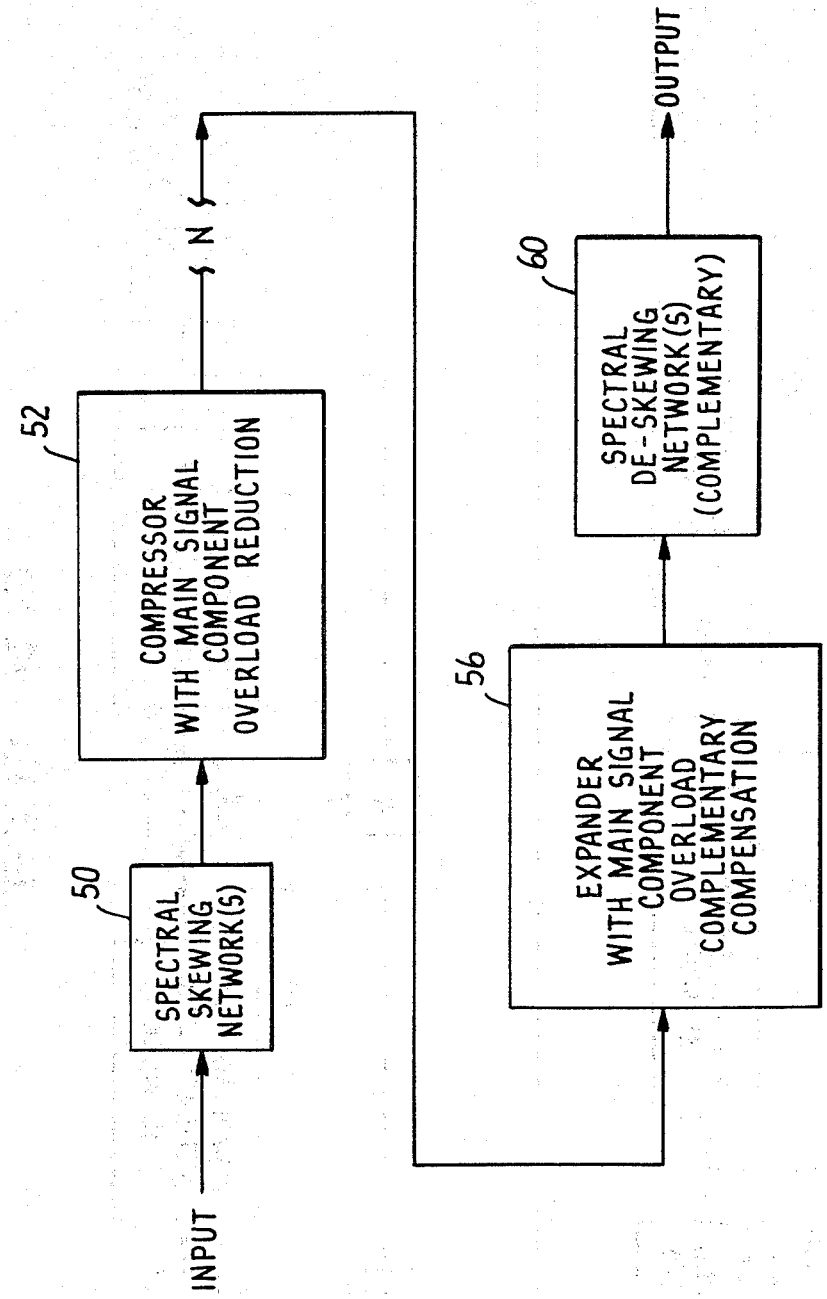

FIG. 48 is a generalized block diagram showing an aspect of the invention in which the heretofore described spectral skewing and antisaturation aspects of the invention are combined.

Figure 49:
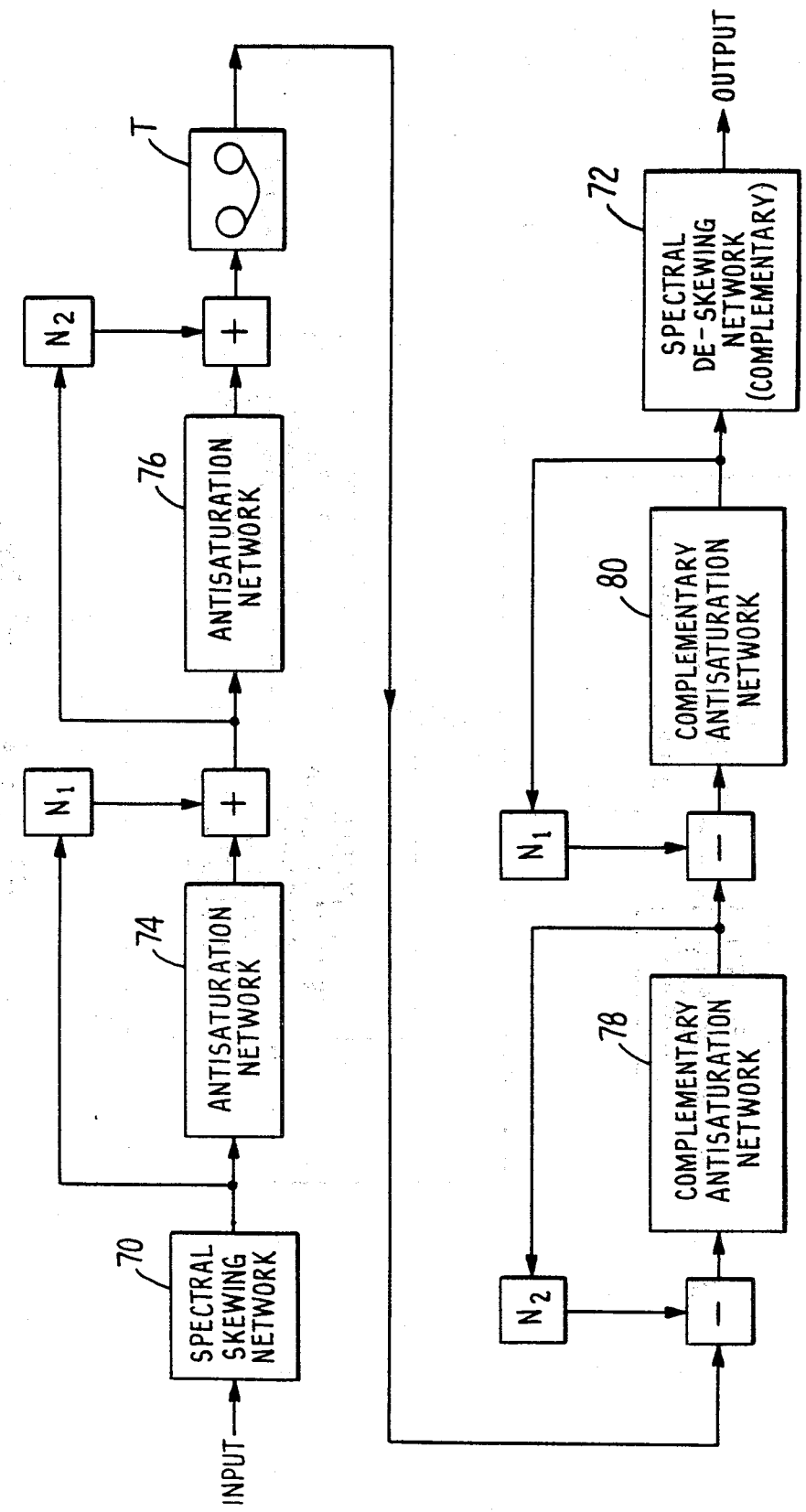

FIG. 49 is a more specific block diagram showing the combined aspects of the invention embodied in a tape recorder system.

Figure 50:
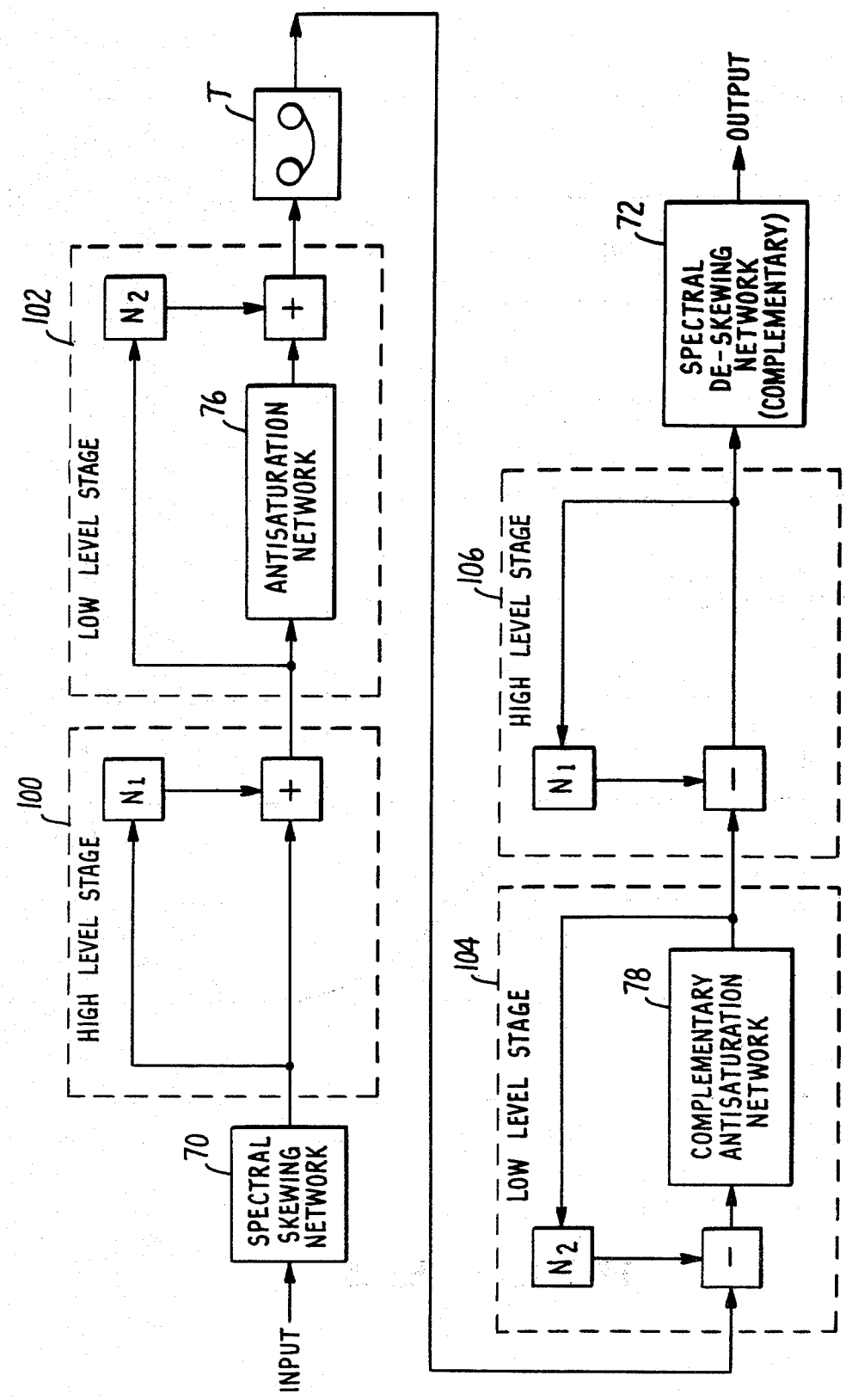

FIG. 50 is yet a more specific block diagram showing a preferred embodiment of the combined aspects of the invention embodied in a tape recorder system, of which one particular embodiment is hereinafter designated C-type noise reduction.

Figure 51:
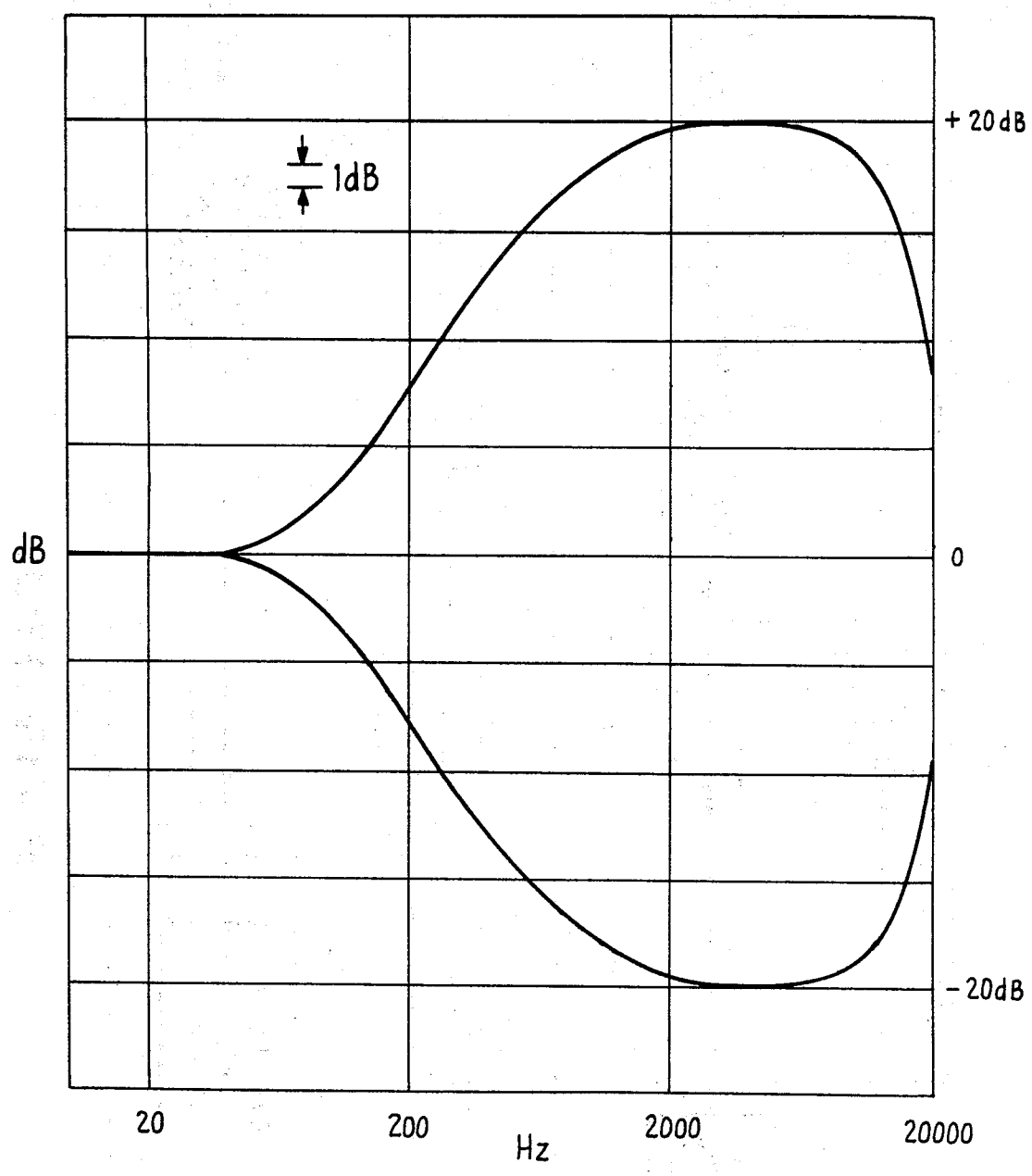

FIG. 51 is a chart recording showing the response below compression threshold and below expansion threshold of FIG. 50.

Figure 52:
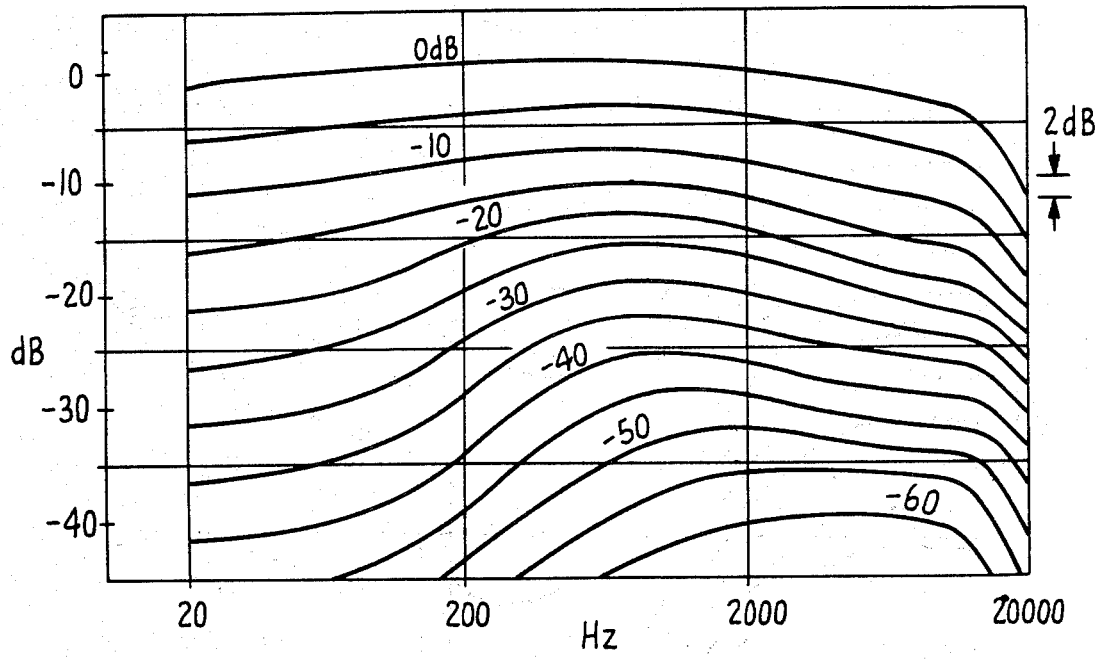

FIG. 52 is a chart recording of the input-output response as a function of frequency of the encoder portion of FIG. 50.

Figure 53:
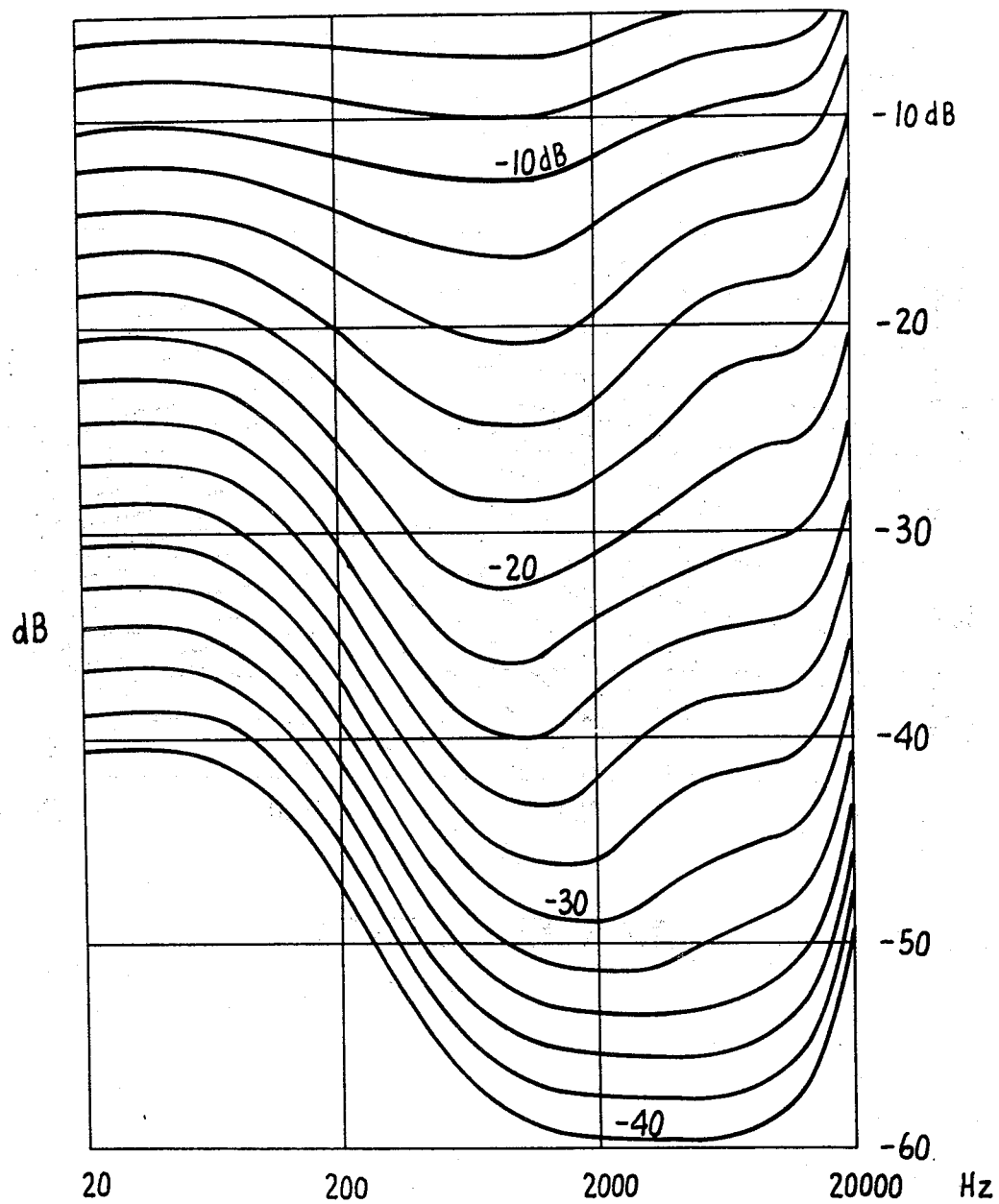

FIG. 53 is a chart recording of the input-output response as a function of frequency of the decoder portion of FIG. 50.

Figure 54:
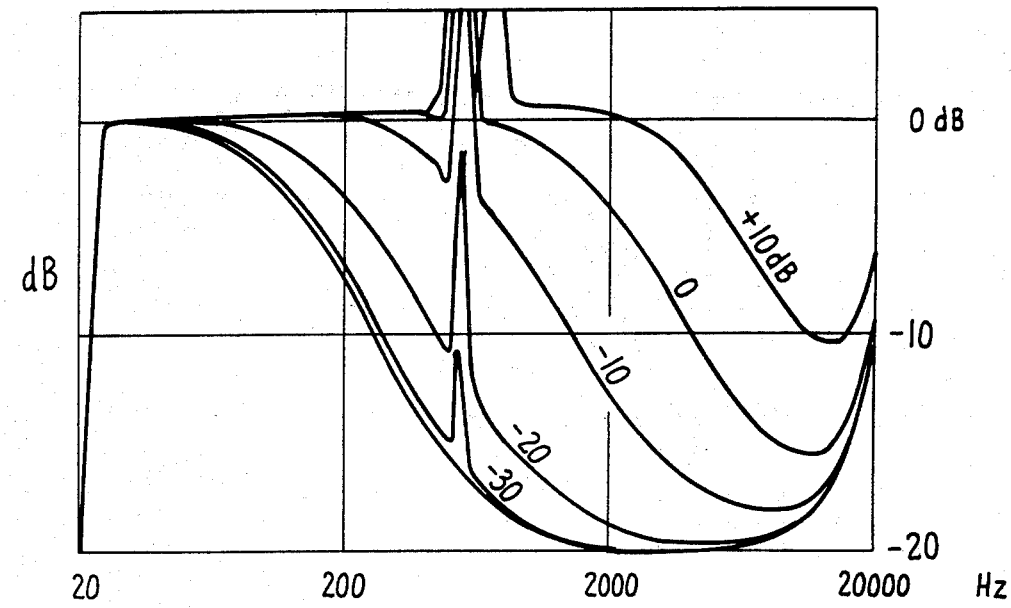

FIG. 54 is a series of chart recording probe tone curves relating to the decoder portion of FIG. 50.

FIGS. 55–59 are a series of chart recording probe tone curves relating to the encoder portion of FIG. 50.

Figure 60:
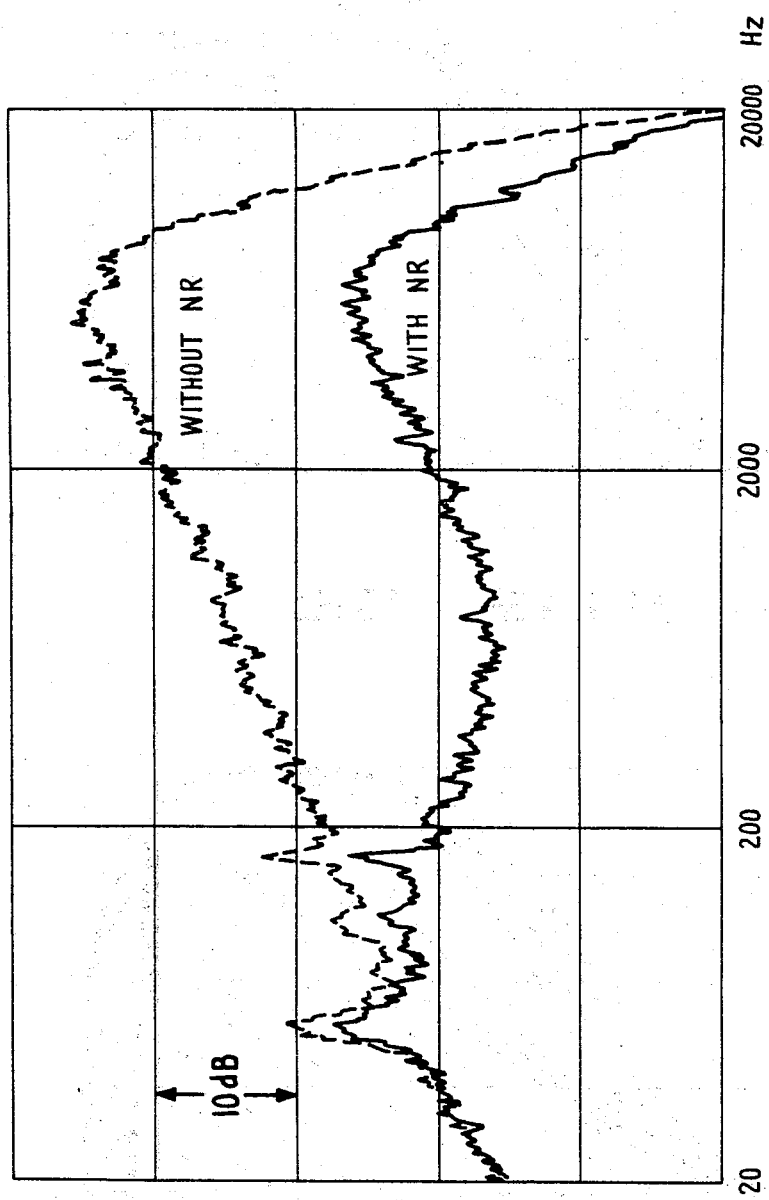
Figure 61:
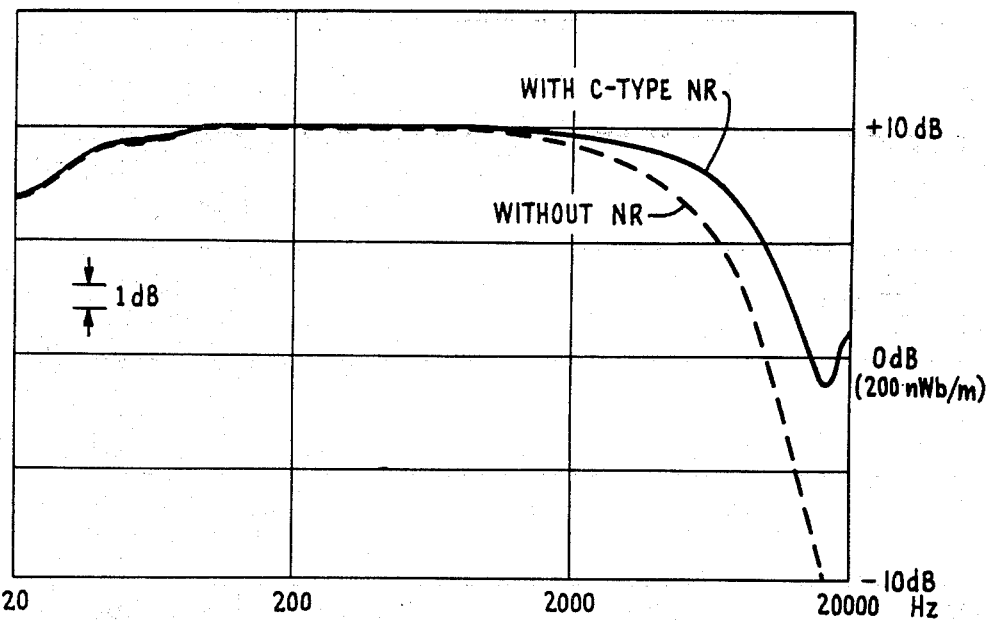
Figure 62:
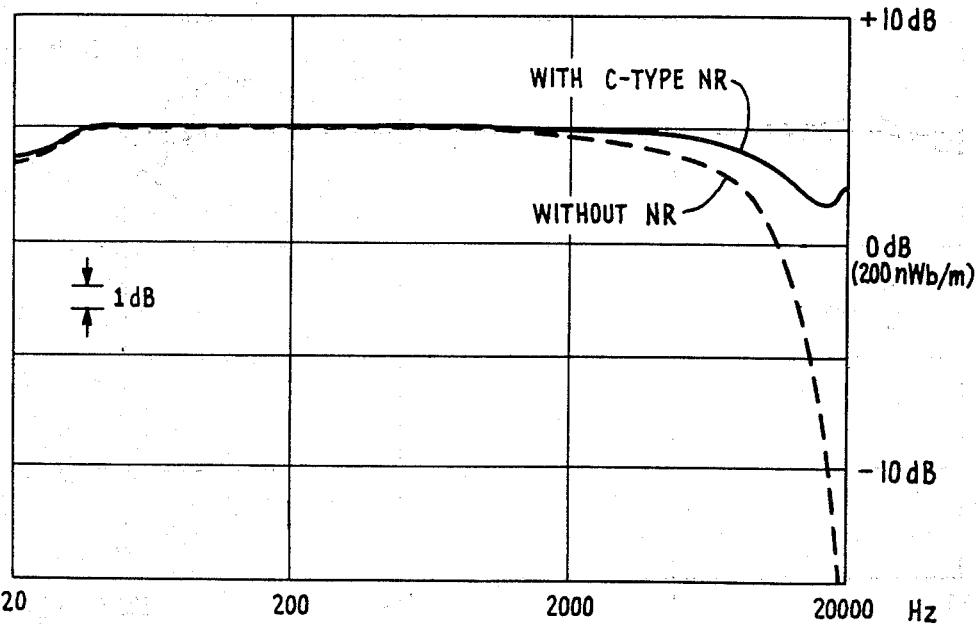
Figure 63:
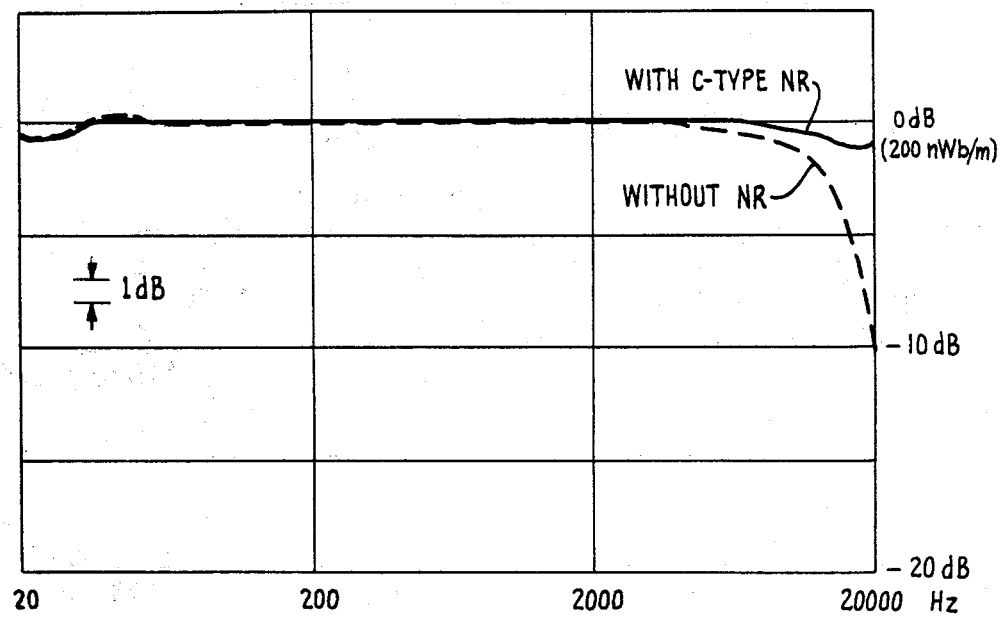
Figure 64:
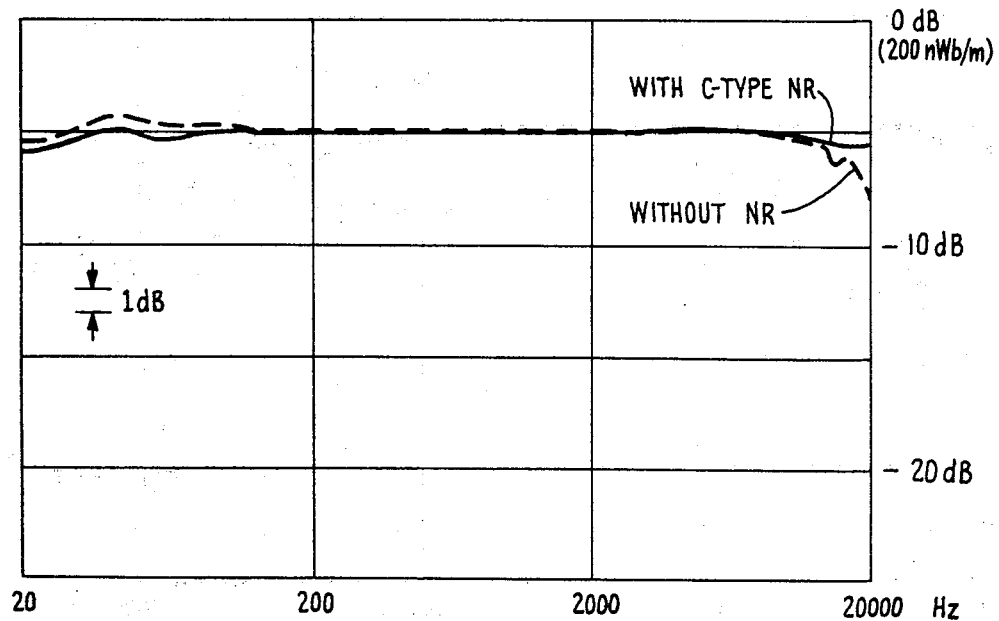

FIG. 60 is a graph of tape noise versus frequency in the absence of signals without noise reduction and showing the effects of a combined aspect embodiment of the invention (C-Type noise reduction).

FIGS. 61–64 are a set of response curves showing the frequency response of a typical cassette tape recorder/reproducer at several input levels without noise reduction and with C-Type noise reduction.

Figure 65:
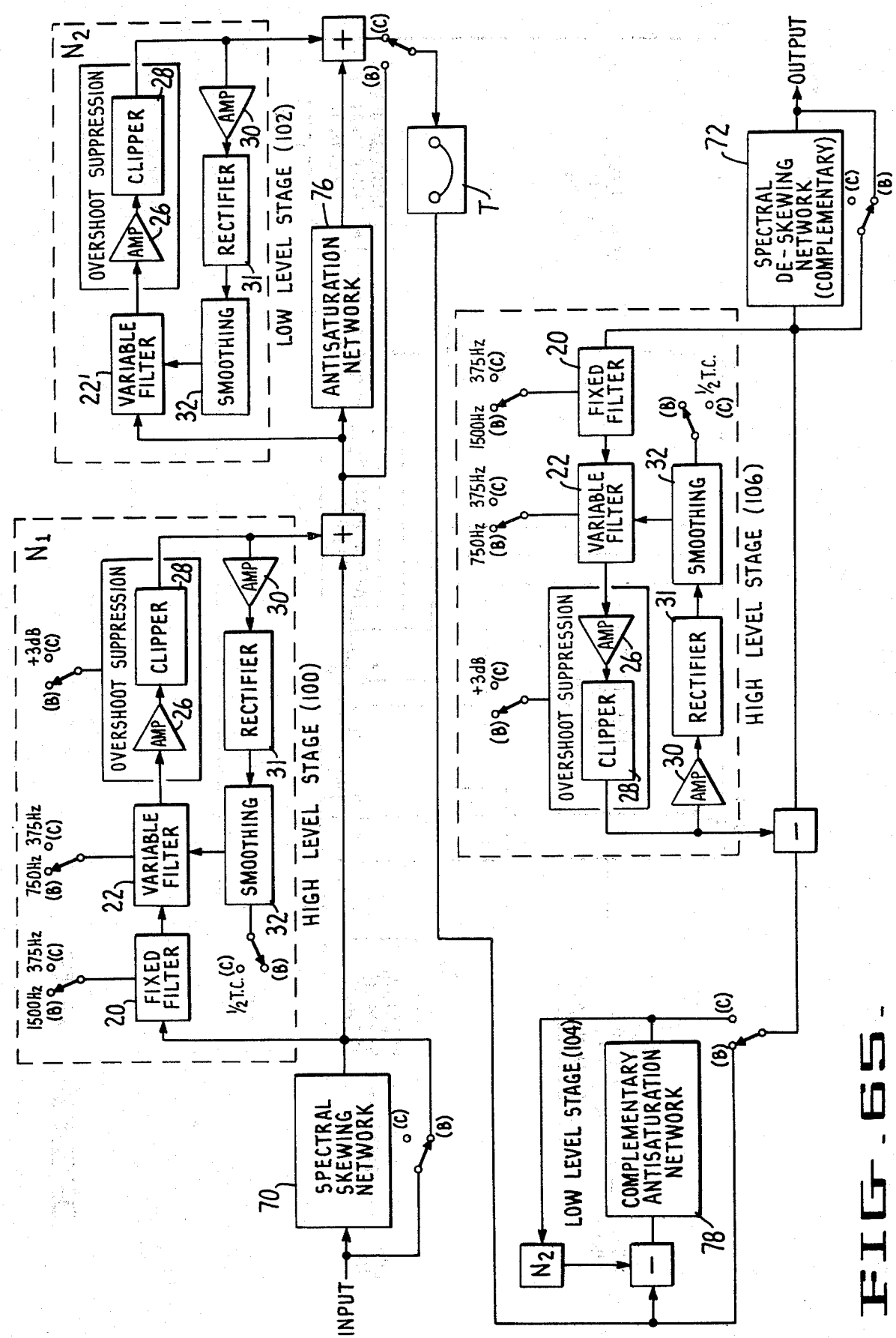

FIG. 65 is a block diagram of a B-Type/C-Type characteristic mode switched noise-reduction system according to this aspect of the invention.

Figure 66:
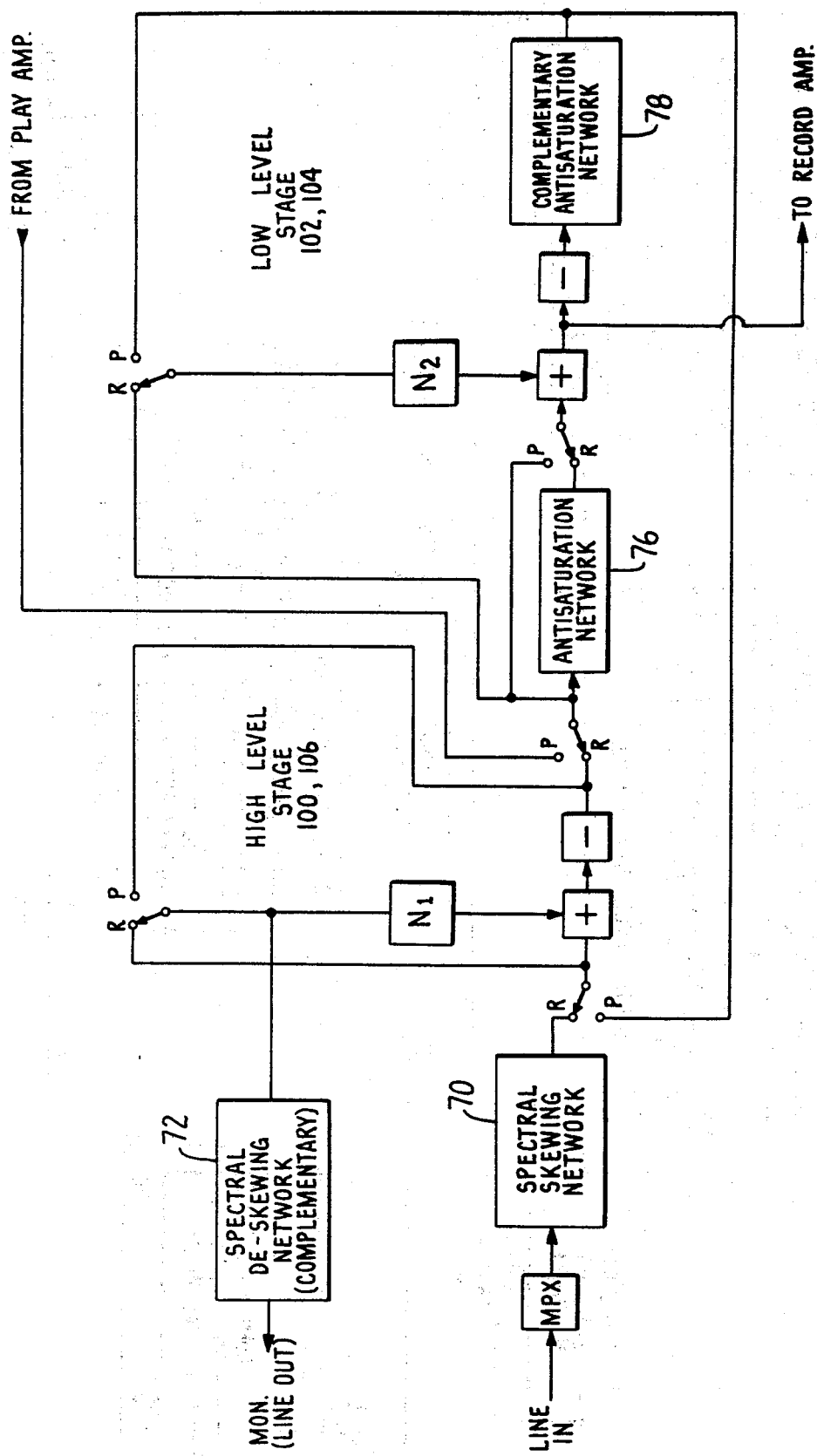
Figure 62:
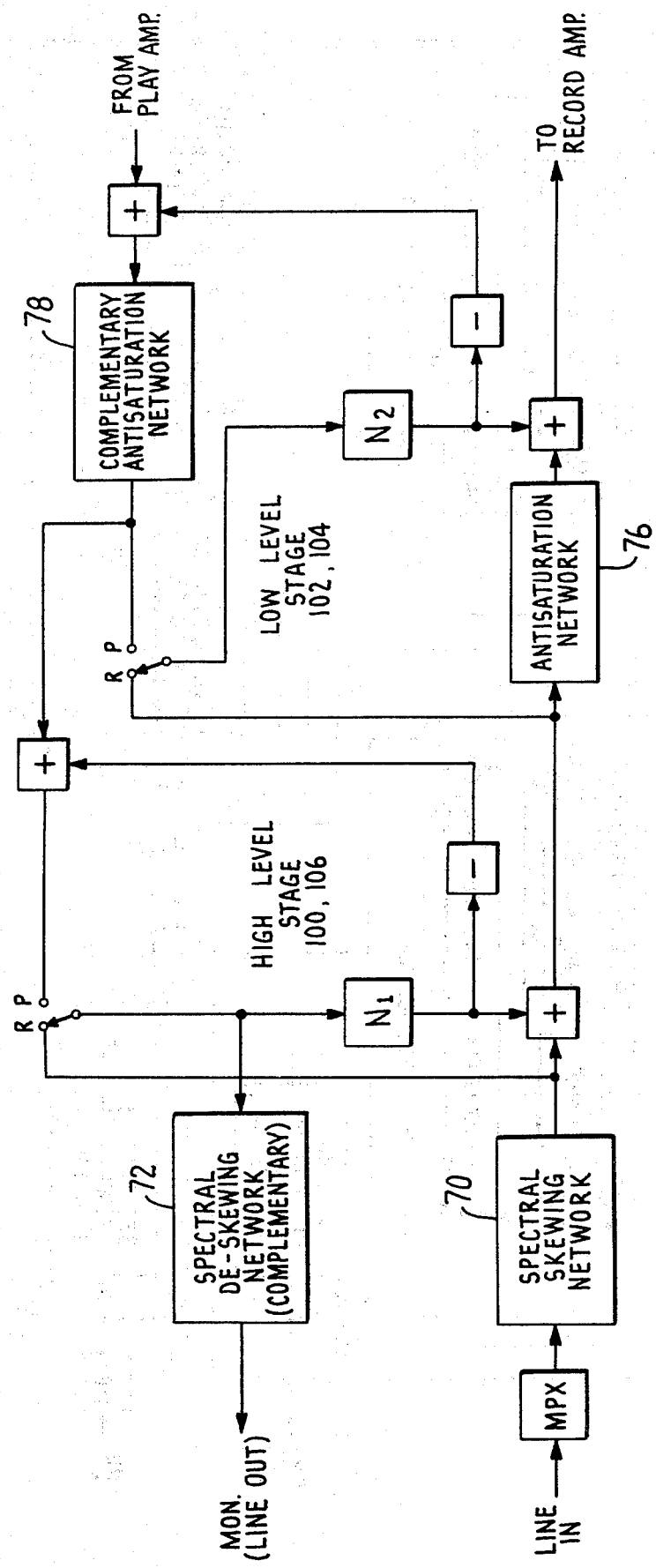

FIGS. 66 and 67 are block diagrams of a switched compressor/expander according to this aspect of the invention.

Figure 68:
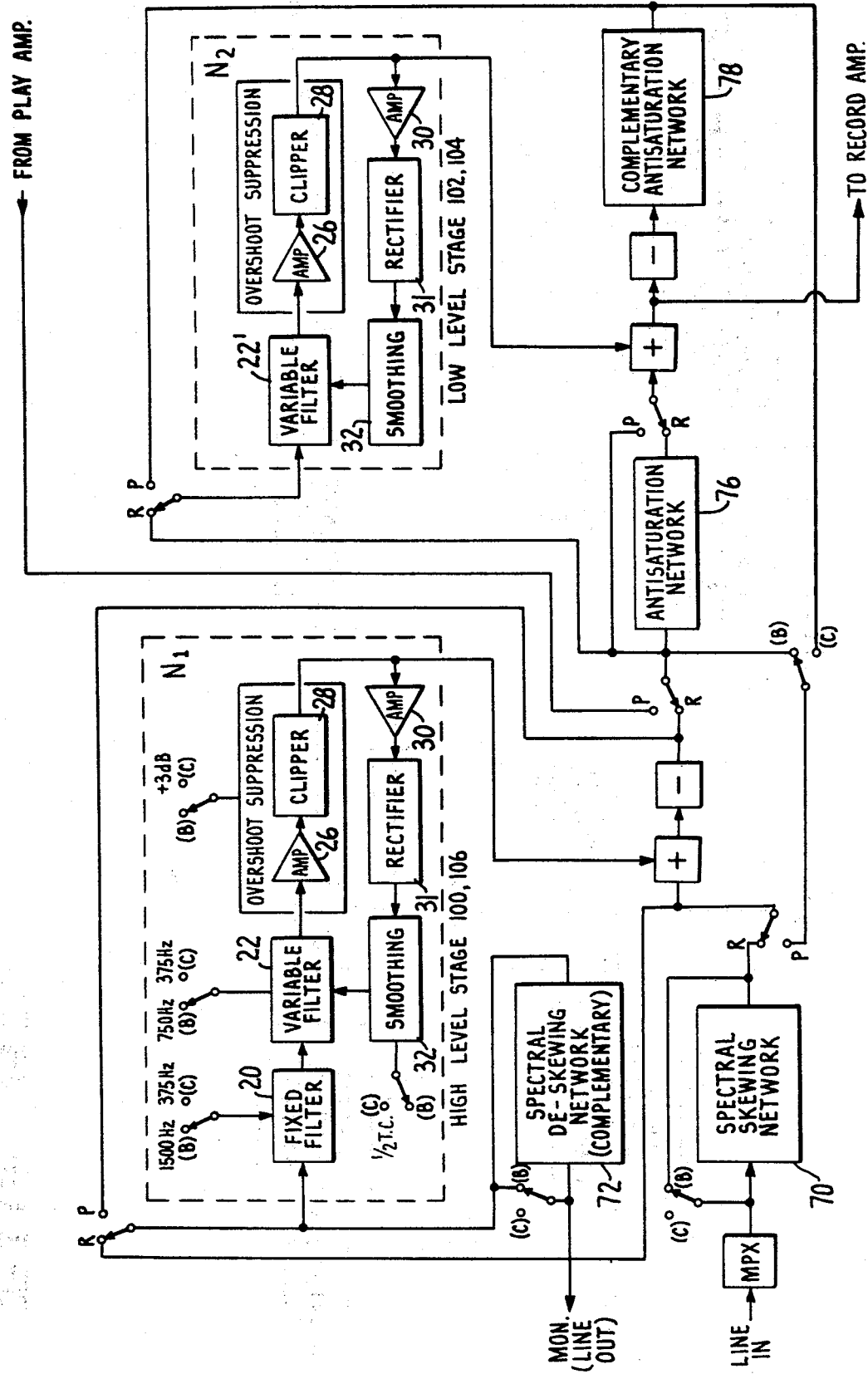
Figure 69:
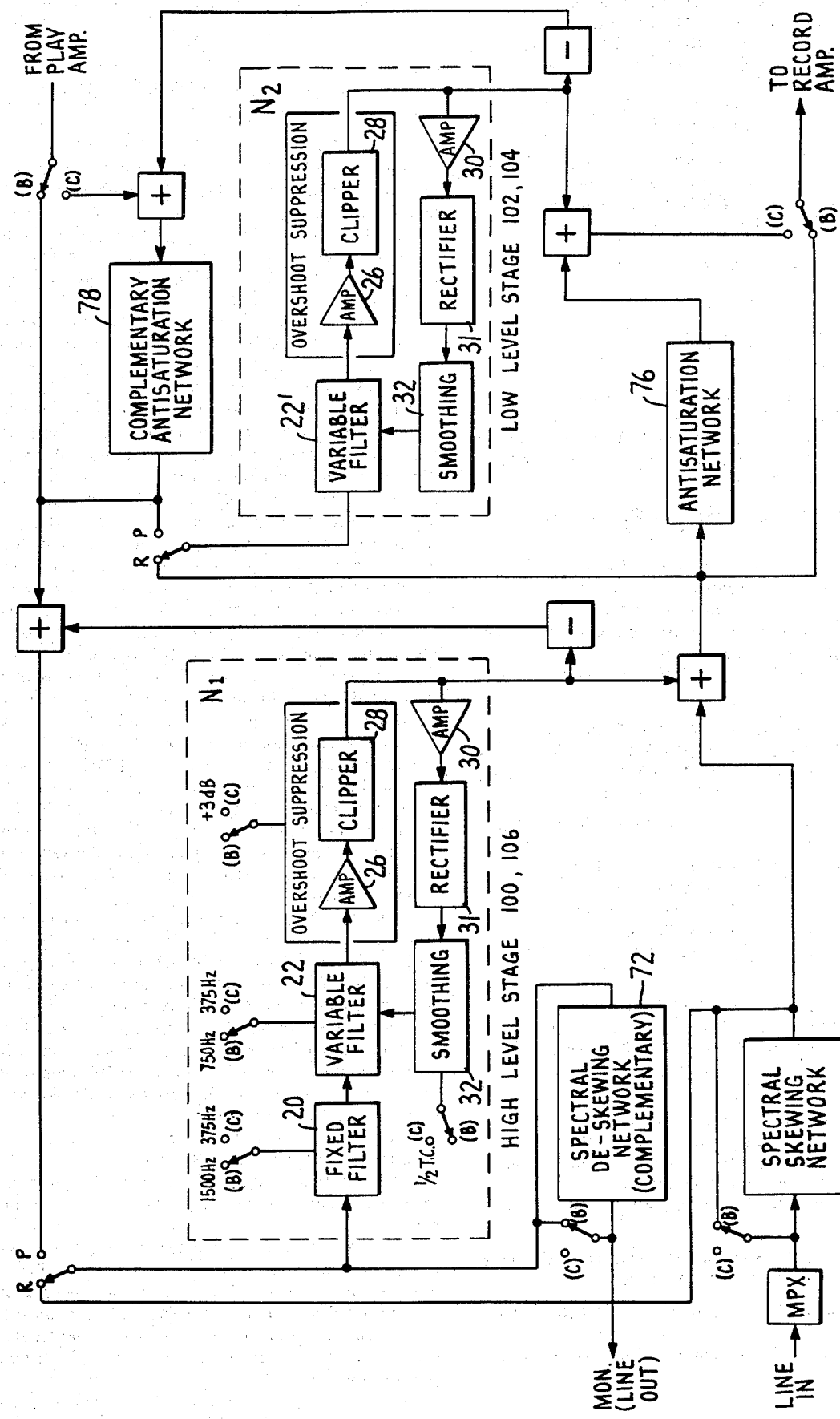

FIGS. 68 and 69 are block diagrams of switched compressor/expander that are also B-Type/C-Type characteristic mode switched.

D. Description of the Preferred Embodiments—Combination of Aspects

Referring now to FIG. 45, a generalized block diagram is shown which combines the staggering, spectral skewing and antisaturation aspects of the invention. The series compressors and expanders are in accordance with the teachings above relating to Aspect I of the invention. While two series compressor devices 52 and 54 and two series expander devices 56 and 58 are shown, two or more can be employed as discussed in connection with Aspect I of the invention.

The spectral skewing network(s) of block 50 and the spectral de-skewing network(s) of block 60 are in accordance with the above description of Aspect II of the invention. As discussed above, the spectral skewing and de-skewing networks can be located other than as shown in FIG. 45.

The main signal component overload reduction refers to the antisaturation networks as described in connection with Aspect III of the invention. It is possible to provide the antisaturation networks only in one of the compressor devices, such as compressor 54 and in its complementary expander device, expander 56.

FIG. 46 is otherwise the same as FIG. 45 except that it omits the antisaturation aspect of the invention.

FIG. 47 is otherwise the same as FIG. 45 except that it omits the spectral skewing aspect of the invention.

FIG. 48 is otherwise the same as FIG. 45 except that it omits the staggering aspect of the invention.

FIG. 49 shows an embodiment of the FIG. 45 arrangement in a consumer tape recorder (T) noise reduction system. The compressors and expanders in FIG. 49 are shown as Type I devices and may include the A-Type or B-Type embodiments previously described.

FIG. 50 shows a further embodiment of the FIG. 45 arrangement in a consumer tape recorder (T) noise reduction system, designated C-Type noise reduction. In accordance with this preferred embodiment for such systems, the compressor 100, 102 and expanders 104, 106 are modifications of the B-type devices as described in connection with the further practical embodiment of the invention of Aspect I of the invention. That is, each set of series devices (100, 102 and 104, 106) has its signal filter corner frequency lowered by two octaves to about 375 Hz (corresponding to time constants of about 425 microseconds) in order to provide an overall sharply rising low level response characteristic. Dynamic action staggering is provided by decreasing the thresholds (both syllabic and overshoot overshoot suppression) of the second (in the compressor mode) device by 10 to 15 dB. Compressor 100 is a high level stage; i.e., it has a higher threshold: the same as B-type with respect to syllabic action but preferably about 3 dB higher with respect to overshoot suppression. Thus its dynamic action responds primarily to higher signal levels than does the low level compressor stage 102. On the expander side of the system, expander 104 is the low level stage and expander 106 is the high level stage.

As described above, the low level stages have their syllabic thresholds lowered (with respect to this standard B-type circuits described above) by effectively increasing the gain in the side chain control amplifier, thus causing the sliding band filter to respond to lower signal levels. This effective increase in gain can be accomplished by lowering the turnover frequencies of the control amplifier by a factor of 4 to 5: the value of the capacitor in the emitter network 52 (FIGS. 6 and 8) is increased by a factor of about 4.7. For a factor of 4.7, the time constants for the turnover frequencies of the C-Type low level stage are about 500 microseconds and 50 microseconds (versus 106 microseconds and 10.6 microseconds for the B-Type system and the high level stage of the C-Type system).

The low level stages also have their overshoot suppression thresholds lowered as described hereinbefore. The high level stage in the C-type configuration preferably has its overshoot suppression threshold increased by about 3 dB with respect to B-type operation. Both the high and low level stages may also omit fixed filter 20 when the variable filter 22 has a quiescent corner frequency of about 375 Hz. However, it is preferred that the high level stages retain the fixed filter 20 so that by means of appropriate switching the high level stages can be operated singly with B-type characteristics (i.e., the filters in the high level stages are switched to the B-type corner frequencies mentioned above: 1500 Hz for the fixed filter and 750 Hz for the variable filter).

In order to provide a further overall improvement in performance, the C-Type configuration utilizes full wave rectification in its control circuits, which significantly reduces steady state and transient distortion. This development allows a reduction of response times in the smoothing circuitry; in the C-Type circuit the attack and decay times are one-half those of the B-Type circuit. This is accomplished by employing smoothing circuit time constants with half the values of those in the B-Type circuit.

Still referring to FIG. 50, the spectral skewing network 70 has characteristics as generally described in connection with Aspect II of the invention. For use in a consumer Compact Cassette tape recorder system, a corner frequency of about 10 kHz is an appropriate choice. A notch filter is a particularly desirable form for the network in a consumer audio tape system in view of its simplicity and low cost. In a practical embodiment the specific notch filter characteristics set forth above provide satisfactory results. The complementary spectral de-skewing network can be implemented by placing the same notch filter in a feedback arrangement.

Still with reference to FIG. 50, the antisaturation network 76 has the characteristics generally described in connection with Aspect III of the invention (i.e., a gradual high frequency roll off of 3–6 dB/octave, extending for example, upwards from 2–3 kHz). In a practical embodiment the specific shelving network characteristics set forth above provide satisfactory results. The complementary antisaturation network 78 has the mirror image characteristics (i.e., a gradual high frequency boost).

In FIGS. 51–59 actual chart recording plots of various responses of a practical embodiment of FIG. 50 are shown.

FIG. 51 shows the response below threshold of the compressor or encoder (i.e., blocks 70, 100 and 102 of FIG. 50) and the expander or decoder (i.e. blocks 104, 106 and 72). The curves illustrate the encoder and decoder action beginning to take effect in the 100 Hz region, providing around 15 dB of noise reduction around 400 Hz and 20 dB in the critical 2 to 10 kHz hiss area. The effect of the spectral skewing and de-skewing networks is apparent in the 10 kHz region and beyond. In the encoder, the response rolls off rapidly beyond 10 kHz. The decoder provides a complementary boost.

FIG. 52 shows the input-output response versus frequency of the encoder portion of FIG. 50. The effect of the antisaturation network 76 can be seen at high input levels extending to below 2 kHz. The effect of the spectral skewing network can be seen beyond 10 kHz at all input levels. It may be observed in FIG. 52 that the antisaturation network has its greatest effect at high input levels. Also, one may observe in FIG. 52 that the combination of spectral skewing and anti-saturation networks results in more high frequency roll off than the antisaturation network working alone.

FIG. 53 shows the input-output response versus frequency of the decoder portion of FIG. 50.

FIG. 54 is a set of probe tone curves for the decoder of FIG. 50 wherein the high level tone is at 500 Hz. The sweeping probe tone in each case is at −45 dB. These probe tone curves and those of FIGS. 55–56 were taken in the manner as described in connection with FIGS. 13 and 14.

Figure 55:
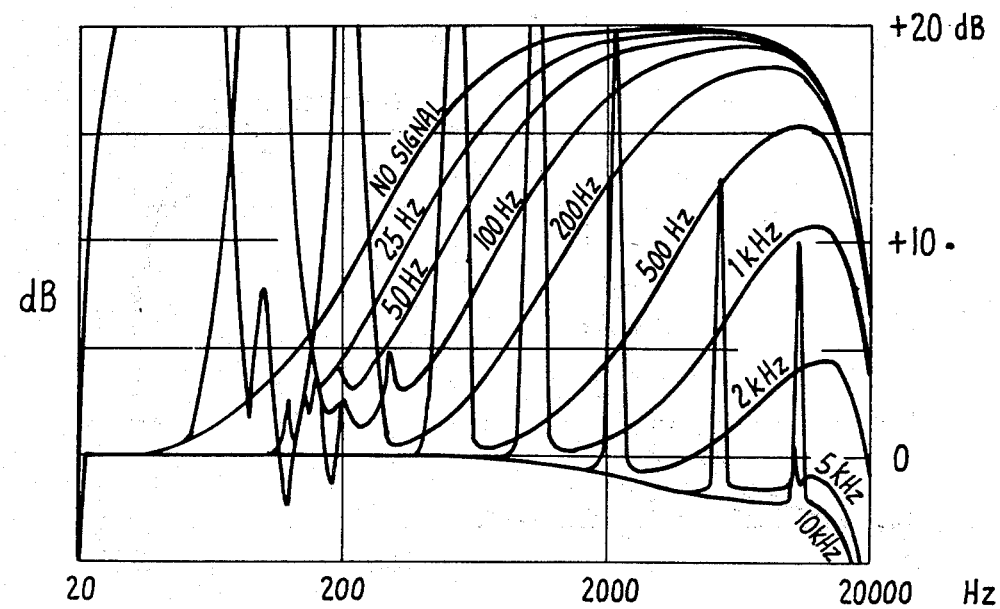
Figure 56:
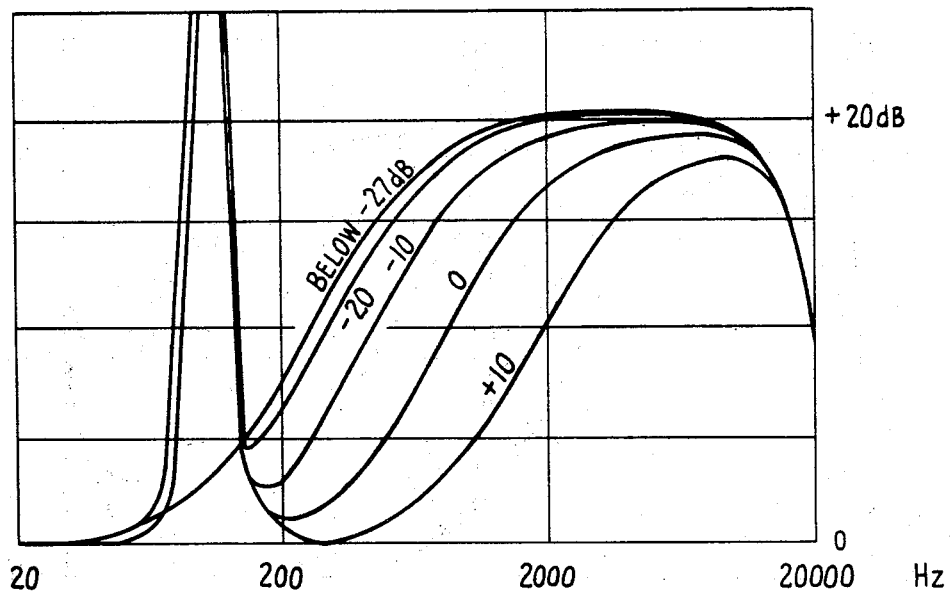
Figure 57:
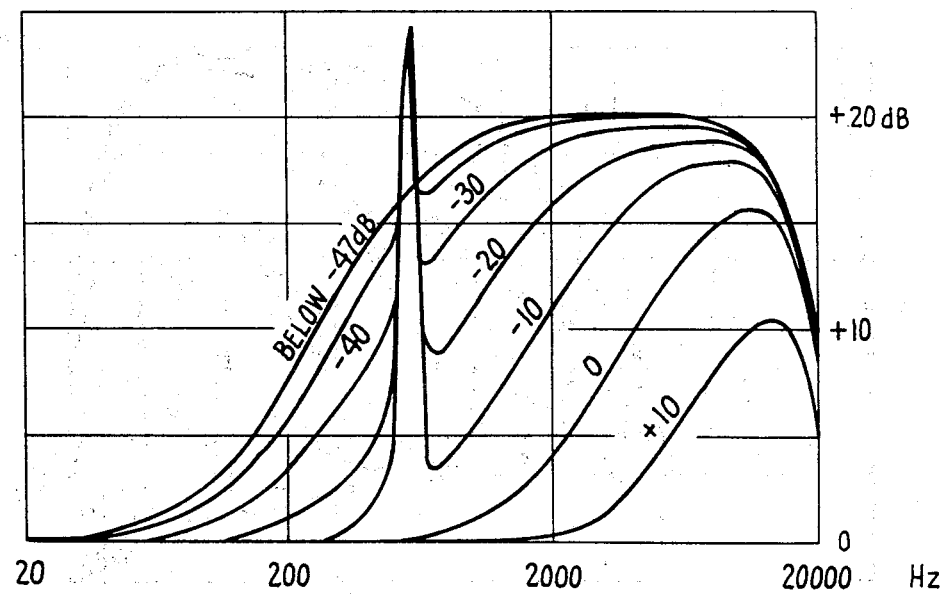
Figure 58:
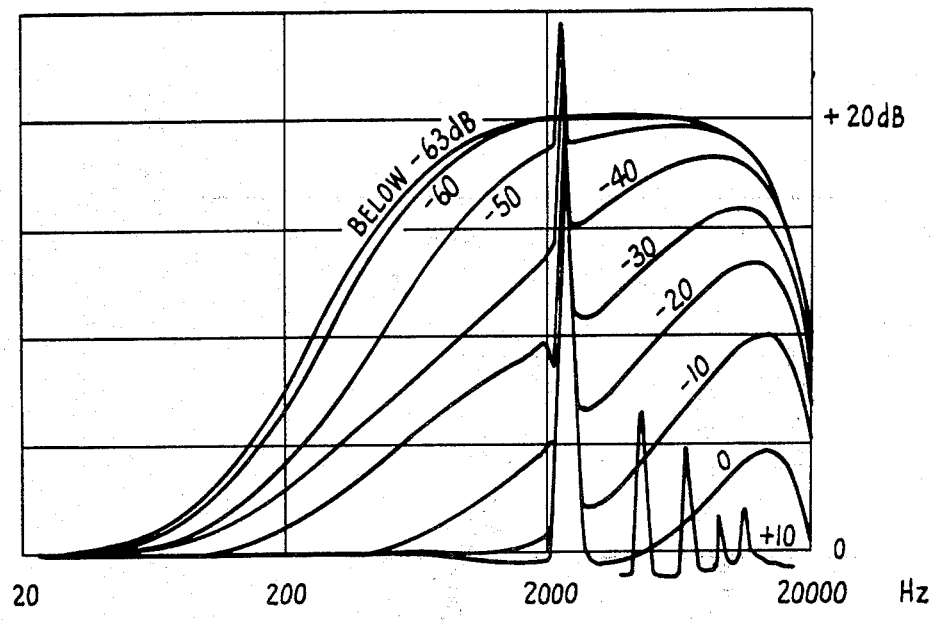

FIG. 55 shows a series of probe tone curves for the encoder portion of FIG. 50. In order to illustrate the sliding band action in response to high level signals at different frequencies, the response is plotted for a −65 dB probe tone for the case of no other signal and for the cases of a 0 dB high level dominant signal at 25, 50, 100, 200 and 500 Hz and 1, 2, 5 and 10 kHz.

Figure 59:
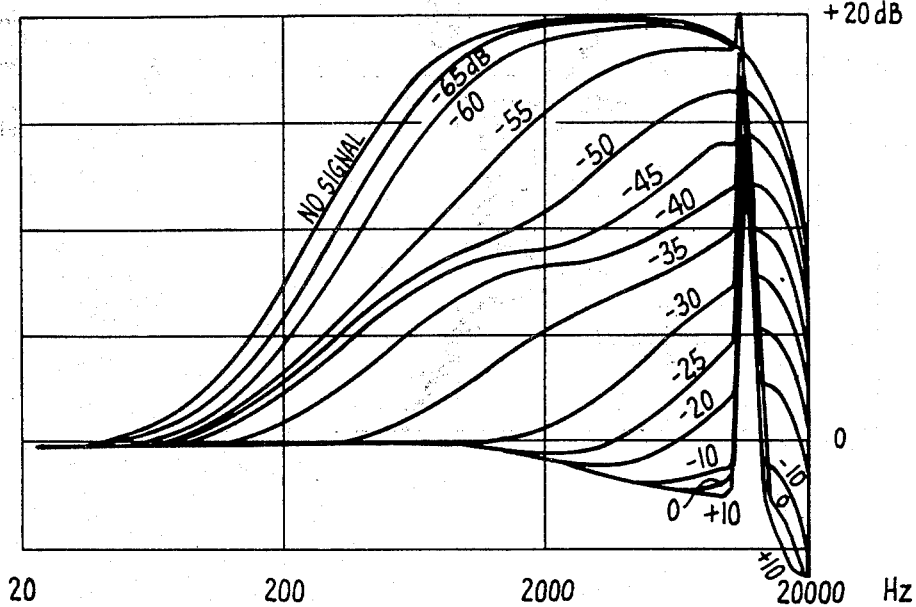

FIGS. 56-59 each show a series of probe tone curves for the encoder portion of FIG. 50 using a −65 dB probe tone and dominant signal at various levels. The dominant signals are at 100 Hz (FIG. 55), 500 Hz, (FIG. 57), 2 kHz (FIG. 58) and 10 kHz (FIG. 59). In view of the rapid roll off of the spectral skewing network 70 (FIG. 50), 10 kHz is about the highest frequency which can control compression and expansion. Normally, in this frequency region the signal has the nature of a broad spectrum. It is the alteration of a broad spectrum by the spectral skewing network, to favor somewhat lower frequencies, which ensures control of the circuitry by signals below 10 kHz.

In FIG. 60 a chart recording of biased cassette tape noise is shown without noise reduction and showing the effects of C-Type noise reduction in a practical embodiment of FIG. 50 (70 microseconds equalization, measured with a constant-bandwidth wave analyzer, and CCIR weighted to reflect the ear's sensitivity to noise and noise reduction effects). Noise reduction begins at about 100 Hz and rises to about 20 dB at 1 kHz and above.

In FIGS. 61-64 chart recordings (similar to FIG. 32) of frequency response are shown for various signal input levels of a representative compact cassette recorder/reproducer, showing the response without noise reduction and with C-Type noise reduction. It may be observed that C-Type noise reduction improves the high level response such that it is comparable to the response without noise reduction at substantially lower levels. This is a result of the antisaturation and spectral skewing aspects of the invention that effectively overcome the problem of high level, high frequency tape saturation in Compact Cassette tapes.

As mentioned previously, it is possible to switch the C-Type configuration circuit of FIG. 50 to a B-Type configuration. It is also useful to provide for B-Type/C-Type switching along with compressor/expander switching.

FIG. 65 is similar to FIG. 50 but shows generally the requirements for switching the cascaded compressors and expanders from the C-Type configuration to the B-Type configuration. The reference numerals from FIGS. 6, 8 and 50 have been retained so far as possible. The switches are shown set for the B-Type configuration: the spectral skewing network 70 and complementary de-skewing network 72 are bypassed; the low level stages 102 and 104 are bypassed; and in the noise reduction side path N₁ of the high level stages 100 and 106, the fixed filter 20 corner frequency is set at about 1500 Hz, the variable filter 22 corner frequency is set at about 750 Hz, the overshoot suppression level is as described above in connection with FIGS. 6 and 8, and the control circuit smoothing time constants are as shown in FIG. 6. Thus, with the switches set to "B", the system is as described earlier: the B-Type noise reduction system.

When the switches are placed in the "C" positions, the system operates as the C-Type noise reduction system just described. That is, in the high level stages 100 and 106 the overall filter quiescent corner frequency is about 375 Hz: the fixed filters 20 and variable filters 22 all have corner frequencies of about 375 Hz (quiescent corner frequencies in the case of the variable filters), the overshoot suppression is set 3 dB higher, and the control circuit smoothing time constants are set to one-half those used in the B-Type system. Also, the low level stages are placed in cascade. In FIG. 65 the low level stages 102 and 104 have noise reduction side paths N₂ in which the fixed filter 20 is omitted and the variable filter 22' has a quiescent corner frequency of about 375 Hz.

FIGS. 66 and 67 are similar to FIGS. 19 and 20, respectively: they show techniques for switching a single pair of C-Type devices between record and play (i.e., compressor and expander) modes. These Figures add the spectral skewing, spectral de-skewing, antisaturation and complementary antisaturation networks (blocks 70, 72, 76 and 78, respectively) to the arrangement of FIGS. 19 and 20. Those blocks and the noise reduction side paths N₁ and N₂ are as described in connection with FIG. 50.

For maximum circuit economy it is sometimes advantageous to switch the spectral skewing network components between the skewing and de-skewing functions, and similarly with the anti-saturation network components. Such switching can be further incorporated, if desired.

FIGS. 68 and 69 are similar to FIGS. 66 and 67 but further include switching from B-Type to C-Type such as shown in FIG. 65. Thus, in FIGS. 68 and 69 a single pair of devices are compressor/expander mode switchable and B-Type/C-Type characteristic mode switchable.

I claim:

1. A circuit for modifying the dynamic range of an input signal, comprising first circuit means with a bi-linear characteristic composed of a low level portion of substantially constant gain up to a threshold, an intermediate level portion, above the threshold, of changing gain providing a maximum compression ratio or expansion ratio, and a high level portion of substantially constant gain different from the gain of the low level portion, and at least one second circuit means, which also has a bi-linear characteristic within a frequency range common to the circuit means, in series with the first circuit means thereby to provide an overall characteristic which is also bi-linear, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with an overall maximum compression or expansion ratio which is substantially no greater than that of any single circuit means, by virtue of the staggering.

2. A circuit according to claim 1 further comprising switching means for selecting the compression or expansion mode of the circuit, said switching means selectively effecting signal connections whereby each circuit means is switched to its respective compression or expansion configuration and the arrangement of series circuit means is reversed in one mode with respect to the other.

3. A circuit according to claim 1, wherein the circuit means are compressors, each establishing its own characteristic, and the thresholds are set to different values in order to stagger the intermediate level portions of the characteristics of the circuit means.

4. A circuit according to claim 3 wherein the threshold of each successive compressor circuit means is lower than the threshold of the previous circuit means.

5. A circuit according to claim 3 wherein the threshold of each successive compressor circuit means is higher than the threshold of the previous circuit means.

6. A circuit according to claim 1, wherein the circuit means are expanders, each establishing its own characteristic, and the thresholds are set to different values in order to stagger the intermediate level portions of the characteristics of the circuit means.

7. A circuit according to claim 6 wherein the threshold of each successive expander circuit means is higher than the threshold of the previous circuit means.

8. A circuit according to claim 6 wherein the threshold of each successive expander circuit means is lower than the threshold of the previous circuit means.

9. A circuit according to any of claims 1, 3 or 6 wherein the falling flank of the compression or expansion ratio of each of the circuit means overlaps the rising flank of the compression or expansion ratio of another of the circuit means to the extent that the overall compression or expansion ratio in the overlapping region does not substantially exceed the maximum compression or expansion ratio of the adjacent circuit means.

10. A circuit accordance to claim 9, wherein each of the circuit means has a maximum compression or inverse expansion ratio of substantially 2:1 and the maximum ratio for the complete circuit arrangement does not substantially exceed 2:1.

11. A circuit according to claim 9, wherein the maximum compression or inverse expansion ratio for the complete circuit arrangement does not exceed about $1\frac{1}{4}$ times the maximum ratio of any one of the circuit means.

12. A circuit according to claim 10, wherein the maximum compression or inverse expansion ratio for the complete circuit arrangement does not exceed about $1\frac{1}{4}$ times the maximum ratio of any one of the circuit means.

13. A circuit according to any of claims 1, 3 or 6, wherein at least one of the circuit means includes variable filter means providing a boost or cut in a high or low frequency region of the signal band, and responsive to signals in that region to cause the filter means corner frequency to slide in the sense narrowing the boosted or cut region.

14. A circuit according to claim 13 wherein one of the circuit means includes said variable filter means, and wherein there is one further circuit means including a plurality of band pass filters each in combination with a limiting device.

15. A circuit according to claim 13, for audio signals, wherein the or each variable filter means includes an amplifying, rectifying, and smoothing control circuit providing a control signal to a controlled impedance device of the filter means to effect the sliding of the filter corner frequency.

16. A circuit according to claim 15, wherein each circuit means includes variable filter means.

17. A circuit according to claim 16, wherein the control circuits of the variable filter means have different gains such as to establish the different thresholds of the circuit means.

18. A circuit according to claim 16 wherein the quiescent corner frequencies of the variable filter means are substantially the same.

19. A circuit according to claim 18, wherein the boost or cut is provided in a high frequency region and the quiescent corner frequencies of the variable filter means are in the region of 375 Hz.

20. A circuit according to claim 19, wherein there are two bi-linear circuit means, each having a low level gain of substantially 10 dB.

21. A circuit according to claim 20 further comprising switching means for selecting the type characteristic mode of operation of the circuit, said switching means selectively effecting signal connections whereby said two series bi-linear circuit means comprise the respective compressor or expander in a first mode of operation and a single bi-linear circuit means comprises the respective compressor or expander in a second mode of operation.

22. A circuit according to claim 21 wherein the switching means further selects the quiescent corner frequency of the variable filter means of said single bi-linear circuit means, said switching means selectively effecting signal connections whereby in said first mode of operation the quiescent corner frequency of the variable filter means is in the region of 375 Hz and in the second mode of operation the quiescent corner frequency of the variable filter means is in the region of 1500 Hz.

23. A circuit according to claim 21 wherein said variable filter means of said single bi-linear circuit means includes a variable filter and a fixed filter, and wherein the switching means further selects the corner frequency of the fixed filter and the quiescent corner frequency of the variable filter, said switching means selectively effecting signal connections whereby in said first mode of operation the corner frequency of the fixed filter and the quiescent corner frequency of the variable filter are each in the region of 375 Hz and in said second mode of operation the corner frequency of the fixed filter is in the region of 1500 Hz and the quiescent corner frequency of the variable filter is in the region of 750 Hz.

24. A circuit according to claim 23 wherein the threshold of the second bi-linear circuit means is lower than that of first bi-linear circuit means in the case of a compressor circuit and the reverse order in the case of an expander circuit and wherein said single bi-linear circuit means in said second mode of operation is the first circuit means in the case of a compressor circuit and the second compressor means in the case of the expander circuit.

25. A circuit according to claim 24 wherein each circuit means includes overshoot suppression means having a threshold level, wherein said switching means further selects the overshoot threshold level of said first bi-linear circuit means, said switching means selectively effecting signal connections whereby in said second mode of operation said overshoot threshold level is reduced by about 3 dB.

26. A circuit according to claim 16 wherein in at least one circuit means the variable filter means includes a variable filter in series with a fixed filter.

27. A circuit according to claim 26, wherein the boost or cut is provided in a high frequency region and the or each fixed filter has a corner frequency in the region of 375 Hz.

28. A circuit according to claim 27, wherein at least two circuit means have variable filter means in series with a fixed filter and that the corner frequencies of the fixed filters are substantially the same.

29. A circuit according to any of claims 1, 3 or 6, wherein at least one of the circuit means is a dual-path circuit comprising a main path which is linear with respect to dynamic range, a combining circuit in the main path, and a further path which has its input coupled to the input or output of the main path and its output coupled to the combining circuit, the further path providing a signal which, at least in an upper part of the frequency band, boosts or bucks the main path signal by way of the combining circuit, but which is so limited that, in the upper part of the input dynamic range, the further path signal is limited to a value smaller than the main path signal.

30. A circuit according to claim 1 wherein the approximate threshold level T of a given circuit means is determined by the relationship $$T = F - CG/(C-1),$$

where F is the finishing point of the circuit means, whereat the intermediate level portion ends and the high level portion starts, C is the maximum compression ratio of the circuit means and G is the gain of the circuit means.

31. A circuit according to any of claims 1, 3 or 6, wherein the circuit arrangement is for modifying the dynamic range of audio signals and wherein each circuit means includes an overshoot suppressor having a threshold level, the threshold levels being staggered among the circuit means such as to provide a reduction in the overshoots of the overall circuit arrangement.

32. A circuit according to claim 31 wherein the threshold of the overshoot suppressor of each successive compressor circuit means is lower than that of the previous circuit means and that the threshold of the overshoot suppressor of each successive expander circuit means is higher than that of the previous circuit means.

33. A circuit according to claim 31, wherein the threshold of the overshoot suppressor of each successive compressor circuit means is higher than that of the previous circuit means and that the threshold of the overshoot suppressor of each successive expander circuit means is lower than that of the previous circuit means.

34. A circuit according to any of claims 1, 3 or 6, wherein there are three bi-linear circuits means, each having a low level gain of substantially 8 dB.

35. A circuit according to claim 29 further comprising frequency dependent circuit means connected in the main path of at least one dual-path circuit means for providing signal attenuation or boosting in a selected part of the frequency band.

36. A circuit according to claim 35 which, in the case of a compressor, provides signal attenuation and, in the case of an expander, provides signal boosting.

37. A noise reduction system, comprising
compressor means comprising first circuit means with a bi-linear characteristic composed of a low level portion of substantially constant gain up to a threshold, an intermediate level portion, above the threshold, of changing gain providing a maximum compression ratio, and a high level portion of substantially constant gain different from the gain of the low level portion, and at least one second circuit means, which also has a bi-linear characteristic within a frequency range common to the circuit means, in series with the first circuit means thereby to provide an overall compressor characteristic which is also bi-linear, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with an overall maximum compression ratio which is substantially no greater than that of any single circuit means, by virtue of the staggering, and expander means including first circuit means with a bi-linear characteristic composed of a low level portion of substantially constant gain up to a threshold, an intermediate level portion, above the threshold, of changing gain providing a maximum expansion ratio, and a high level portion of substantially constant gain different from the gain of the low level portion, and at least one second circuit means, which also has a bi-linear characteristic within a frequency range common to the circuit means, in series with the first circuit means thereby to provide an overall expander characteristic which is also bi-linear, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with an overall maximum expansion ratio which is substantially no greater than that of any single circuit means, by virtue of the staggering.

38. A noise reduction system according to claim 37 wherein the threshold of each successive compressor circuit means is lower than the threshold of the previous circuit means and the threshold of each successive expander circuit means is higher than the threshold of the previous circuit means.

39. A noise reduction system according to claim 37, wherein the threshold of each successive compressor circuit means is higher than the threshold of the previous circuit means and the threshold of each successive expander circuit means is lower than the threshold of the previous circuit means.

40. A noise reduction system according to any of claims 37, 38, or 39 wherein the compressor means and the expander means are the same circuit in combination with switching means for selecting the compression or expansion mode of the circuit, said switching means selectively effecting signal connections whereby each circuit means is switched to its respective compression or expansion configuration and the arrangement of series circuit means is reversed in one mode with respect to the other.

41. A noise reduction system according to claim 37 wherein at least one of the circuit means in each of the compressor means and in the expander means is a dual-path circuit each having a main path which is linear with respect to dynamic range, a combining circuit in the main path, and a further path which has its input coupled to the input or output of the main path and its output coupled to the combining circuit, the further path providing a signal which, at least in a part of the frequency band, boosts the main path signal in the compressor means and bucks the main path signal in the expander means, by way of the combining circuit, but which in each case is so limited that, in the upper part of the input dynamic range, the further path signal is limited to a value smaller than the main path signal, the combination further comprising frequency dependent means connected in the main path of at least one dual-path circuit means in each of the compressor means and the expander means for providing in the case of the compressor means, signal attenuation in at least a portion of said part of the frequency band, and, in the case of the expander means, a complementary signal boosting in at least said portion of said part of the frequency band.

42. A signal compressor for use with complex signals in a signal transmission system in which the compressed signal is applied to a transmission channel which in turn feeds an expander, wherein the relative signal amplitude response in the transmission channel between the compressor and expander is uncertain in the region of the high and/or low frequency extremes of the useful bandwidth of said complex signals applied to the compressor, said compressor having its compression controlled by control circuitry which responds to the frequency and amplitude characteristics of said complex signals, the compressor comprising filter means for skewing the spectral balance of signals in said compressor, in an abrupt manner with respect to frequency, in a frequency region in which the ear can hear signal components, if present, but in which it has a reduced sensitivity to low level noise components, to substantially reduce the influence of said high and/or low frequency extreme region components of said complex signals in controlling said control circuitry and to attenuate said high and/or low frequency extreme region components, respectively, in said compressed signal, whereby the compressor action is significantly less susceptible to the influence of complex signals beyond the abrupt roll-off frequency and adverse effects on complementarity caused by errors in amplitude response that occur between the compressor and expander are suppressed.

43. A signal compressor according to claim 42 further comprising band limitation filter means for attenuating at least a portion of the frequency spectrum of signals applied to the compressor that are outside the useful bandwidth of said complex signals.

44. A signal compressor according to claim 42 wherein the compressor includes variable filter means providing a boost or cut in a high or low frequency region and wherein said control circuitry is responsive to signals in that region to cause the filter means corner frequency to slide in the sense narrowing the boosted or cut region.

45. A signal compressor according to claim 42 wherein said filter means comprises at least one band rejecting network having at least one steep drop-off with a band attenuation characteristic located to attenuate said high and/or low frequency extreme region components.

46. A signal compressor according to claim 45 wherein said at least one band rejecting network has one or more drop offs of about 12 dB/octave to 18 dB/octave.

47. A signal compressor according to claims 45 or 46, wherein said at least one network is located in the input signal path to said compressor.

48. A signal compressor according to claim 45 wherein the control circuitry includes at least one band rejecting network and further comprises at least one further band rejecting network located in the output signal path of said compressor.

49. A signal compressor according to claim 45, wherein said at least one band rejecting network comprises a low pass filter in the high frequency extreme region and/or a high pass filter in the low frequency extreme region.

50. A signal compressor according to claim 45, wherein said at least one band rejecting network comprises a notch filter in the high and/or low frequency extreme region.

51. A signal compressor according to claim 45, wherein said at least one band rejecting network comprises a shelf network in the high and/or low frequency extreme region.

52. A signal compressor according to any of claims 49, 50 or 51 wherein the band rejecting network or networks have a depth of 6–10 dB or more in said high and/or low frequency extreme regions.

53. A signal compressor according to claims 42 or 45 in combination with an expander for expanding the dynamic range of signals compressed by said signal compressor and received via a transmission channel, the expander including circuit means for boosting the attenuated high and/or low frequency extreme region components to effect a substantially flat frequency response.

54. A signal compressor and expander according to claim 15 wherein the compressor and expander each further comprise band limitation filter means for attenuating at least a portion of the frequency spectrum of signals applied to the respective compressor and expander that are outside the useful bandwidth of said complex signals.

55. A signal compressor according to claim 45 wherein the compressor has a main signal path which is linear with respect to dynamic range, a combining circuit in the main path, and a further path which has its input coupled to the input or output of the main path and its output coupled to the combining circuit, the further path providing a signal which boosts the main path signal by way of the combining circuit, but which is limited to a value smaller than the main path signal, the filter means being located only in the further path of the compressor.

56. A signal compressor according to claim 55 wherein the filter means comprises at least one network located in the input signal path of the further path.

57. A signal compressor according to claim 55 wherein the control circuitry is in said further path and wherein said at least one network comprises at least one band rejecting network included in said control circuitry and at least one further band rejecting network located in the output signal path of said further path.

58. A signal compressor according to claim 56, wherein said at least one network comprises a low pass filter in the high frequency extreme region and/or a high pass filter in the low frequency extreme region.

59. A signal compressor according to claim 56, wherein said at least one network comprises a notch filter in the high and/or low frequency extreme region.

60. A signal compressor according to claim 56, wherein said at least one network comprises a shelf network in the high and/or low frequency extreme region.

61. A signal compressor according to claim 57, wherein said band rejecting networks comprise a low pass filter in the high frequency extreme region and/or a high pass filter in the low frequency extreme region.

62. A signal compressor according to claim 57, wherein said band rejecting networks comprise a notch filter in the high and/or low frequency extreme region.

63. A signal compressor according to claim 57, wherein said band rejecting networks comprise a shelf network in the high and/or low frequency extreme region.

64. A signal compressor according to claim 56 in combination with an expander for expanding the dynamic range of signals compressed by said compressor means and received via a transmission channel, the expander including circuit means for boosting the attenuated high and/or low frequency extreme region components to effect a substantially flat frequency response.

65. A signal compressor according to claim 57 in combination with an expander for expanding the dynamic range of signals compressed by said compressor means and received via a transmission channel, the expander including circuit means for boosting the attenuated high and/or low frequency extreme region components to effect a substantially flat frequency response.

66. A signal expander for use in receiving compressed complex signals applied to a transmission channel by a compressor, wherein the relative signal amplitude response in the transmission channel between the compressor and expander is uncertain in the region of the high and/or low frequency extremes of the useful bandwidth of signals applied to the compressor, said compressor having its compression controlled by circuitry which responds to the frequency and amplitude characteristics of said complex signals, the compressor including filter means for skewing the spectral balance of signals in said compressor to substantially reduce the influence of said high and/or low frequency extreme region components in controlling said control circuitry and to attenuate said high and/or low frequency extreme region components, respectively, in said compressed signal, said expander comprising circuit means for boosting the attenuated high and/or low frequency extreme region components, respectively, to effect a substantially flat overall compressor/expander frequency response while suppressing the adverse effects on complementarity caused by errors in amplitude response that occur between the compressor and expander.

67. A signal expander according to claim 66 wherein said circuit means has a characteristic substantially complementary to that of at least one band rejecting network with one or more drop offs of about 12 dB/octave to 18 dB/octave.

68. A signal expander according to claim 66 wherein said circuit means has a characteristic substantially complementary to a low pass filter in the high frequency extreme region and/or a high pass filter in the low frequency extreme region.

69. A signal expander according to claim 66 wherein said circuit means has a characteristic substantially complementary to a notch filter in the high and/or low frequency extreme region.

70. A signal expander according to claim 66 wherein said circuit means comprises a shelf network in the high and/or low frequency extreme region.

71. A signal expander according to claim 66 further comprising band limitation filter means for attenuating at least a portion of the frequency spectrum of signals applied to the expander that are outside the useful bandwidth of said complex signals.

72. A compressor having level dependent equalization for use in a signal transmission system in which the compressed signals are applied to a transmission channel which is susceptible to high level saturation or overload effect in part of the frequency band in which the compressor compresses the dynamic range of signals, comprising a main signal path which is linear with respect to dynamic range, a combining circuit in the main path, and a further path which has its input coupled to the input or output of the main path and its output coupled to the combining circuit, the further path providing a signal which, at least in a part of the frequency band, boosts the main path signal by way of the combining circuit, but which is so limited that, in the upper part of the input dynamic range, about −10 dB to +10 dB relative to a reference level, the further path signal is limited to a value which is small relative to the main path signal, and frequency dependent circuit means connected in that portion of the main path between the combining circuit and the input or the output of the main path where the further path has its input coupled for providing in said portion of the main path and, for signals in the upper part of the input dynamic range, in the compressor characteristic at high levels a response characteristic for substantially reducing the saturation or overload effect in at least part of the frequency band in which the effect occurs and in which the further path boosts the main path signal, the overall response characteristic of said compressor for signals in said upper part of the input dynamic range being substantially the same as that of said frequency dependent circuit means response characteristic.

73. A compressor according to claim 72 wherein the compressor treats signals in the upper part of the audio frequency band, wherein the frequency dependent circuit means provides attenuation in at least a portion of said upper part of the audio frequency band.

74. An audio compressor according to claim 73 wherein the compressor also treats signals in the lower part of the audio frequency band, wherein the frequency dependent circuit means also provides attenuation in at least a portion of said lower part of the audio frequency band.

75. An expander complementary to a compressor having level dependent equalization for use in a signal transmission system in which the compressed signals are applied to a transmission channel which is susceptible to high level saturation or overload effect in part of the frequency band in which the compressor and expander alter the dynamic range of signals, the expander fed by said transmission channel comprising a main signal path which is linear with respect to dynamic range, a combining circuit in the main path, and a further path which has its input coupled to the input or output of the main path and its output coupled to the combining circuit, the further path providing a signal which, at least in a part of the frequency band, bucks the main path signal by way of the combining circuit, but which is so limited that, in the upper part of the input dynamic range, about −10 dB to +10 dB relative to a reference level, the further path signal is limited to a value which is small relative to the main path signal, and frequency dependent circuit means connected in that portion of the main path between the combining circuit and the input or the output of the main path where the further path has its input coupled for providing in said portion of the main path and, for signals in the upper part of the input dynamic range, in the expander characteristic at high levels a response characteristic substantially inverse to that required in the compressor to substantially reduce the saturation or overload effect in at least part of the frequency band in which the effect occurs and in which the further path bucks the main path signal, the overall response characteristic of said expander for signals in said upper part of the input dynamic range being substantially the same as that of said frequency dependent circuit means response characteristic in order to complement the level dependent equalization of said compressor.

76. An expander according to claim 75 wherein the expander treats signals in the upper part of the audio frequency band, wherein the frequency dependent circuit means provides a boost in at least a portion of said upper part of the audio frequency band.

77. An audio expander according to claim 76 wherein the expander also treats signals in the lower part of the audio frequency band, wherein the frequency dependent circuit means also provides a boost in at least a portion of said lower part of the audio frequency band.

78. A noise reduction system comprising a compressor having level dependent equalization for use in a signal transmission system in which the compressed signals are applied to a transmission channel which is susceptible to high level saturation or overload effect in part of the frequency band in which the compressor compresses the dynamic range of signals, and a complementary expander fed by said transmission channel, each having a main signal path which is linear with respect to dynamic range, a combining circuit in the main path, and a further path which has its input coupled to the input or output of the main path and its output coupled to the combining circuit, the further path providing a signal which, at least in a part of the frequency band boosts the main path signal in the compressor, and bucks the main path signal in the expander, by way of the combining circuit, but which is in each case so limited that, in the upper part of the input dynamic range, about −10 dB to +10 dB relative to a reference level, the further path signal is limited to a value which is small relative to the main path signal, and frequency dependent circuit means connected in that portion of each main path between the combining circuit and the input or the output of the main path where the further path has its input coupled for providing in said portion of the main path in the compressor and, for signals in the upper part of the input dynamic range, in the compressor characteristic at high levels a response characteristic for substantially reducing the saturation or overload effect in at least part of the frequency band in which the effect occurs and in which the further path boosts the main path signal, the overall response characteristic of said compressor for signals in said upper part of the input dynamic range being substantially the same as that of said frequency dependent circuit means response characteristic in the compressor and for providing in said portion of the main path in the expander, and for signals in the upper part of the input dynamic range, in the expander characteristic at high levels a response characteristic substantially inverse to that of the frequency dependent circuit means in the compressor, the overall response characteristic of said expander for signals in said upper part of the input dynamic range being substantially the same as that of said frequency dependent circuit means response characteristic in the expander in order to complement the level dependent equalization of said compressor.

79. A noise reduction system according to claim 78 wherein the compressor and expander treat signals in the upper part of the audio frequency band, wherein the frequency dependent circuit means provides attenuation in the compressor and a complementary inverse boost in the expander in at least a portion of said upper part of the audio frequency band.

80. An audio noise reduction system according to claim 79 wherein the compressor and expander also treat signals in the lower part of the audio frequency band, wherein the frequency dependent circuit means also provide attenuation in the compressor and a complementary inverse boost in the expander in at least a portion of said lower part of the audio frequency band.

81. A signal compressor for use with complex signals in a signal transmission system in which the compressed signal is applied to a transmission channel which in turn feeds an expander, wherein the relative signal amplitude response in the transmission channel between the compressor and expander is uncertain in the region of the high and/or low frequency extremes of the useful bandwidth of said complex signals applied to the compressor, said compressor having its compression controlled by control circuits which respond to the frequency and amplitude characteristics of said complex signals, said compressor comprising first circuit means with a bi-linear characteristic composed of a low level portion of substantially constant gain up to a threshold, an intermediate level portion, above the threshold, of changing gain providing a maximum compression ratio or expansion ratio, and a high level portion of substantially constant gain different from the gain of the low level portion, and at least one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum compression or expansion ratio which is substantially no greater than that of any single circuit means, by virtue of the staggering, said compressor further comprising filter means for affecting the spectral balance of signals in said compressor to substantially exclude said high and/or low frequency extreme region components of said complex signals from controlling said control circuits and to attenuate said high and/or low frequency extreme region components in said compressed signal.

82. A signal compressor according to claim 81 wherein at least one of the circuit means is a dual-path circuit comprising a main path which is linear with respect to dynamic range, a combining circuit in the main path, and a further path which has its input coupled to the input or output of the further path and its output coupled to the combining circuit, the further path providing a signal which, at least in a part of the frequency band, boosts the main path signal by way of the combining circuit, but which is so limited that, in the upper part of the input dynamic range, the further path signal is smaller than the main path signal.

83. A signal compressor according to claim 82 further comprising frequency dependent circuit means connected in the main path of at least one dual path circuit means for providing signal attenuation in at least a portion of said part of the frequency band.

84. A signal compressor according to any of claims 81, 82 or 83 wherein at least one of the circuit means includes variable filter means providing a boost or cut in a high or low frequency region of the signal band, and responsive to signals in that region to cause the filter means corner frequency to slide in the sense narrowing the boosted or cut region.

85. A signal compressor according to claim 84, for audio signals, wherein the or each variable filter means includes an amplifying, rectifying and smoothing control circuit providing a control signal to a controlled impedance device of the filter means to effect the sliding of the filter corner frequency.

86. A signal compressor according to claim 85, wherein each circuit means includes variable filter means.

87. A signal compressor according to claim 86, wherein the control circuits of the variable filter means have different gains such as to establish the different thresholds of the circuit means.

88. A signal compressor according to claim 86 wherein the quiescent corner frequencies of the variable filter means are substantially the same.

89. A signal compressor according to claim 88, wherein the boost or cut is provided in a high frequency region and the quiescent corner frequencies of the variable filter means are in the region of 375 Hz.

90. A signal compressor according to claim 89, wherein there are two bi-linear circuit means, each having a low level gain of substantially 10 dB.

91. A signal compressor according to claim 90 further comprising switching means for selecting the type of operation of the circuit, said switching means selectively effecting signal connections whereby said two series bi-linear circuit means comprise the compressor in a first mode of operation and a single bi-linear circuit means comprises the compressor in a second mode of operation.

92. A signal compressor according to claim 91 wherein the switching means further selects the quiescent corner frequency of the variable filter means of said single bi-linear circuit means, said switching means selectively effecting signal connections whereby in said first mode of operation the quiescent course frequency of the variable filter means is in the region of 375 Hz and in the second mode of operation the quiescent corner frequency of the variable filter means is in the region of 1500 Hz.

93. A signal compressor according to claim 91 wherein said variable filter means of said single bi-linear circuit means includes a variable filter and a fixed filter, and wherein the switching means further selects the corner frequency of the fixed filter and the quiescent corner frequency of the variable filter, said switching means selectively effecting signal connections whereby in said first mode of operation the corner frequency of the fixed filter and the quiescent corner frequency of the variable filter are each in the region of 375 Hz and in said second mode of operation the corner frequency of the fixed filter is in the region of 1500 Hz and the quiescent corner frequency of the variable filter is in the region of 750 Hz.

94. A signal compressor according to claim 93 wherein the threshold of the second bi-linear circuit means is lower than that of the first bi-linear circuit means and wherein said single bi-linear circuit means in the said second mode of operation is the first circuit.

95. A circuit according to claim 94 wherein each circuit means includes overshoot suppression means having a threshold level, wherein said switching means further selects the overshoot threshold level of said first bi-linear circuit means, said switching means selectively effecting signal connections whereby in said second mode of operation said overshoot threshold level is reduced by about 3 dB.

96. A signal compressor according to claim 86 wherein in at least one circuit means the variable filter means includes a variable filter in series with a fixed filter.

97. A signal compressor according to claim 96, wherein the boost or cut is provided in a high frequency region and the or each fixed filter has a corner frequency in the region of 375 Hz.

98. A signal compressor according to any of claims 81, 82 or 83 wherein there are three bi-linear circuit means, each having a low level gain of substantially 8 dB.

99. A signal compressor according to any of claims 81, 82 or 83 wherein said filter means comprises at least one band rejecting network having at least one steep drop-off with a band attenuation characteristic located to attenuate said high and/or low frequency extreme regions.

100. A signal compressor according to claim 99 wherein said at least one band rejecting network has one or more drop offs of about 12 dB/octave to 18 dB/octave.

101. A signal compressor according to claim 99, wherein said at least one network is located in the input signal path to said compressor.

102. A signal compressor according to claim 100, wherein said at least one network is located in the input signal path to said compressor.

103. A signal compressor according to claim 99 including a control circuit responsive to the frequency and amplitude of applied signals for controlling compression, further comprising at least one band rejecting network located in said control circuit and at least one further band rejecting network located in the output signal path of said compressor.

104. A signal compressor according to claim 100 including a control circuit responsive to the frequency and amplitude of applied signals for controlling compression, further comprising at least one band rejecting network located in said control circuit and at least one further band rejecting network located in the output signal path of said compressor.

105. A signal compressor according to claim 99, wherein said at least one band rejecting network comprises a low pass filter in the high frequency extreme region and/or a high pass filter in the low frequency extreme region.

106. A signal compressor according to claim 99, wherein said at least one band rejecting network comprises a notch filter in the high and/or low frequency extreme region.

107. A signal compressor according to claim 99, wherein said at least one band rejecting network comprises a shelf network in the high and/or low frequency extreme region.

108. A signal compressor according to claim 105 wherein the band rejecting network or networks have a depth of 6–10 dB or more in said high and/or frequency extremes.

109. A signal compressor according to claim 106 wherein the band rejecting network or networks have a depth of 6–10 dB or more in said high and/or low frequency extremes.

110. A signal compressor according to claim 107 wherein the band rejecting network or networks have a depth of 6–10 dB or more in said high and/or low frequency extremes.

111. A signal compressor according to claims 81, 82 or 83 in combination with an expander for expanding the dynamic range of signals compressed by said compressor means and received via a transmission channel, the expander comprising circuit means for boosting the attenuated high and/or low frequency extreme regions to substantially effect a flat frequency response.

112. A signal compressor and an expander according to claim 83 wherein the expander includes first circuit means with a bi-linear characteristic, and at least one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum expansion ratio which is substantially no greater than that of any single circuit means, by virtue of the staggering, the expander further including frequency dependent circuit means connected in the main path for providing a complementary signal boost in a selected part of the frequency band.

113. A signal compressor and expander according to claim 112 wherein the compressor and expander are the same circuit in combination with switching means for selecting the compression or expansion mode of the circuit, said switching means selectively effecting signal connections whereby each circuit means is switched to its respective compression or expansion configuration, the arrangement of series circuit means is reversed in one mode with respect to the other, and the frequency dependent circuit means connected in the main path is switched from its compressor characteristic to its complementary expander characteristic.

114. A signal compressor according to claim 83 in combination with an expander for expanding the dynamic range of signals compressed by said compressor means and received via a transmission channel, wherein the expander comprises at least one dual path circuit in which the further path bucks the main path signal, the combination further comprising frequency dependent circuit means connected in the main path for providing a complementary signal boost in said selected part of the frequency band, and further circuit means for boosting the attenuated high and/or low frequency extreme regions to effect a substantially flat overall compressor/expander frequency response.

115. A signal compressor and an expander according to claim 114 wherein the expander includes first circuit means with a bi-linear characteristic, and at leaast one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum expansion ratio which is substantially no greater than that of any single circuit means, by virtue of the staggering.

116. A signal compressor and expander according to claim 115 wherein the compressor and expander are the same circuit in combination with switching means for selecting the compression or expansion mode of the circuit, said switching means selectively effecting signal connections whereby each circuit means is switched to its respective compression or expansion configuration, the arrangement of series circuit means is reversed in one mode with respect to the other and the frequency dependent circuit means connected in the main path is switched from its compressor characteristic to its complementary expander characteristic.

117. A signal expander for use with complex signals in receiving a compressed signal applied to a transmission channel by a compressor, wherein the relative signal amplitude response in the transmission channel between the compressor and expander is uncertain in the region of the high and/or low frequency extremes of the useful bandwidth of said complex signals applied to the compressor, said compressor having its compression controlled by control circuits which respond to the frequency and amplitude characteristics of said complex signals, the compressor comprising filter means for affecting the spectral balance of signals in said compressor to substantially exclude said high and/or low frequency extreme region components from controlling said control circuits and to attenuate said high and/or low frequency extreme region components in said compressed signal, said expander comprising first circuit means with a bi-linear characteristic, and at least one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum expansion ratio which is substantially no greater than that of any single circuit means, by virtue of the staggering, and further circuit means for boosting the attenuated high and/or low frequency extreme regions to effect a substantially flat frequency response.

118. A signal expander according to claim 117 wherein at least one of the circuit means is a dual-path circuit comprising a main path which is linear with respect to dynamic range, a combining circuit in the main path, and a further path which has its input coupled to the input or output of the further path and its output coupled to the combining circuit, the further path providing a signal which, at least in a part of the frequency band, boosts the main path signal by way of the combining circuit, but which is so limited that, in the upper part of the input dynamic range, the further path signal is smaller than the main path signal, and frequency dependent means connected in the main path for providing a signal boost in a portion of said part of the frequency band.

119. A signal expander according to claims 117 or 118 wherein said further circuit means has a characteristic substantially complementary to that of at least one band rejecting network with one or more drop offs of about 12 dB/octave to 18 dB/octave.

120. A signal expander according to claims 117 or 118 wherein said further circuit means has a characteristic substantially complementary to a low pass filter in the high frequency extreme region and/or a high pass filter in the low frequency extreme region.

121. A signal expander according to claims 117 or 118 wherein said further circuit means has a characteristic substantially complementary to a notch filter in the high and/or low frequency extreme region.

122. A signal expander according to claims 117 or 118 wherein said further circuit means comprises a shelf network in the high and/or low frequency extreme region.

123. A signal expander according to claim 118 wherein at least one of the circuit means includes variable filter means providing a boost or cut in a high or low frequency region of the signal band, and responsive to signals in that region to cause the filter means corner frequency to slide in the sense narrowing the boosted or cut region.

124. A signal expander according to claim 123, for audio signals, wherein at least one of the circuit means includes variable filter means providing a boost or cut in a high or low frequency region of the signal band, and responsive to signals in that region to cause the filter means corner frequency to slide in the sense narrowing the boosted or cut region.

125. A signal expander according to claim 124 wherein each circuit means includes variable filter means.

126. A signal expander according to claim 125 wherein the control circuits of the variable filter means have different gains such as to establish the different thresholds of the circuit means.

127. A signal expander according to claim 126 wherein the quiescent corner frequencies of the variable filter means are substantially the same.

128. A signal expander according to claim 127 wherein the boost or cut is provided in a high frequency region and the quiescent corner frequencies of the variable filter means are in the region of 375 Hz.

129. A signal expander according to claim 128 wherein there are two bi-linear circuit means, each having a low level gain of substantially 10 dB.

130. A signal expander according to claim 129 wherein in at least one circuit means the variable filter means includes a variable filter in series with a fixed filter.

131. A signal expander according to claim 130, wherein the boost or cut is provided in a high frequency region and the or each fixed filter has a corner frequency in the region of 375 Hz.

132. A signal expander according to claim 129 further comprising switching means for selecting the type of operation of the circuit, said switching means selectively effecting signal connections whereby said two series bi-linear circuit means comprise the expander in a first mode of operation and a single bi-linear circuit means comprises the expander in a second mode of operation.

133. A signal expander according to claim 132 wherein the switching means further selects the quiescent corner frequency of the variable filter means of said single bi-linear circuit means, said switching means selectively effecting signal connections whereby in said first mode of operation the quiescent corner frequency of the variable filter means is in the region of 375 Hz and in the second mode of operation the quiescent corner frequency of the variable filter means is in the region of 1500 Hz.

134. A signal expander according to claim 132 wherein said variable filter means of said single bi-linear circuit means includes a variable filter and a fixed filter, and wherein the switching means further selects the corner frequency of the fixed filter and the quiescent corner frequency of the variable filter, said switching means selectively effecting signal connections whereby in said first mode of operation the corner frequency of the fixed filter and the quiescent corner frequency of the variable filter are each in the region of 375 Hz and in said second mode of operation the corner frequency of the fixed filter is in the region of 1500 Hz and the quiescent corner frequency of the variable filter is in the region of 750 Hz.

135. A signal expander according to claim 134 wherein the threshold of the first bi-linear circuit means is lower than that of the second bi-linear circuit means and wherein said single bi-linear circuit means in the said second mode of operation is the second circuit means.

136. A signal expander according to claim 135 wherein each circuit means includes overshoot suppression means having a threshold level, wherein said switching means further selects the overshoot threshold level of said first bi-linear circuit means, said switching means selectively effecting signal connections whereby in said second mode of operation said threshold overshoot level is reduced by about 3 dB.

137. A noise reduction system, comprising
a signal compressor for use with complex signals in a signal transmission system in which the compressed signal is applied to a transmission channel which in turn feeds an expander, wherein the relative signal amplitude response in the transmission channel between the compressor and expander is uncertain in the region of the high and/or low frequency extremes of the useful bandwidth of said complex signals applied to the compressor, said compressor having its compression controlled by control circuits which respond to the frequency and amplitude characteristics of said complex signals, said compressor comprising first circuit means with a bi-linear characteristic composed of a low level portion of substantially constant gain up to a threshold, an intermediate level portion, above the threshold, of changing gain providing a maximum compression ratio or expansion ratio, and a high level portion of substantially constant gain different from the gain of the low level portion, and at least one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum compression or expansion ratio which is substantially no greater than that of any single circuit means, by virtue of the staggering, said compressor further comprising filter means for affecting the spectral balance of signals in said compressor to substantially exclude said high and/or low frequency extreme region components from controlling said control circuits and to attenuate said high and/or low frequency extreme region components in said compressed signal, and a signal expander for expanding the dynamic range of complex signals compressed by said compressor means and received via a transmission channel, the expander comprising first circuit means with a bi-linear characteristic, and at least one second circuit means, which also has a bi-linear characteristic within a frequency range common to the circuit means, in series with the first circuit means, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with a maximum expansion ratio which is substantially no greater than that of any single circuit means, by virtue of the staggering, the expander further comprising filter means for boosting the attenuated high and/or low frequency extreme regions to effect a substantially flat compressor/expander frequency response.

138. A noise reduction system according to claim 137 wherein the signal compressor and the signal expander are the same circuit in combination with switching means for selecting the compression or expansion mode of the circuit, said switching means selectively effecting signal connections whereby the circuit is switched to its respective compression or expansion configuration and the arrangement of series circuit means is reversed in one mode with respect to the other.

139. A noise reduction system according to claim 137 wherein at least one of the circuit means in the compressor is a dual-path circuit comprising a main path which is linear with respect to dynamic range, a combining circuit in the main path, and a further path which has its input coupled to the input or output of the further path and its output coupled to the combining circuit, the further path providing a signal which, at least in a part of the frequency band, boosts the main path signal by way of the combining circuit, but which is so limited that, in the upper part of the input dynamic range, the further path signal is smaller than the main path signal and wherein at least one of the circuit means in the expander is a dual-path circuit comprising a main path which is linear with respect to dynamic range, a combining circuit in the main path, and a further path which has its input coupled to the input or output of the further path and its output coupled to the combining circuit, the further path providing a signal which, at least in said part of the frequency band, bucks the main path signal by way of the combining circuit, but which is so limited that, in the upper part of the input dynamic range, the further path signal is smaller than the main path signal.

140. A noise reduction system according to claim 139 further comprising frequency dependent circuit means connected in the main path of at least one dual path circuit in the compressor and at least one dual path circuit in the expander, for providing, in the case of the compressor, signal attenuation in a selected part of the frequency band, and, in the case of the expander, signal boost in said selected part of the frequency band.

141. A noise reduction system according to claim 140 for treating signals in the upper part of the audio frequency band, wherein the frequency dependent circuit means in the compressor provides attenuation in at least a portion of said upper part of the audio frequency band and wherein the frequency dependent circuit means in the expander provides a complementary boost in at least a portion of said upper part of the audio frequency band.

142. A noise reduction system according to claim 141 wherein the signal compressor and the signal expander are the same circuit in combination with switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

143. A noise reduction system according to any of claims 137, 139 or 140 wherein each of the circuit means in the compressor and expander includes variable filter means providing a boost, in the case of the compressor, and a cut, in the case of the expander, in a high frequency region of the signal band, and responsive to signals in that region to cause the filter to slide in the sense narrowing the boosted or cut region.

144. A noise reduction system according to claim 143 wherein there are two bi-linear circuit means, each having a low level gain of substantially 10 dB in the compressor and in the expander and wherein the quiescent corner frequencies of the variable filter means are in the region of 375 Hz.

145. A noise reduction system according to claim 144 further comprising switching means for selecting the type of operation of the compressor and expander, said switching means selectively effecting signal connections whereby said two series bi-linear circuit means comprise the respective compressor or expander in a first mode of operation and a single bi-linear circuit means comprises the respective compressor or expander in a second mode of operation.

146. A noise reduction system according to claim 145 wherein the switching means further selects the quiescent corner frequency of the variable filter means of said single bi-linear circuit means, said switching means selectively effecting signal connections whereby in said first mode of operation the quiescent corner frequency of the variable filter means is in the region of 375 Hz and in the second mode of operation the quiescent corner frequency of the variable filter means is in the region of 1500 Hz.

147. A noise reduction system according to claim 145 wherein said variable filter means of said single bi-linear circuit means includes a variable filter and a fixed filter, and wherein the switching means further selects the corner frequency of the fixed filter and the quiescent corner frequency of the variable filter, said switching means selectively effecting signal connections whereby in said first mode of operation the corner frequency of the fixed filter and the quiescent corner frequency of the variable filter are each in the region of 375 Hz and in said second mode of operation the corner frequency of the fixed filter is in the region of 1500 Hz and the quiescent corner frequency of the variable filter is in the region of 750 Hz.

148. A noise reduction system according to claim 147 wherein the threshold of the second bi-linear circuit means is lower than that of first bi-linear circuit means in the case of a compressor and the reverse order in the case of an expander and wherein said single bi-linear circuit means in said second mode of operation is the first bi-linear circuit means in the case of a compressor and the second bi-linear circuit means in the case of the expander.

149. A noise reduction system according to claim 148 wherein each circuit means includes overshoot suppression means having a threshold level, wherein said switching means further selects the overshoot threshold level of said first bi-linear circuit means, said switching means selectively effecting signal connections whereby in said second mode of operation said threshold overshoot level is reduced by about 3 dB.

150. A noise reduction system according to any of claims 37, 38, 39 or 137 wherein there are the same number of bi-linear circuit means in the compressor means and the expander means and wherein each bi-linear circuit means in the expander means is complementary to the reversed order bi-linear circuit means in the compressor means.

151. A noise reduction system according to claim 145 wherein the signal compressor and the signal expander are the same circuit in combination with further switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

152. A noise reduction system according to claim 146 wherein the signal compressor and the signal expander are the same circuit in combination with further switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

153. A noise reduction system according to claim 147 wherein the signal compressor and the signal expander are the same circuit in combination with further switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

154. A noise reduction system according to claim 148 wherein the signal compressor and the signal expander are the same circuit in combination with further switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

155. A noise reduction system according to claim 149 wherein the signal compressor and the signal expander are the same circuit in combination with further switching means for selecting the compression or expansion mode of the circuit, said switching means selectively effecting signal connections whereby the circuit is switched to its respective compression or expansion configuration, the arrangement of series circuit means is reversed in one mode with respect to the other and the frequency dependent circuit means connected in the main path is switched from its compressor characteristics to its complementary expander characteristics.

156. A signal compressor for use with complex signals in a signal transmission system in which a compressed signal is applied to a transmission channel which is in turn feeds an expander, wherein the relative signal amplitude response in the transmission channel between the compressor and expander is uncertain in the region of the high and/or low frequency extremes of the useful bandwidth of said complex signals applied to the compressor, said compressor having its compression controlled by control circuits which respond to the frequency and amplitude characteristics of said complex signals, said compressor comprising a dual-path circuit comprising a main path which is linear with respect to dynamic range, a combining circuit in the main path, and a further path which has its input coupled to the input or output of the further path and its output coupled to the combining circuit, the further path providing a signal which, at least in an upper part of the frequency band, boosts the main path signal by way of the combining circuit, but which is so limited that, in the upper part of the input dynamic range, the further path signal is smaller than the main path signal, the compressor further comprising filter means for affecting the spectral balance of signals in said compressor to substantially exclude said high and/or low frequency extreme region components from controlling said control circuits and to attenuate said high and/or low frequency extreme region components in said compressed signal and frequency dependent circuit means connected in the main path for providing signal attenuation in a selected part of the frequency band.

157. A signal compressor according to claim 156 wherein said filter means comprises at least one band rejecting network having at least one steep drop-off with a band attenuation characteristic located to attenuate said high and/or low frequency extreme regions.

158. A signal compressor according to claim 157 wherein said at least one band rejecting network has one or more drop offs of about 12 dB/octave to 18 dB/octave.

159. A signal compressor according to claims 157 or 158, wherein said at least one network is located in the input signal path to said compressor.

160. A signal compressor according to claims 157 or 158 including a control circuit responsive to the frequency and amplitude of applied signals for controlling compression, further comprising by at least one band rejecting network located in said control circuit and at least one further band rejecting network located in the output signal path of said compressor.

161. A signal compressor according to claim 157, wherein said at least one band rejecting network comprises a low pass filter in the high frequency extreme region and/or a high pass filter in the low frequency extreme region.

162. A signal compressor according to claim 157, wherein said at least one band rejecting network comprises a notch filter in the high and/or low frequency extreme region.

163. A signal compressor according to claim 157, wherein said at least one band rejecting network comprises a shelf network in the high and/or low frequency extreme region.

164. A signal compressor according to any of claims 161, 162 or 163 wherein the band rejecting network or networks have a depth of 6–10 dB or more in said high and/or low frequency extremes.

165. A signal compressor according to claims 157 or 158 in combination with an expander for expanding the dynamic range of signals compressed by said compressor means and received via a transmission channel, the expander comprising a circuit arrangement for boosting the attenuated high and/or low frequency extreme regions to substantially effect a flat frequency response.

166. A signal compressor and expander according to claim 165 wherein the compressor and expander are the same circuit in combination with switching means for selecting the compression or expansion mode of the circuit, said switching means selectively effecting signal connections whereby each circuit means is switched to its respective compression or expansion configuration.

167. The combination of claim 165 wherein said expander comprises a dual-path circuit in which the further path provides a signal that bucks the main path signal, the combination further comprising frequency dependent circuit means connected in the main path for providing a complementary signal boost in said selected part of the frequency band.

168. A signal compressor and expander according to claim 167 wherein the compressor and expander are the same circuit in combination with switching means for selecting the compression or expansion mode of the circuit, said switching means selectively effecting signal connections whereby each circuit means is switched to its respective compression or expansion configuration, and the frequency dependent circuit means connected in the main path is switched from its compressor characteristics to its complementary expander characteristics.

169. A signal compressor according to claims 157 or 158 wherein the filter means is located in the further path of the compressor.

170. A signal compressor according to claim 169, wherein the filter means comprises at least one network located in the input signal path of the further path.

171. A signal compressor according to claim 169 further comprising a control circuit in said further path responsive to the frequency and amplitude of applied signals for controlling compression, wherein said at least one network comprises at least one band rejecting network located in said control circuit and at least one further band rejecting network located in the output signal path of said further path.

172. A signal compressor according to claim 170, wherein said at least one network comprises a low pass filter in the high frequency extreme region and/or a high pass filter in the low frequency extreme region.

173. A signal compressor according to claim 170, wherein said at least one network comprises a notch filter in the high and/or low frequency extreme region.

174. A signal compressor according to claim 170, wherein said at least one network comprises a shelf network in the high and/or low frequency extreme region.

175. A signal compressor according to claim 171, wherein said at least one network comprises a low pass filter in the high frequency extreme region and/or a high pass filter in the low frequency extreme region.

176. A signal compressor according to claim 171, wherein said at least one network comprises a notch filter in the high and/or low frequency extreme region.

177. A signal compressor according to claim 171, wherein said at least one network comprises a shelf network in the high and/or low frequency extreme region.

178. A signal compressor according to claim 170 in combination with an expander for expanding the dynamic range of signals compressed by said compressor means and received via a transmission channel, the expander comprising a circuit arrangement for boosting the attenuated high and/or low frequency extreme regions to substantially effect a flat frequency response.

179. A signal compressor according to claim 172 in combination with an expander for expanding the dynamic range of signals compressed by said compressor means and received via a transmission channel, the expander comprising a circuit arrangement for boosting the attenuated high and/or low frequency extreme regions to substantially effect a flat frequency response.

180. A signal expander for use in receiving compressed complex signals applied to a transmission channel by a compressor, wherein the relative signal amplitude response in the transmission channel between the compressor and expander is uncertain in the region of the high and/or low frequency extremes of the useful bandwidth of complex signals applied to the compressor, said compressor having its compression controlled by control circuits which respond to frequency and amplitude level characteristics of said complex signals, the compressor including filter means for affecting the spectral balance of signals in said compressor to substantially exclude said high and/or low frequency extreme region components of said complex signals from controlling said control circuits and to attenuate said high and/or low frequency extreme region components in said compressed signal and frequency dependent circuit means for providing a level responsive signal attenuation in a selected part of the frequency band, said expander comprising a dual path circuit having a main path which is linear with respect to dynamic range, a combining circuit in the main path, and a further path which has its input connected to the input or output of the further path and its output connected to the combining circuit, the further path providing a signal which, at least in an upper part of the frequency band, boosts the main path signal by way of the combining circuit, but which is so limited that, in the upper pert of the input dynamic range, the further path signal is smaller than the main path signal, frequency dependent circuit means connected in the main path for providing a complementary signal boosting in a selected part of the frequency band, and circuit means for boosting the attenuated high and/or low frequency extreme regions to substantially effect a flat frequency response.

181. A method for modifying the dynamic range of an input signal employing series circuits each with a bi-linear characteristic within a frequency range common to the circuits thereby to provide an overall characteristic which is also bi-linear, the bi-linear characteristic composed of a low level portion of substantially constant gain up to a threshold, an intermediate level portion, above the threshold, of changing gain providing a maximum compression ratio or expansion ratio, and a high level portion of substantially constant gain different from the gain of the low level portion, comprising staggering the intermediate level portions of the characteristics of the circuits within a frequency range common to the circuits such as to provide a change of gain over a wider range of intermediate input levels than for any of the circuits individually, and an increased difference between the gains at low and high input levels, but with an overall maximum compression or expansion ratio which is substantially no greater than that of any single circuit, by virtue of the staggering.

182. A method for use in signal compression of complex signals in a signal transmission system in which the compressed signal is applied to a transmission channel which in turn feeds an expander, wherein the relative signal amplitude response in the transmission channel between the compressor and expander is uncertain in the region of the high and/or low frequency extremes of the useful bandwidth of said complex signals applied to the compressor, said compressor having its compression controlled by control circuitry which responds to the frequency and amplitude characteristics of said complex signals, comprising skewing the spectral balance of signals in said compressor, in an abrupt manner with respect to frequency, in a frequency region in which the ear can hear signal components, if present, but in which it has reduced sensitivity to low level noise components, to substantially reduce the influence of said high and/or low frequency extreme region components of said complex signals in controlling said control circuitry and to attenuate said high and/or low frequency extreme region components, respectively, in said compressed signal, whereby the adverse effects on complementarity caused by errors in amplitude response that occur between the compressor and expander are suppressed.

183. A method for use in signal expansion of received compressed complex signals applied to a transmission channel by a compressor, wherein the relative signal amplitude response in the transmission channel between the compressor and expander is uncertain in the region of the high and/or low frequency extremes of the useful bandwidth of signals applied to the compressor, said compressor having its compression controlled by circuitry which responds to the frequency and amplitude characteristics of said complex signals, the compressor including filter means for skewing the spectral balance of signals in said compressor to substantially reduce the influence of said high and/or low frequency extreme region components in controlling said control circuitry and to attenuate said high and/or low frequency extreme region components, respectively, in said compressed signal, comprising boosting the attenuated high and/or low frequency extreme region components, respectively, to effect a substantially flat overall compressor/expander frequency response while suppressing the adverse effects on complementarity caused by errors in amplitude response that occur between the compressor and expander.

184. A method for use in a compressor to provide level dependent equalization where the compressor is used in a signal transmission system in which the compressed signals are applied to a transmission channel which is susceptible to high level saturation or overload effect in part of the frequency band in which the compressor compresses the dynamic range of signals, the compressor having a main signal path which is linear with respect to dynamic range, a combining circuit in the main path, and a further path which has its input coupled to the input or output of the main path and its output coupled to the combining circuit, the further path providing a signal which, at least in part of the frequency band, boosts the main path signal by way of the combining circuit, but which is so limited that, in the upper part of the input dynamic range, about $-10$ dB to $+10$ dB relative to a reference level, the further path signal is limited to a value which is small relative to the main path signal, comprising frequency dependently attenuating the signal amplitude in that portion of the main path between the combining circuit and the input or the output of the main path where the further path has its input coupled to provide in said portion of the main path and, for signals in the upper part of the input dynamic range, in the compressor characteristic at high levels a response characteristic for substantially reducing the satuation or overload effect in at least part of the frequency band in which the effect occurs and in which the further path boosts the main path signal, the overall response characteristic of said compressor for signals in said upper part of the input dynamic range being substantially the same as that of said frequency dependently attenuating response characteristic.

185. A method for use in an expander complementary to a compressor having level dependent equalization where the compressor and expander are used in a signal transmission system in which the compressed signals are applied to a transmission channel which is susceptible to high level saturation or overload effect in part of the frequency band in which the compressor and expander alter the dynamic range of signals, the expander fed by said transmission channel having a main signal path which is linear with respect to dynamic range, a combining circuit in the main path, and a further path which has its input coupled to the input or output of the main path and its output coupled to the combining circuit, the further path providing a signal which, at least in a part of the frequency band, bucks the main path signal by way of the combining circuit, but which is so limited that, in the upper part of the input dynamic range, about $-10$ dB to $+10$ dB relative to a reference level, the further path signal is limited to a value smaller than the main path signal, comprising frequency dependently boosting the signal amplitude in that portion of the main path between the combining circuit and the input or the output of the main path where the further path has its input coupled to provide in said portion of the main path, and for signals in the upper part of the input dynamic range, in the expander characteristic at high levels a response characteristic inverse to that required in the compressor to substantially reduce the saturation or overload effect in at least part of the frequency band in which the effect occurs and in which the further path bucks the main path signal, the overall response characteristic of said expander for signals in said upper part of the input dynamic range being substantially the same as that of said frequency dependently boosting response characteristic in order to complement the level dependent equalization of said compressor.

186. A method for use in a noise reduction system comprising a compressor having level dependent equalization for use in a signal transmission system in which the compressed signals are applied to a transmission channel which is susceptible to high level saturation or overload effect in part of the frequency band in which the compressor compresses the dynamic range of signals, and a complementary expander fed by said transmission channel, each having a main signal path which is linear with respect to dynamic range, a combining circuit in the main path, and a further path which has its input coupled to the input or output of the main path and its output coupled to the combining circuit, the further path providing a signal which, at least in a part of the frequency band boosts the main path signal in the compressor, and bucks the main path signal in the expander, by way of the combining circuit, but which is in each case so limited that, in the upper part of the input dyanmic range, about $-10$ dB to $+10$ dB relative to a reference level, the further path signal is limited to a value which is small relative to the main path signal, comprising frequency dependently attenuating the signal amplitude in that portion of the main path between the combining circuit and the input or the output of the main path where the further path has its input coupled in the compressor to provide in said portion of the compressor main path and, for signals in the upper part of the input dynamic range, in the compressor characteristic at high levels a response characteristic for substantially reducing the saturation or overload effect in at least part of the frequency band in which the effect occurs and in which the further path boosts the main path signal, the overall response characteristic of said compressor in said upper part of the input dynamic range being substantially the same as that of said frequency dependently attenuating response characteristic and complementarily boosting the signal amplitude in that portion of the main path between the combining circuit and the input or the output of the main path where the further path has its input coupled in the expander to provide in said portion of the expander main path, and for signals in the upper part of the input dynamic range, in the expander characteristic at high levels a response characteristic inverse to that of the frequency dependently attenuating response characteristic in the compressor, the overall response characteristic of said expander for signals in said upper part of the input dynamic range being substantially the same as that of said frequency dependently boosting response characteristic in order to complement the level dependent equalization of said compressor.

187. A method for treating an input signal x to provide an output signal z comprising the steps of:
operating linearly upon said input signal to provide a first signal component proportional to $F_{AS}x$, where $F_{AS}$ is a linear operator,
operating non-linearly upon said input signal to provide a second signal component $F_1 F_{AS} y$ where $F_1$ is a non-linear operator decreasing as y increases,
combining said first and second signal components additively to provide an intermediate signal $y = -F_{AS}x + F_1 F_{AS}y$,
transmitting and receiving or recording and playing back said intermediate signal,
operating linearly upon said intermediate signal as received or played back to provide a third signal component proportional to $yF'_{AS}$, where $F'_{AS}$ is a linear operator substantially the reciprocal of $F_{AS}$,
operating non-linearly upon said output signal to provide a fourth signal component $F_2 y$ where $F_2$ is a non-linear operator at least substantially the same as $F_1$, and
combining said third and fourth signal components subtractively to provide said output signal $$z = F'_{AS} y - F_2 y$$

whereby $$z = \frac{(F_{AS} - F_2)}{\frac{1}{F_{AS}} - F_1} x$$

188. A compressor for compressing the dynamic range of signals applied to a transmission channel, the channel being subject to saturation or overload effect within the range of frequencies in which the compressor compresses the dynamic range of signals, comprising a main signal path which is linear with respect to dynamic range, a combining circuit in the main path; and a further path which has its input coupled to the input or output of the main path and its output coupled to the combining circuit, the further path providing a signal which, at least in a part of the frequency band, boosts the main path signal by way of the combining circuit, but which is so limited that, in the upper part of the input dynamic range, the further path signal is limited to a value smaller than the main path signal, and frequency dependent circuit means connected in the main path for providing a reduction in frequency response in the part of the frequency band in which the transmission channel is subject to saturation or overload effect.

189. A compressor according to claim 188 wherein the signals lie in the audio frequency band and the transmission channel is subject to saturation or overload effect beginning at a frequency in the upper part of the frequency band, where the upper part of the frequency band is from about 300 Hz upwards, wherein the frequency dependent circuit means provides a reduction in frequency response in the range upwards from the frequency where the saturation or overload effect begins.

190. A compressor according to claim 189 which also acts at low frequencies, and the transmission channel is subject to saturation or overload effect beginning at a frequency in the lower part of the frequency band, where the lower part of the frequency band is from about 100 Hz downward, wherein the frequency dependent circuit means also provides a reduction in frequency response in the range downward from the frequency where the saturation or overload effect begins.

191. An expander for expanding the dynamic range of a compressed signal received from a transmission channel fed by a compressor, the transmission channel being subject to saturation or overload effect within the range of frequencies in which the compressor and expander alter the dynamic range of signals, the compressor having a frequency dependent circuit for reducing the frequency response of signals in the part of the frequency band in which the transmission channel is subject to saturation or overload effect, the expander comprising a main signal path which is linear with respect to dynamic range, a combining circuit in the main path, and a further path which has its input coupled to the input or output of the main path and its output coupled to the combining circuit, the further path providing a signal which, at least in a part of the frequency band, bucks the main path signal by way of the combining circuit, but which is so limited that, in the upper part of the input dynamic range, the further path signal is limited to a value smaller than the main path signal, and frequency dependent circuit means connected in the main path for providing an increased frequency response in said part of the frequency band in which the transmission channel is subject to saturation or overload effect.

192. An expander according to claim 191 wherein the signals lie in the audio frequency band and the transmission channel is subject to saturation or overload effect beginning at a frequency in the upper part of the frequency band, where the upper part of the frequency band is from about 300 Hz upwards, wherein the frequency dependent circuit means provides an increase in frequency response in the range upwards from the frequency where the saturation or overload effect begins.

193. An expander according to claim 192 which also acts at low frequencies, and the transmission channel is subject to saturation or overload effect beginning at a frequency in the lower part of the frequency band, where the lower part of the frequency band is from about 100 Hz downward, wherein the frequency dependent circuit means also provides an increase in frequency response in the range downward from the frequency where the saturation or overload effect begins.

194. A noise reduction system comprising a compressor for compressing the dynamic range of signals applied to a transmission channel, the channel being subject to saturation or overload effect within the range of frequencies in which the compressor compresses the dynamic range of signals, and an expander for expanding the dynamic range of signals received from said transmission channel, the compressor and expander each having a main signal path which is linear with respect to dynamic range, a combining circuit in the main path, and a further path which has its input coupled to the input or output of the main path and its output coupled to the combining circuit, the further path providing a signal which, at least in a part of the frequency band, bucks the main path signal by way of the combining circuit, but which is so limited that, in the upper part of the input dynamic range, the further path signal is limited to a value smaller than the main path signal, and frequency dependent circuit means connected in the main paths for providing a reduction in frequency response in the compressor and a complementary increase in frequency response in the expander in said part of the frequency band in which the transmission channel is subject to saturation or overload effect.

195. A noise reduction system according to claim 194 wherein the signals lie in the audio frequency band and the transmission channel is subject to saturation or overload effect beginning at a frequency in the upper part of the frequency band, where the upper part of the frequency band is from about 300 Hz upwards, wherein in the compressor the frequency dependent circuit means provides a reduction in frequency response in the range upwards from the frequency where the saturation or overload effect begins, and in the expander, respectively, the frequency dependent circuit means provides an increase in the frequency response in the same range.

196. A noise reduction system according to claim 195 which also acts at low frequencies, and the transmission channel is subject to saturation or overload effect beginning at a frequency in the lower part of the frequency band, where the lower part of the frequency band is from about 100 Hz downward, wherein the frequency dependent circuit means in the compressor also provides a reduction in frequency response in the range downward from the frequency where the saturation or overload effect begins and in the expander, respectively, the frequency dependent circuit means also produces an increase in frequency response in the same range.

197. A noise reduction system according to claims 78 or 194 wherein the compressor and expander are the same circuit in combination with switching means for selecting the compression or expansion mode of the circuit, said switching means selectively effecting signal connections whereby the circuit is switched to its respective compression or expansion configuration and the frequency dependent circuit means connected in the main path is switched from its compressor characteristic to its complementary inverse expander characteristic.

198. A circuit for modifying the dynamic range of an input signal, comprising first circuit means having a characteristic in which only a portion thereof has a changing gain between low and high input levels and at least one second circuit means which also has such a characteristic within a frequency range common to the circuit means, in series with the first circuit means, the changing gain portions of the characteristics of the circuit means being staggered within a frequency range common to the circuit means such as to provide a change of gain over a wider range of input levels than for any one of the circuit means individually, and an increased difference between the gains at low and high input levels, but with a maximum overall compression or expansion ratio which is substantially no greater than that of any single circuit means, by virtue of the staggering.

199. A circuit according to claim 198 further comprising switching means for selecting the compression or expansion mode of the circuit, said switching means selectively effecting signal connections whereby each circuit means is switched to its respective compression or expansion configuration and the arrangement of series circuit means is reversed in one mode with respect to the othes.

200. A circuit according to claim 198 in which the transition region between portions of the circuit means characteristic as the input level rises from low levels is the threshold, wherein the thresholds are set to different values in order to stagger the changing gain portions of the circuit means.

201. A circuit according to claims 198 or 200 wherein the circuit means are compressors, each establishing its own characteristic.

202. A circuit according to claim 201 wherein the threshold of each successive compressor circuit means is lower than the threshold of the previous circuit means.

203. A circuit according to claim 201 wherein the threshold of each successive compressor circuit means is higher than the threshold of the previous circuit means.

204. A circuit according to claims 198 or 200 wherein the circuit means are expanders, each establishing its own characteristic.

205. A circuit according to claim 204 wherein the threshold of each successive expander circuit means is higher than the threshold of the previous circuit means.

206. A circuit according to claim 204 wherein the threshold of each successive expander circuit means is lower than the threshold of the previous circuit means.

207. A circuit according to claims 198 or 200 wherein the falling flank of the compression or expansion ratio of each of the circuit means overlaps the rising flank of the compression or expansion ratio of another of the circuit means to the extent that the overall compression or expansion ratio in the overlapping region does not substantially exceed the maximum compression or expansion ratio of the adjacent circuit means.

208. A method of treating an input signal x to provide an output signal z comprising the steps of:
- operating linearly upon said input signal to provide a first signal component proportional to $F_{AS}x$, where $F_{AS}$ is a linear operator,
- operating non-linearly upon said input signal to provide a second signal component $F_1 x$ where $F_1$ is a non-linear operator decreasing as x increases,
- combining said first and second signal components additively to provide an intermediate signal $y = (F_{AS} + F_1)x$,
- transmitting and receiving or recording and playing back said intermediate signal,
- operating linearly upon said intermediate signal as received or played back to provide a third signal component proportional to $yF'_{AS}$, where $F'_{AS}$ is a linear operator substantially the reciprocal of $F_{AS}$,
- operating non-linearly upon said output signal to provide a fourth signal component $zF_2 F'_{AS}$ where $F_2$ is a non-linear operator at least substantially the same as $F_1$, and
- combining said third and fourth signal components subtractively to provide said output signal $$z = yF'_{AS} - zF_2 F'_{AS}$$

whereby $$z = \frac{F_{AS}F'_{AS} + F_1 F'_{AS}}{1 + F_2 F'_{AS}} x$$

* * * * *